(12) United States Patent
Oikawa

(10) Patent No.: US 8,759,826 B2
(45) Date of Patent: Jun. 24, 2014

(54) ORGANIC ELECTROLUMINESCENT ELEMENT

(75) Inventor: Kazuhiro Oikawa, Hachioji (JP)

(73) Assignee: Konica Minolta, Inc., Tokyo (JP)

( * ) Notice: Subject to any disclaimer, the term of this patent is extended or adjusted under 35 U.S.C. 154(b) by 0 days.

(21) Appl. No.: 13/880,581

(22) PCT Filed: Oct. 12, 2011

(86) PCT No.: PCT/JP2011/073365
§ 371 (c)(1),
(2), (4) Date: Apr. 19, 2013

(87) PCT Pub. No.: WO2012/053398
PCT Pub. Date: Apr. 26, 2012

(65) Prior Publication Data
US 2013/0200360 A1    Aug. 8, 2013

(30) Foreign Application Priority Data

Oct. 22, 2010    (JP) ................. 2010-237419

(51) Int. Cl.
*H01L 51/42*    (2006.01)
*H01L 31/0256*  (2006.01)
*H01L 51/50*    (2006.01)
*H01L 51/00*    (2006.01)

(52) U.S. Cl.
CPC .......... *H01L 51/5048* (2013.01); *H01L 51/502* (2013.01); *H01L 51/5032* (2013.01); *H01L 51/5024* (2013.01); *H01L 51/0085* (2013.01)
USPC ............ 257/40; 257/13; 257/21; 257/22; 257/E51.022; 257/E51.027; 313/503; 313/504; 438/46; 438/57; 438/82

(58) Field of Classification Search
CPC ............. H01L 51/5048; H01L 51/502; H01L 51/5024; H01L 51/5032; H01L 51/0085
USPC .......... 257/13, 21, 22, 40, E51.022, E51.027; 313/503, 504; 438/46, 57, 82
See application file for complete search history.

(56) References Cited

U.S. PATENT DOCUMENTS 5,061,569 A     10/1991  VanSlyke et al.
7,800,297 B2 *   9/2010  Reddy .......................... 313/504

(Continued)

FOREIGN PATENT DOCUMENTS

JP   04-297076    10/1992
JP   04-308688    10/1992

(Continued)

OTHER PUBLICATIONS

Japanese IPRP with Written Opinion and English translation thereof.

(Continued)

*Primary Examiner* — Dao H Nguyen
(74) *Attorney, Agent, or Firm* — Lucas & Mercanti, LLP

(57) ABSTRACT

The organic electroluminescent element (100) of the present invention comprises, on a substrate (1), electrodes (positive electrode (2) and negative electrode (8)) forming a pair and an organic functional layer (20) having at least an electron transport layer (6) and a light emitting layer (5). At least one of the electron transport layer (6) and the light emitting layer (5) contain semiconductor nanoparticles having a conduction band energy level of −5.5−−1.5 ev.

11 Claims, 1 Drawing Sheet

(56) References Cited

U.S. PATENT DOCUMENTS

| | | | | |
|---|---|---|---|---|
| 8,581,230 | B2* | 11/2013 | Kim et al. | 257/13 |
| 2008/0007156 | A1* | 1/2008 | Gibson et al. | 313/503 |
| 2009/0236983 | A1* | 9/2009 | Jang et al. | 313/504 |
| 2010/0065829 | A1* | 3/2010 | Forrest et al. | 257/40 |
| 2011/0095266 | A1* | 4/2011 | Hayden et al. | 257/21 |

FOREIGN PATENT DOCUMENTS

| | | |
|---|---|---|
| JP | 06-325871 | 11/1994 |
| JP | 08-288069 | 11/1996 |
| JP | 09-017574 | 1/1997 |
| JP | 9-45479 | 2/1997 |
| JP | 09-260062 | 10/1997 |
| JP | 10-074586 | 3/1998 |
| JP | 10-270172 | 10/1998 |
| JP | 11-251067 | 9/1999 |
| JP | 2000-196140 | 7/2000 |
| JP | 2001-102175 | 4/2001 |
| JP | 2001-257076 | 9/2001 |
| JP | 2001-313179 | 11/2001 |
| JP | 2001-357977 | 12/2001 |
| JP | 2002-008860 | 1/2002 |
| JP | 2002-015871 | 1/2002 |
| JP | 2002-043056 | 2/2002 |
| JP | 2002-075645 | 3/2002 |
| JP | 2002-105445 | 4/2002 |
| JP | 2002-141173 | 5/2002 |
| JP | 2002-203683 | 7/2002 |
| JP | 2002-231453 | 8/2002 |
| JP | 2002-234888 | 8/2002 |
| JP | 2002-255934 | 9/2002 |
| JP | 2002-260861 | 9/2002 |
| JP | 2002-280183 | 9/2002 |
| JP | 2002-299060 | 10/2002 |
| JP | 2002-302516 | 10/2002 |
| JP | 2002-305083 | 10/2002 |
| JP | 2002-305084 | 10/2002 |
| JP | 2002-308837 | 10/2002 |
| JP | 2002-308855 | 10/2002 |
| JP | 2002-319491 | 10/2002 |
| JP | 2002-334786 | 11/2002 |
| JP | 2002-334787 | 11/2002 |
| JP | 2002-334788 | 11/2002 |
| JP | 2002-334789 | 11/2002 |
| JP | 2002-338579 | 11/2002 |
| JP | 2002-343568 | 11/2002 |
| JP | 2002-352957 | 12/2002 |
| JP | 2002-363227 | 12/2002 |
| JP | 2003-003165 | 1/2003 |
| JP | 2003-027048 | 1/2003 |
| JP | 2003-519432 | 6/2003 |
| JP | 2004-068143 | 3/2004 |
| JP | 2004-172102 | 6/2004 |
| JP | 2006-066395 | 3/2006 |
| JP | 2009-526370 | 7/2009 |
| JP | 2009-212238 | 9/2009 |
| JP | 2010-55899 | 3/2010 |
| JP | 2010-055899 | 3/2010 |
| JP | 2010-219410 | 9/2010 |
| WO | 2010-119891 | 10/2010 |

OTHER PUBLICATIONS

Kim, Young Kwan, et al. "Size dependence of electroluminescence of nanoparticle (rutile-Ti02) dispersed MEH-PPV films", Synthetic Metals, 2000, vol. 111-112, pp. 207-211.

"Electrode Material" (Part 2, Chapter 2, p. 123-166) in "Organic EL element and Forefront of its Industrialization" (published by NTS Inc. since Nov. 30, 1998).

J. Appl. Phys., 95, 5773 (2004).

J. Huang et al., (Applied Physics Letters 80 (2002), p. 139).

Makromol. Chem., 193, p. 909 (1992).

J. Chem. Soc., PerkinTrans. 1, 1505-1510 (1999).

Pol. J. Chem., 54, 1585 (1980).

TetrahedronLett. 41 (2000), 481-484.

Page 398 of Dai 4-han Jikken Kagaku Kouza 7 (Spectroscopy II of 4th Edition Lecture of Experimental Chemistry 7), (1992-edition), Published by Maruzen Co., Ltd.

* cited by examiner

ORGANIC ELECTROLUMINESCENT ELEMENT

CROSS REFERENCE TO RELATED APPLICATION

This Application is a 371 of PCT/JP2011/073365 filed on Oct. 12, 2011, which claimed the priority of Japanese Patent Application No. 2010-237419 filed on Oct. 22, 2010; both applications are incorporated herein by reference in its entirety.

TECHNICAL FIELD

The present invention relates to an organic electroluminescent element, and specifically, to an organic electroluminescent element having high luminescence efficiency, long lifetime and low driving voltage.

BACKGROUND ART

Recently, an organic electroluminescent element (hereinafter, referred to as "an organic EL element" as appropriate) using an organic substance has been regarded as promising as a large screen full-color display element of a solid-state luminescent type and a light source array for writing, making active research and development to be advanced.

The organic EL element is an all-solid-state element of a thin-film type which is configured by arranging an organic functional layer (single or multiple layer portions) including an organic luminescent substance of thickness of only about 0.1 μm between a pair of anode and cathode formed on a film. When the organic EL element like the above one is applied with a relatively low voltage of about 2 to 20 V, electrons are injected into the cathode of the organic compound layer and holes are injected into the anode thereof. It is known that when the electrodes and holes recombine in a luminescent layer, an energy level thereof returns from a conduction band to a valence band to discharge energy and light, thereby producing luminescence. This technique is expected to be applied in flat displays and illuminations.

Further, in an organic EL element utilizing recently discovered phosphorescence emission, luminescence efficiency of about four times as much can be achieved compared to that in the case of utilizing the conventional fluorescence emission. Therefore, as well as development of materials, research and development of layer configuration and electrodes for the luminescent element has also been carried out in a worldwide basis. In particular, as one of measures to prevent global warming, a study on application of the organic EL elements to illumination equipment is started to be made, and attempts have been actively made to improve performance and reduce costs to bring white luminescent panels into practice which can possibly replace the conventional illumination equipment. The white luminescent panel for illumination requires high efficiency and long lifetime; however, regarding the efficiency improvement, in particular, the luminescence efficiency thereof is still low compared to that of a fluorescent lamp and a white light-emitting diode.

Light extraction efficiency and element drive voltage are important factors that affect the luminescence efficiency of the organic EL element. In the current condition, light generated inside the organic EL element undergoes total reflection at the electrode and the like or is confined inside the element by being absorbed therein, resulting that most portion of the light is not effectively used. Specifically, in a case of a bottom-emission type organic luminescent element, in which metal is used for the cathode, it has been reported that light emitted in the luminescent layer becomes absorbed in the cathode by metal surface plasmon resonance. The amount of light extracted outside the element reduces as a result, and thus the luminescence efficiency of the element decreases.

As one means to suppress the above, it is effective to separate an emission position of the luminescent layer and the metal electrode; however, by thickening an electron transport layer to separate the luminescent layer and the cathode, electron transportability decreases and causes the voltage to increase and the luminescence efficiency to decrease. It is considered that these occur on the basis of a host material in the luminescent layer and carrier mobility of the electron transport layer, and at present, a material has not yet been discovered, which has a highly mobile electron transport property to suppress the voltage increase even if the layer is thickened.

As means to improve the transport property, an inorganic semiconductor can be used.

For example, in Patent Literature 1, the patent is disclosed in which inorganic nanoparticles are contained in an electric charge transport layer. It is known that carrier balance is adjusted by controlling the transportability in the electric charge transport layer by using the nanoparticles.

CITATION LIST

Patent Literature

[PTL1] Japanese Unexamined Patent Application Publication No. 2010-055899

SUMMARY OF INVENTION

Technical Problem

However, conductivity is not actively improved in Patent Literature 1, and the electric charge transport layer is still desired, which has high conductivity, and particularly the one that does not lose voltage even when thickness thereof is 50 nm or more.

Further, the electric charge transport layer having high conductivity and coating aptitude (small luminance unevenness) is desired from the aspect of high productivity; however, the one as such has not yet been discovered.

Accordingly, an object of the present invention is to provide an organic electroluminescent element capable of: suppressing luminance deterioration and drive voltage rise even if a luminescent layer or an electron transport layer is thickened; and suppressing occurrence of luminance unevenness.

Solution to Problem

To solve the above problems, the present invention provides an organic electroluminescent element including, on a substrate: a pair of electrodes; and an organic functional layer having at least an electron transport layer and a luminescent layer, where, in at least one layer among the electron transport layer and the luminescent layer, semiconductor nanoparticles of which an energy level of a conduction band is between $-5.5$ to $-1.5$ eV are contained.

Advantageous Effects of Invention

According to the present invention, luminance deterioration and drive voltage rise can be suppressed even if the luminescent layer or the electron transport layer is thickened, and occurrence of luminance unevenness can also be suppressed.

MODES FOR CARRYING OUT THE INVENTION

Hereinafter, a description is given of a preferable embodiment of the present invention with reference to the drawings.
<Configuration of Organic EL Element>

Figure 1:
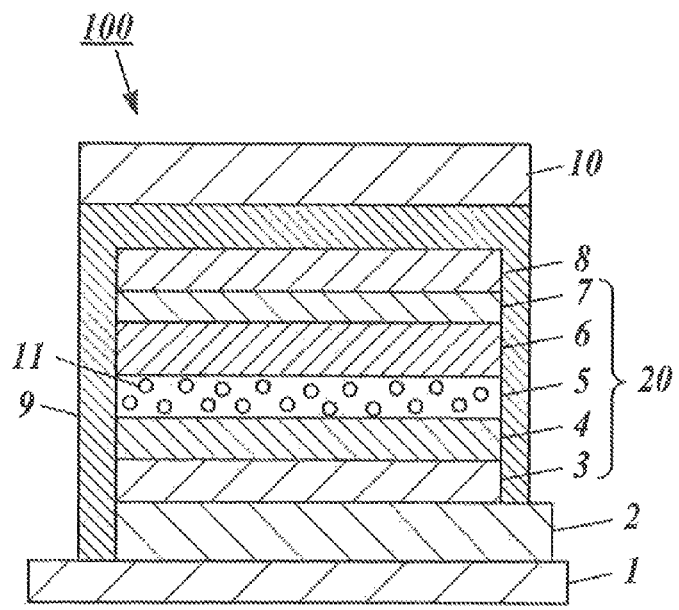
FIG. 1 is a schematic cross-sectional view showing an example of a configuration of an organic electroluminescent element of the present invention.

As illustrated in FIG. 1, an organic electroluminescent element (hereinafter, also referred to as an organic EL element) 100 according to a preferable embodiment of the present invention includes a flexible supporting substrate 1. On the flexible supporting substrate 1, an anode 2 is formed. On the anode 2, an organic functional layer 20 is formed, and on the organic functional layer 20, a cathode 8 is formed.

The organic functional layer 20 includes layers which are provided between the anode 2 and cathode 8 and constitute the organic electroluminescent element 100.

The organic functional layer 20 includes, for example, a hole injection layer 3, a hole transport layer 4, a light emitting layer 5, an electron transport layer 6, and an electron injection layer 7 and may also include a hole block layer, an electron block layer, or the like.

The anode 2, organic functional layer 20, cathode 8 on the flexible supporting substrate 1 are sealed by a flexible seal material 10 through a sealing adhesive 9.

Figure 2:
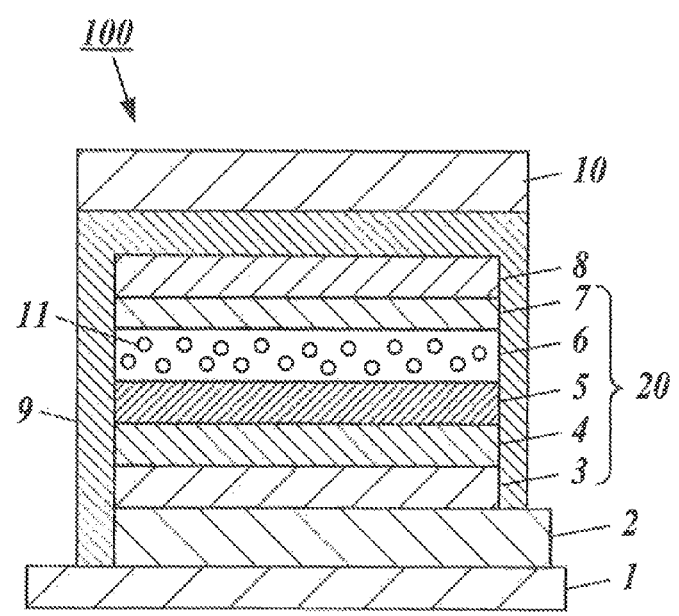
FIG. 2 is a schematic cross-sectional view showing another example of the configuration of the organic electroluminescent element of the present invention.

In the organic EL element 100 having the above-described configuration, the light emitting layer 5 of the organic function layer 20 contains semiconductor nanoparticles 11. The semiconductor nanoparticles 11 may be contained in the electron transport layer 6 of the organic functional layer 20 as illustrated in FIG. 2 or may be contained in both the light emitting layer 5 and electron transport layer 6.

The aforementioned layer structures of the organic EL element 100 (see FIGS. 1 and 2) are just preferable concrete examples, and the present invention is not limited thereto. The organic EL element 100 according to the present invention may include layer structures of (i) to (viii).
(i) flexible supporting substrate/anode/light emitting layer/electron transport layer/cathode/heat conducting layer/sealing adhesive/seal material
(ii) flexible supporting substrate/anode/hole transport layer/light emitting layer/electron transport layer/cathode/heat conducting layer/sealing adhesive/seal material
(iii) flexible supporting substrate/anode/hole transport layer/light emitting layer/hole block layer/electron transport layer/cathode/heat conducting layer/sealing adhesive/seal material
(iv) flexible supporting substrate/anode/hole transport layer/light emitting layer/hole block layer/electron transport layer/cathode buffer layer/cathode/heat conducting layer/sealing adhesive/seal material
(v) flexible supporting substrate/anode/anode buffer layer/hole transport layer/light emitting layer/hole block layer/electron transport layer/cathode/cathode buffer layer/heat conducting layer/sealing adhesive/seal material
(vi) glass support/anode/hole injection layer/light emitting layer/electron injection layer/cathode/seal material
(vii) glass support/anode/hole injection layer/hole transport layer/light emitting layer/electron injection layer/cathode/seal material
(viii) glass support/anode/hole injection layer/hole transport layer/light emitting layer/electron transport layer/electron injection layer/cathode/seal material
<Organic Functional Layer 20 of Organic EL Element>

Next, a description is given of the organic functional layer constituting the organic EL element of the present invention in detail.
(1) Injection Layers: Hole Injection Layer 3, Electron Injection Layer 7

In the organic EL element of the present invention, the injection layers may be provided as needed. The injection layers include an electron injection layer and a hole injection layer, which may be provided between the anode and light emitting layer or hole transport layer and between the cathode and light emitting layer or electron transport layer, respectively.

The injection layers in the present invention refer to layers provided between the electrodes and organic functional layer for the purpose of reducing the driving voltage and increasing the light luminance and include a hole injection layer and an electron injection layer. The injection layers are described in detail in "Electrode Material" (Part 2, Chapter 2, P. 123-166) in "Organic EL element and Forefront of its Industrialization" (published by NTS Inc. since 30 Nov. 1998).

The hole injection layer is described in detail also in Japanese Patent Laid-open Publications Nos. 9-45479, 9-26006, and 8-288069, for example. The hole injection materials applicable to the hole injection layer are: polymers, aniline copolymers, polyarylalkane derivatives, and conductive polymers including triazole derivatives, oxadiazole derivatives, imidazole derivatives, pyrazorine derivatives, pyrazolone derivatives, phenylenediamine derivatives, arylamine derivatives, amino-substituted chalcone derivatives, oxazole derivatives, styryl anthracene derivatives, fluorenone derivatives, hydrazone derivatives, stilbene derivatives, silazane derivatives, preferably, polythiophene derivatives, polyaniline derivatives, polypyrrole derivatives; and more preferably, polythiophene derivatives.

The electron injection layer is described in detail in Japanese Patent Laid-open Publication Nos. 6-325871, 9-17574, and 10-74586, for example, and is specifically, a buffer layer of metal represented by strontium, aluminum, or the like, a buffer layer of alkali metal compound represented by lithium fluoride, a buffer layer of alkali-earth metal compound represented by magnesium fluoride, a buffer layer of oxide represented by aluminum oxide, or the like. In the present invention, the aforementioned buffer layer (injection layer) is desirably very thin film and is preferably made of potassium fluoride or sodium fluoride. The thickness thereof is about 0.1 nm to 5 µm, preferably about 0.1 to 100 nm, more preferably 0.5 to 10 nm, and most preferably, 0.5 to 4 nm.
(2) Hole Transport Layer 4

The hole transport material of the hole transport layer can be the same compound as the materials applicable to the hole injection layer. Furthermore, the hole transport material is preferably a porphyrin compound, an aromatic tertiary amine compound, or a styrilamine compound and more preferably an aromatic tertiary amine compound.

Representative examples of the aromatic tertiary amine compound and styrilamine compound are N,N,N',N'-tetraphenyl-4,4'-diaminophenyl; N,N'-diphenyl-N,N'-bis(3-methylphenyl)-[1,1'-biphenyl]-4,4'-di amine(TPD); 2,2-bis (4-di-p-tolylaminophenyl)propane; 1,1-bis(4-di-p-tolylaminophenyl)cyclohexane; N,N,N',N'-tetra-p-tolyl-4,4'- diamiobiphenyl; 1,1-bis(4-di-p-tolylaminophenyl)-4-phenylcyclohexane; bis(4-dimethylamino-2-methylphenyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminodiphenyl ether; 4,4'-bis(diphenylamino)quadriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylaminostilbenzene; N-phenylcarbazole. Furthermore, the examples thereof include: one including two condensed aromatic rings in a molecule, which is described in U.S. Pat. No. 5,061,569, for example, such as 4,4'-bis[N-(1-naphtyle)-N-phenylamino]biphenyl (NPD); and 4,4',4''-tris[N-(3-methylphenylyl)-N-phenylamino] triphenylamine (MTDATA), which is described in Japanese Patent Laid-open Publication No. 4-308688 and includes three triphenylamine units bonded in a starburst form.

Furthermore, the hole transport layer 4 can be made of a polymer material including one of the above materials introduced into the polymer chain or including the above material as a polymer main chain. Moreover, inorganic compounds such as p-type Si or p-type SiC can be used as the hole injection material or hole transport material.

Still furthermore, hole-transport materials including so-called p-type semiconductor properties can be used, which are described in Japanese Patent Laid-open Publications Nos. 4-297076, 2000-196140, and 2001-102175, J. Huang et. al. (Applied Physics Letters 80 (2002), p. 139), Japanese Unexamined Patent Application Publication (Translation of PCT application) No. 2003-519432.

The hole transport layer can be formed by thinning of the aforementioned hole transport material by a known method such as vacuum deposition, spin coating, casting, printing including the ink jet method, or the LB method, for example. The thickness of the hole transport layer is not particularly limited but is normally about 5 nm to 5 μm and preferably 5 to 200 nm. The hole transport layer may have a single-layer structure made of one or two types of the aforementioned materials.

Hereinbelow, preferable specific examples ((1) to (60)) of the compound used in the hole transport material of the organic EL element of the present invention are shown, but the present invention is not limited to these examples.

[Compound 1]

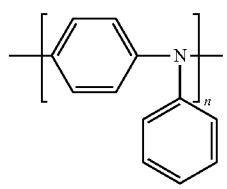
(1)

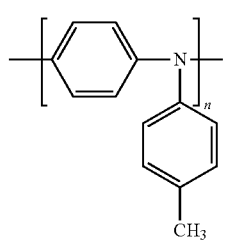
(2)

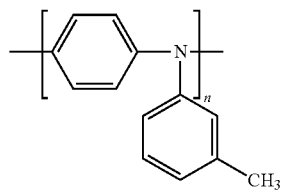
(3)

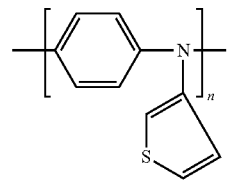
(4)

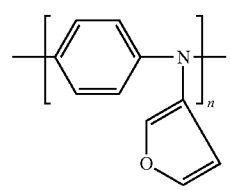
(5)

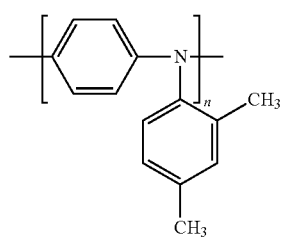
(6)

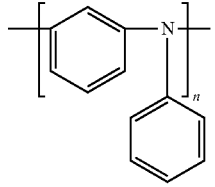
(7)

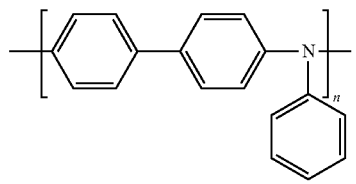
(8)

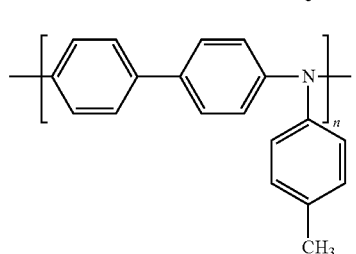
(9)

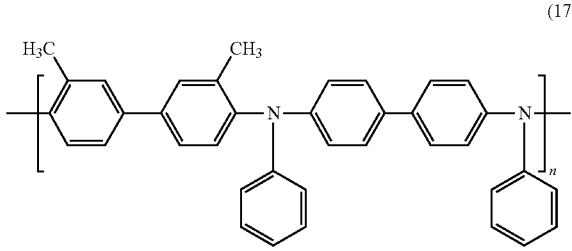
(17)
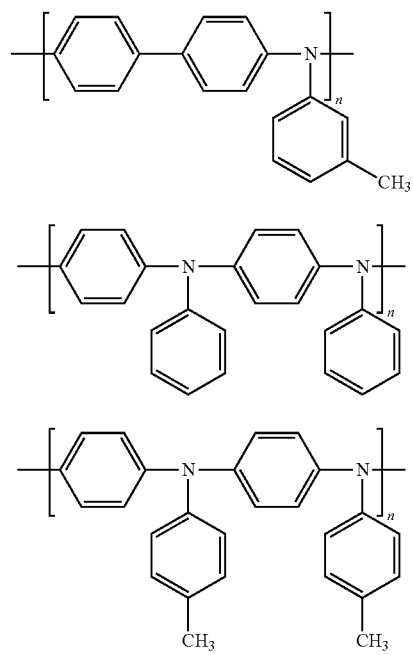
(10)
(11)
(12)
(13)
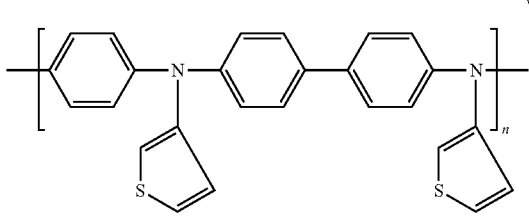
(18)
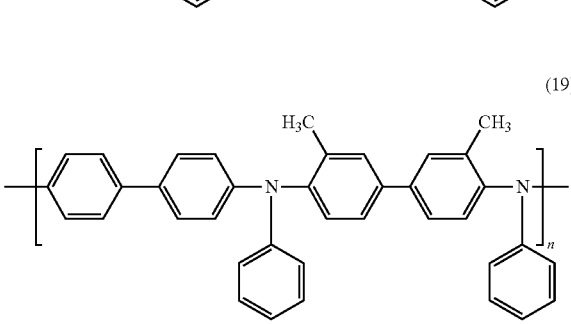
(19)
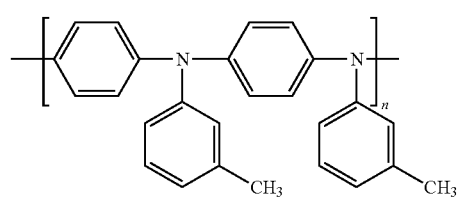
(14)
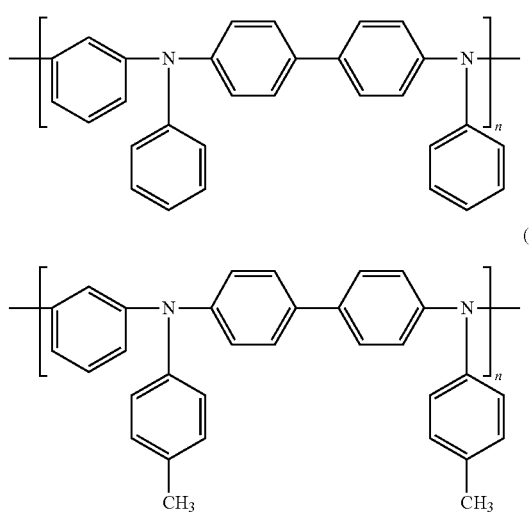
(15)
(16)
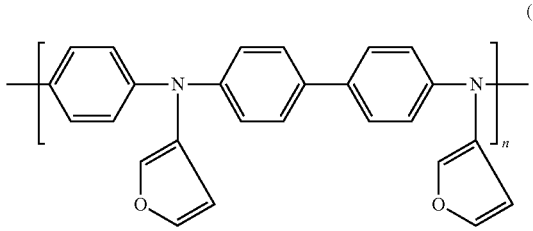
(20)
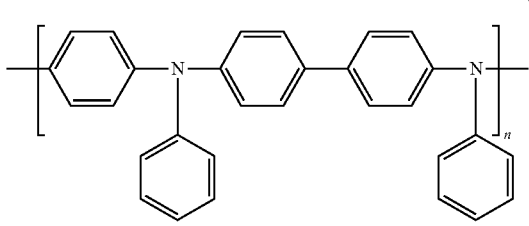
(21)
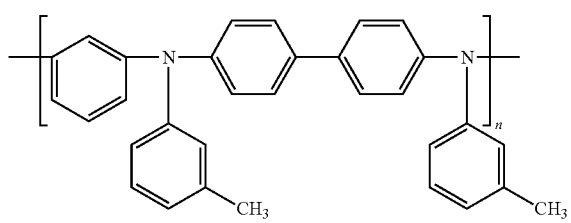
[Compound 2]
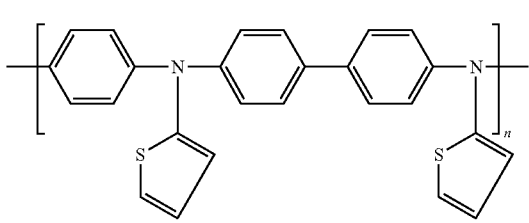
(22)

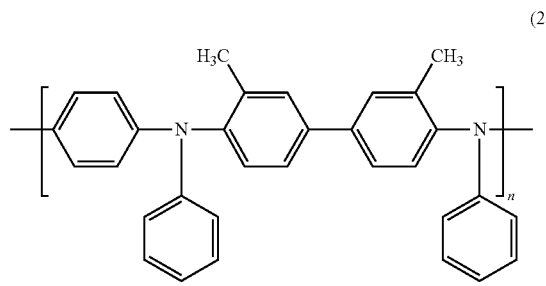
(23)
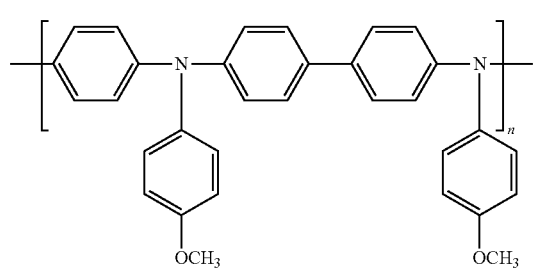
(24)
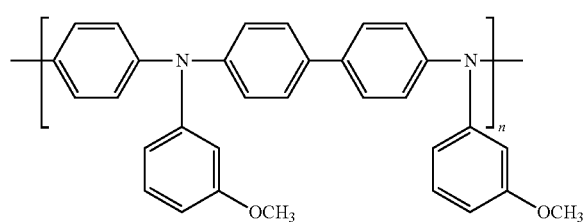
(25)
[Compound 3]
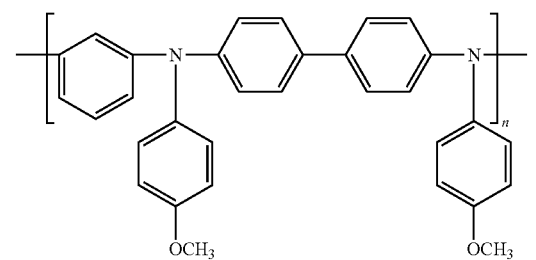
(26)
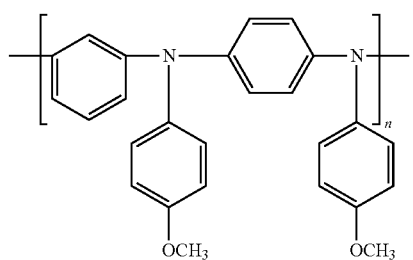
(27)
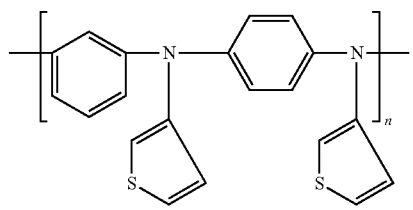
(28)
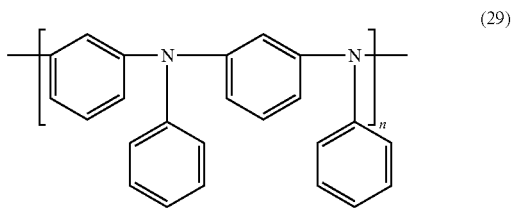
(29)
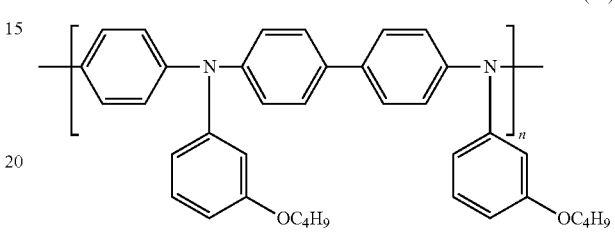
(30)
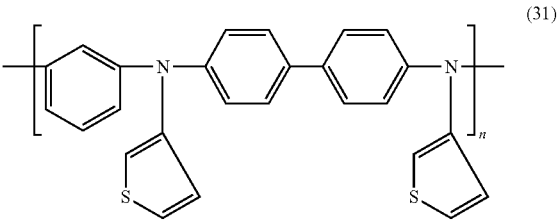
(31)
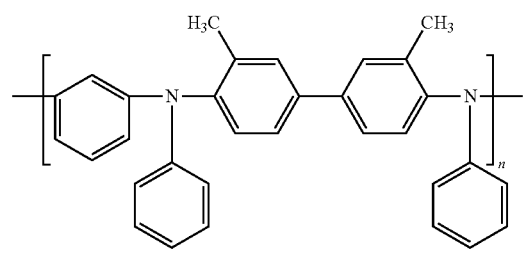
(32)
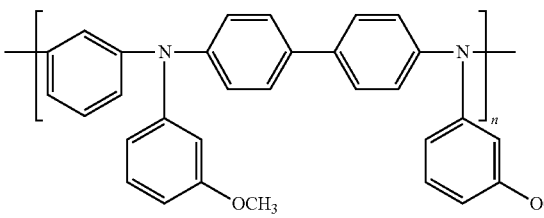
(33)
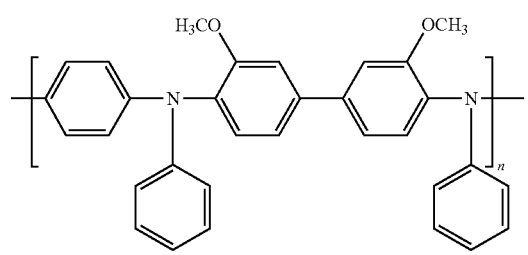
(34)

(35)
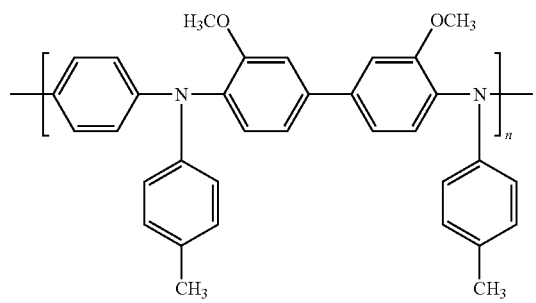
[Compound 4]
(36)
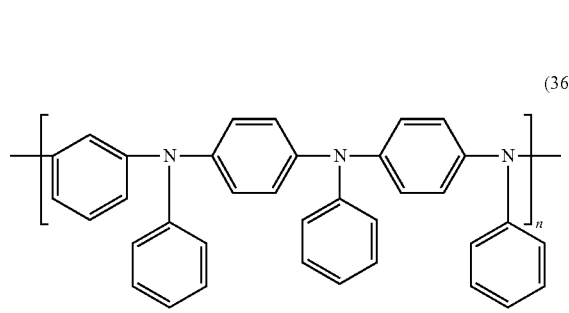
(37)
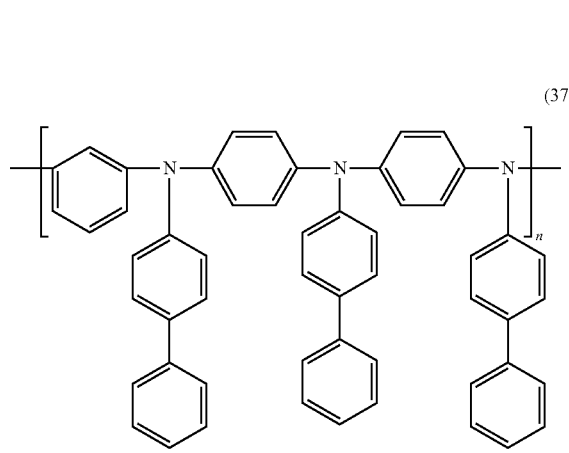
(38)
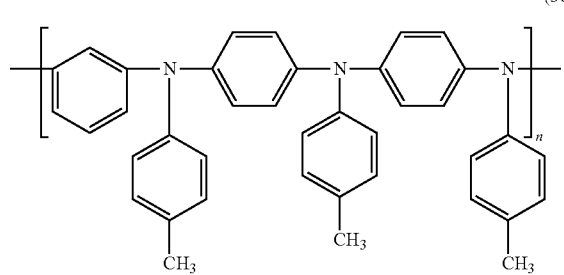
(39)
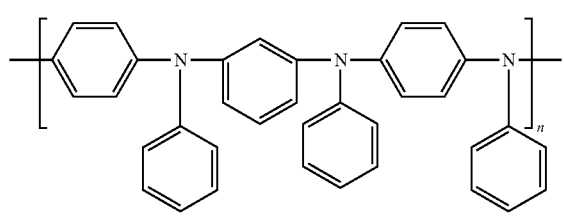
(40)
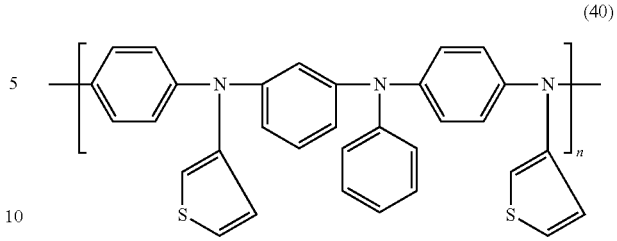
(41)
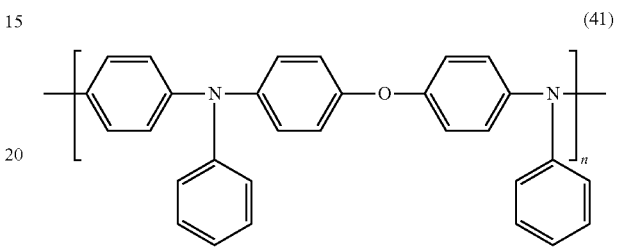
(42)
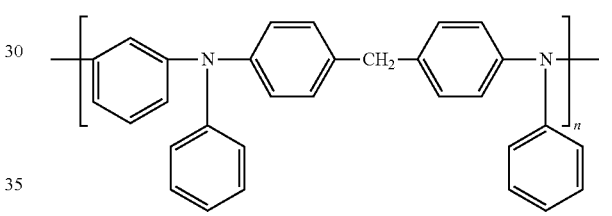
(43)
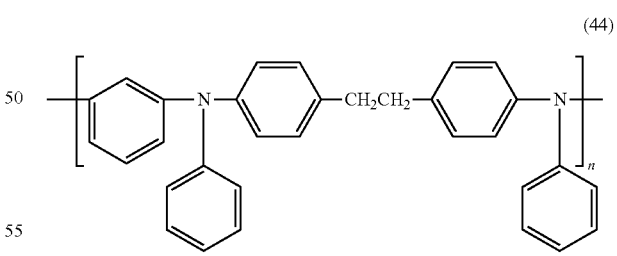
(44)
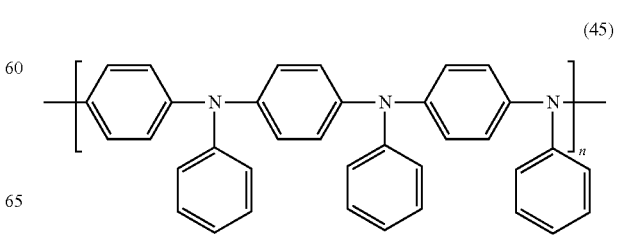
[Compound 5]
(45)

-continued
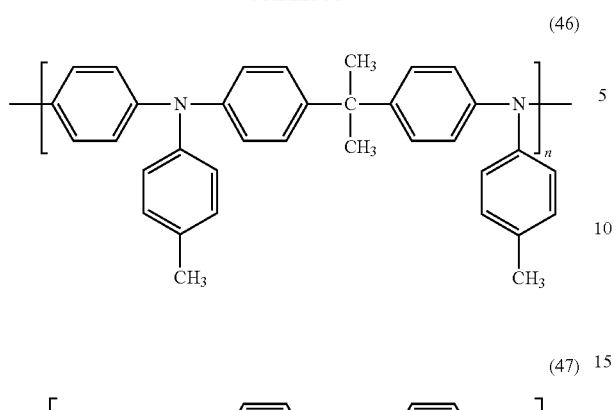
(46)
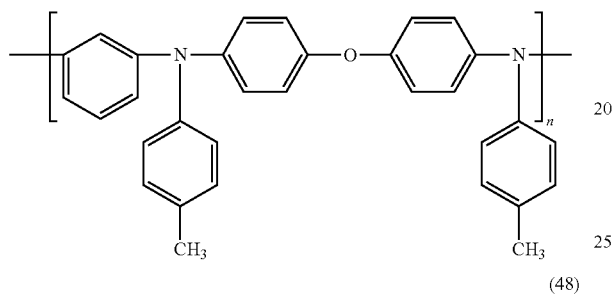
(47)
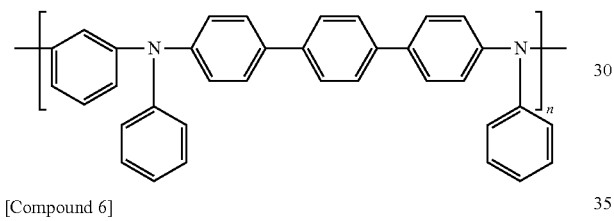
(48)
[Compound 6]
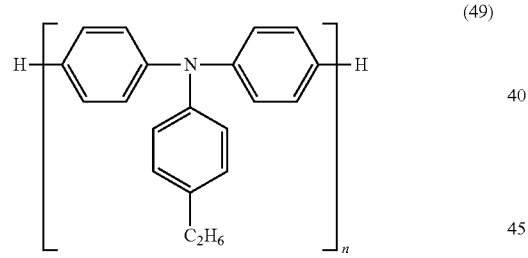
(49)
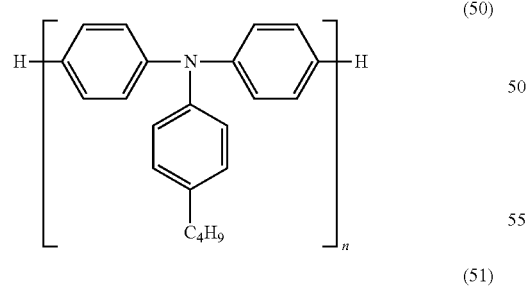
(50)
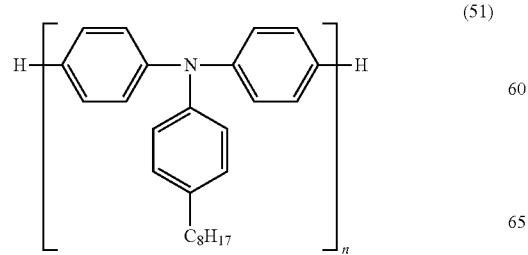
(51)
-continued
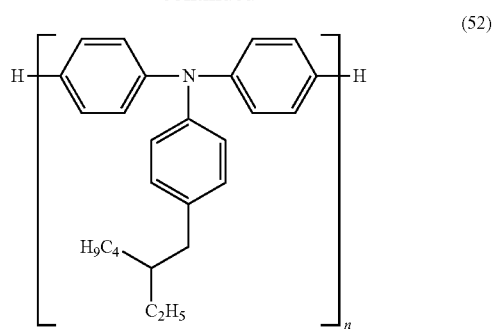
(52)
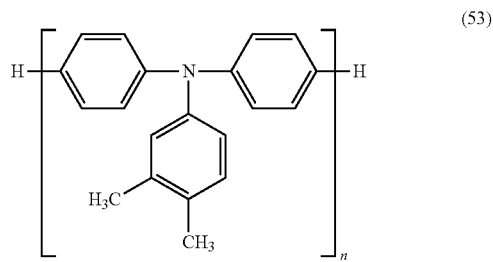
(53)
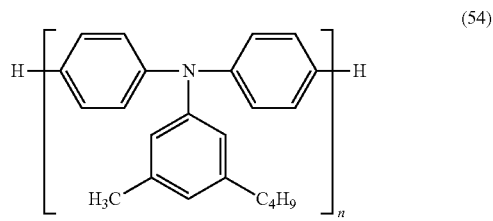
(54)
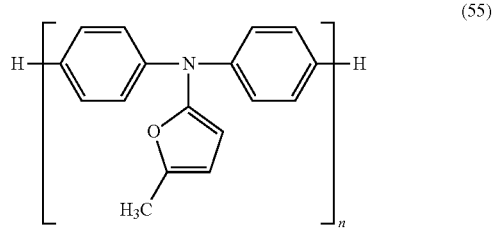
(55)
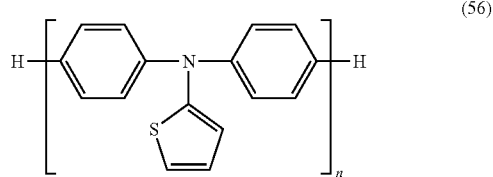
(56)
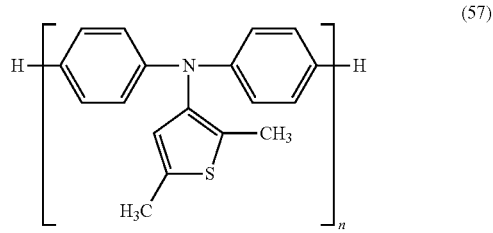
(57)

-continued

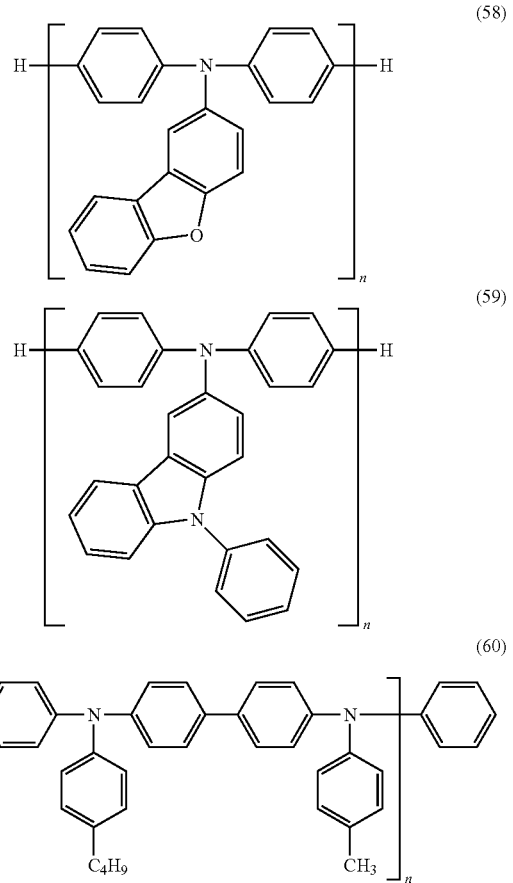

Each n described in the aforementioned illustrated compounds indicates a degree of polymerization and is such an integer that the weight-average molecular weight is in a range of 50,000 to 200,000. If the weight-average molecular weight is less than the above range, the hole transport layer could be mixed with another layer in the process of film formation because of the high solubility thereof to a solvent. Even if the film formation can be performed, the light emission efficiency cannot be high with the low molecular weight. If the weight-average molecular weight is larger than the aforementioned range, problems could be caused by difficulties in synthesis and purification. As the distribution of molecular weight increases, the residual amount of impurities increases, and the light emission efficiency, voltage, and lifetime of the organic EL element degrade.

These polymer compounds can be synthesized by a known method described in Makromol. Chem., 193, p. 909 (1992) or the like.

(3) Electron Transport Layer 6

The electron transport layer is made of a material having a function of transporting electrons. In a broad sense, the electron injection layer and hole block layer are also included in the electron transport layer. The organic EL element may include either a single or plural electron transport layers.

The electron transport material (serving as a hole block material) used in the single electron transport layer or, in the case of the plural electron transport layers, the electron transport layer adjacent to the light emitting layer on the cathode side needs to include a function of transmitting electrons injected from the cathode to the light emitting layer. The material thereof can be any one selected from conventionally-known compounds and, for example, is one of metallic complexes including fluorene derivatives, carbazole derivatives, azacarbazole derivatives, oxadiazole derivatives, triazole derivatives, silole derivatives, pyridine derivatives, pyrimidine derivatives, and 8-quinolinol derivatives and the like.

In addition, the electron transport material can be preferably metal-free phthalocyanine or metal phthalocyanine and moreover metal-free phthalocyanine or metal phthalocyanine terminally substituted with an alkyl group, a sulfonate group, or the like.

In the present invention, among the above-described materials, carbazole derivatives, azacarbazole derivatives, and pyridine derivatives are preferable, and azacarbazole derivatives are more preferable.

The electron transport layer can be formed by thinning of the aforementioned electron transport material by a known method such as spin coating, casting, printing including ink jet process, or LB process, for example. Preferably, the electron transport layer is formed by a wet process using coating liquid containing any of the above described electron transport materials, semiconductor nanoparticles (see later description), and fluoroalcohol solvent.

The thickness of the electron transport layer is not particularly limited but is normally about 5 nm to 5 μm and preferably 5 to 200 nm. The electron transport layer may have a single-layer structure made of one or two types of the aforementioned materials.

The organic EL element can include a high n electron transport layer doped with impurities as a guest material in addition to the semiconductor nanoparticles of the present invention. Examples thereof are described in Japanese Patent Laid-open Publications Nos. 4-297076, 10-270172, 2000-19640, 2001-102175, J. Appl. Phys., 95, 5773 (2004), and the like.

Preferably, the electron transport layer of the present invention contains an alkali metal salt of an organic substance. The kind of the organic substance is not particularly limited but is formate, acetate, propionate, butyrate, valerate, caproate, enanthate, caprylate, oxalate, malonate, succinate, benzoate, phthalate, isophthalate, terephthalate, salicylate, pyruvate, lactate, malate, adipate, mesilate, or tosilate, benzene sulfonate. The organic substance is preferably formate, acetate, propionate, butyrate, valerate, caproate, enanthate, caprylate, oxalate, malonate, succinate, or benzoate and more preferably an alkali metal salt of aliphatic carboxylic acid such as formate, acetate, propionate, or butyrate. It is preferable that the carbon number of aliphatic carboxylic acid is not more than 4. Most preferably, the organic substance is acetate.

The type of the alkali metal in the alkali metal salt of the organic substance is not particularly limited but is Na, K, or Cs. The alkali metal is preferably k or Cs and more preferably Cs. The alkali metal salt of the organic substance includes combinations of the organic substances and alkali metals and is preferably Li formate, K formate, Na formate, Cs formate, Li acetate, K acetate, Na acetate, Cs acetate, Li propionate, Na propionate, K propionate, Cs propionate, Li oxalate, Na oxalate, K oxalate, Cs oxalate, Li malonate, Na malonate, K malonate, Cs malonate, Li succinate, Na succinate, K succinate, Cs succinate, Li benzoate, Na benzoate, K benzoate, Cs benzoate, more preferably, Li acetate, Na acetate, K acetate, Cs acetate, and most preferably Cs acetate.

The content of the above dope material with respect to the electron transport layer to which the dope material is added is preferably 1.5 to 35 mass %, more preferably 3 to 25 mass %, and most preferably 5 to 15 mass %.

(3.1) Compound Represented by General Formula (A)

Preferably, the electron transport material constituting the electron transport layer is represented by General formula (A).

The compound of General formula (A) may be contained in the light emitting layer described later. When used in the light emitting layer, preferably, the compound of General formula (A) is used as a host compound.

[Compound 7]

GENERAL FORMULA (A)

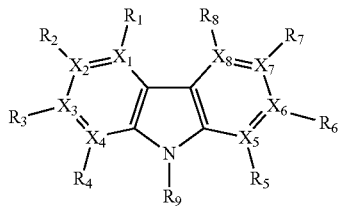

In General formula (A), any one of $X_1$ to $X_8$ is a carbon atom, and each of substituents represented by $R_1$ to $R_8$ bonded to the carbon atom is: an alkyl group (for example, a methyl group, ethyl group, propyl group, isopropyl group, tert-butyl group, pentyl group, hexyl group, octyl group, dodecyl group, tridecyl group, tetradecyl group, pentadecyl group, or the like); a cycloalkyl group (for example, a cyclopentyl group, cyclohexyl group, or the like); an alkenyl group (for example, a vinyl group, allyl group, or the like); an alkynyl group (for example, an ethynyl group, a propargyl group, or the like); an aryl group (for example, a phenyl group, naphthyl group, or the like); an aromatic heterocyclic group (for example, a furyl group, thienyl group, pyridyl group, pyridazinyl group, pyrimidinyl group, pyrazinyl group, triazinyl group, imidazolyl group, pyrazolyl group, thiazolyl group, quinazolinyl group, phthalazinyl group, or the like); a heterocyclic group (for example, pyrrolidyl group, imidazoligyl group, morpholyl group, oxazolidyl group, or the like); an alkoxyl group (for example, methoxy group, ethoxy group, propyloxy group, pentyloxy group, hexyloxy group, octyloxy group, dodecyloxy group, or the like), a cycloalkoxyl group (for example, a cyclopentyloxy group, cyclohexyloxy group, or the like); an aryloxy group (for example, a phenoxy group, naphthyloxy group, or the like); an alkylthio group (for example, a methylthio group, ethylthio group, propylthio group, pentylthio group, hexylthio group, octylthio group, dodecylthio group, or the like); a cycloalkylthio group (for example, a cyclopentylthio group, cyclohexylthio group, or the like), an arylthio group (for example, a phenylthio group, naphthylthio group, or the like), an alkoxycarbonyl group (for example, a methyloxycarbonyl group, ethyloxycarbonyl group, butyloxycarbonyl group, octyloxycarbonyl group, dodecyloxycarbonyl group, or the like), an aryloxycarbonyl group (for example, a phenyloxycarbonyl group, naphthyloxycarbonyl group, or the like); a sulfamoyl group (for example, an aminosulfonyl group, methylaminosulfonyl group, dimethylaminosulfonyl group, butylaminosulfonyl group, hexylaminosulfonyl group, cyclohexylaminosulfonyl group, octylaminosulfonyl group, dodecylaminosulfonyl group, phenylaminosulfonyl group, naphthylaminosulfonyl group, 2-pyridylaminosulfonyl group, or the like); an acyl group (for example, an acetyl group, ethylcarbonyl group, cyclohexylcarbonyl group, octylcarbonyl group, 2-ethylhexylcarbonyl group, dodecylcarbonyl group, phenylcarbonyl group, naphthylcarbonyl group, pyridylcarbonyl group, or the like); an acyloxy group (for example, an acetyloxy group, ethylcarbonyloxy group, propylcarbonyl group, pentylcarbonyl group, butylcarbonyloxy group, octylcarbonyloxy group, dodecylcarbonyloxy group, phenylcarbonyloxy group, or the like); an amide group (for example, a methylcarbonylamino group, ethylcarbonylamino group, dimethylcarbonylamino group, propylcarbonylamino group, pentylcarbonylamino group, cyclohexylcarbonylamino group, 2-ethylhexylcarbonylamino group, octylcarbonylamino group, dodecylcarbonylamino group, phenylcarbonylamino group, naphthylcarbonylamino group, or the like); a carbamoyl group (for example, an aminocarbonyl group, methylaminocarbonyl group, dimethylaminocarbonyl group, propylaminocarbonyl group, pentylaminocarbonyl group, cyclohexylaminocarbonyl group, octylaminocarbonyl group, 2-ethylhexylaminocarbonyl group, dodecylaminocarbonyl group, phenylaminocarbonyl group, naphthylaminocarbonyl group, 2-pyridylaminocarbonyl group, or the like); an ureido group (for example, a methylureido group, ethylureido group, pentylureido group, cyclohexylureido group, octylureido group, dodecylureido group, phenylureido group, naphthylureido group, 2-pyridylaminoureido group, or the like); a sulfinyl group (for example, a methylsulfinyl group, ethylsulfinyl group, butylsulfinyl group, cyclohexylsulfinyl group, 2-ethylhexylsulfinyl group, dodecylsulfinyl group, phenylsulfinyl group, naphthylsulfinyl group, 2-pyridylsulfinyl group, or the like); an alkylsulfonyl group (for example, a methylsulfonyl group, ethylsulfonyl group, butylsulfonyl group, cyclohexylsulfonyl group, 2-ethylhexylsulfonyl group, dodecylsulfonyl group, or the like); an arylsulfonyl group (a phenylsulfonyl group, naphthylsulfonyl group, 2-pyridiylsulfonyl group, or the like); an amino group (for example, an amino group, ethylamino group, dimethylamino group, butylamino group, cyclopentylamino group, 2-ethylhexylamino group, dodecylamino group, aniline group, naphthylamino group, 2-pyridylamino group, or the like); a halogen atom (for example, a fluorine atom, chlorine atom, bromine atom, or the like); a fluorohydrocarbon group (for example, a fluoromethyl group, trifluoromethyl group, pentafluoroethyl group, pentafluorophenyl group, or the like); a cyano group; a nitro group; a hydroxyl group; a mercapto group; a silyl group (for example, a trimethylsilyl group, triisopripylsilyl group, triphenylsilyl group, phenyldiethylsilyl group, or the like); or the like.

These substituents may be further substituted with the aforementioned substituents. Some of these substituents may be bonded to form a ring.

The preferable substituents are alkyl groups, cycloalkyl groups, fluorohydrocarbon groups, aryl groups, and aromatic heterocyclic groups.

Moreover, adjacent ones of $R_1$ to $R_8$ may be bonded to form a ring.

The substituent represented by $R_9$ in General formula (A) is synonymous with the substituent represented by each of $R_1$ to $R_8$ in General formula (A).

(3.2) Compound Represented by General Formula (1)

Furthermore, preferably used ones of the compounds represented by General formula (A) of the present invention are compounds represented by General formula (1) below.

[Compound 8]

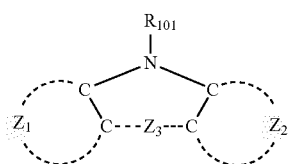

GENERAL FORMULA (1)

A description is given of compounds represented by General formula (1) according to the present invention.

The inventors have intensively studied and have found that the organic EL element including a compound represented by General formula (1) above has a high light emission efficiency. Furthermore, the inventors have found that the organic EL element including a compound represented by General formula (1) has a long lifetime.

In General formula (1), $Z_1$ represents an aromatic heterocyclic ring which may include a substituent, and $Z_2$ represents an aromatic heterocyclic ring which may include a substituent or an aromatic hydrocarbon ring, and $Z_3$ represents a divalent linking group or a mere bond. $R_{101}$ represents a hydrogen atom or a substituent.

Each of the aromatic heterocyclic rings represented by $Z_1$ and $Z_2$ in General formula (1) above is a furan ring, thiophen ring, pyridine ring, pyridazine ring, pyrimidine ring, pyrazine ring, triazine ring, benzoimidazole ring, oxadiazole ring, triazole ring, imidazole ring, pyrazole ring, thiazole ring, indole ring, benzoimidazole ring, benzothiazole ring, benzoxazole ring, quinoxaline ring, quinazoline ring, phthalazine ring, carbazole ring, carboline ring, a ring in which a carbon atom of a hydrocarbon ring constituting a carboline ring is further substituted with a nitrogen atom, or the like. Furthermore, the aromatic heterocyclic ring may include a substituent represented by $R_{101}$ described later.

The aromatic hydrocarbon ring represented by $Z_2$ in General formula (1) above is a benzene ring, biphenyl ring, naphthalene ring, azulene ring, anthracene ring, phenanthrene ring, pyrene ring, chrysene ring, naphthacene ring, triphenylene ring, o-terphenyl ring, m-terphenyl ring, p-terphenyl ring, acenaphthene ring, coronene ring, fluorene ring, fluoranthrene ring, naphthacene ring, pentathene ring, perylene ring, pentaphene ring, picene ring, pyrene ring, pyranthrene ring, anthranthrene ring, or the like. Furthermore, the aromatic hydrocarbon ring may include a substituent represented by $R_{101}$.

The substituent represented by $R_{101}$ in General formula (1) is synonymous with the substituent represented by any one of $R_1$ to $R_8$ which is bonded to a carbon atom of any one of $X_1$ to $X_8$ in General formula (A).

The divalent linking group may be a hydrocarbon group such as an alkylene group, alkenylene group, alkynylene group, or arylene group or may contain a hetero atom. Moreover, the divalent linking group may be derived from a compound including an aromatic heterocyclic ring (also called a heteroaromatic compound) such as a thiophene-2,5-diyl group or pyridine-2,3-diyl group or may be a chalcogen atom such as an oxygen or sulfur atom. Alternatively, the divalent linking group may be a group linked through a hetero atom such as an alkylimino group, dialkylsilanediyl group, or diarylgermanndiyl group.

The mere bond is a bond directly connecting substituents to be linked.

Specific examples of the divalent linking group include the same groups as the divalent linking group represented by La in General formula (10) described later.

In the present invention, it is preferable that $Z_1$ of General formula (1) above is a six-membered ring. This can further increase the light emission efficiency and can further increase the lifetime.

In the present invention, it is preferable that $Z_2$ of General formula (1) above is a six-membered ring. This can further increase the light emission efficiency and can further increase the lifetime.

Furthermore, preferably, both $Z_1$ and $Z_2$ are six-membered rings for further increasing the light emission efficiency and further increasing the lifetime.

Preferred compounds represented by General formula (1) are compounds represented by General formulae (I-1) to (1-10).

[Compound 9]

GENERAL FORMULA (1-1)

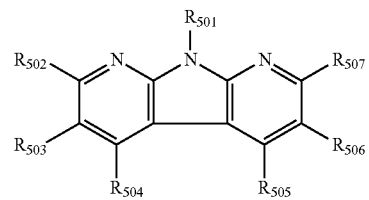

[Compound 10]

GENERAL FORMULA (1-2)

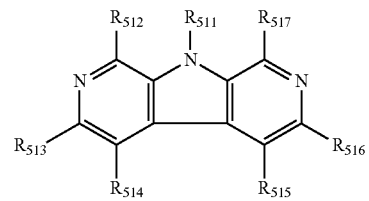

[Compound 11]

GENERAL FORMULA (1-3)

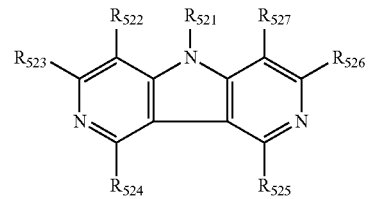

[Compound 12]

GENERAL FORMULA (1-4)

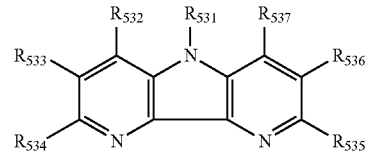

[Compound 13]

GENERAL FORMULA (1-5)

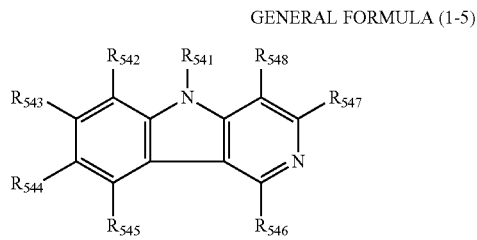

[Compound 14]

GENERAL FORMULA (1-6)

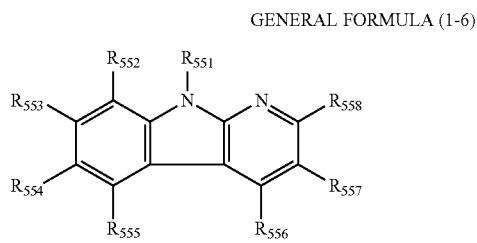

[Compound 15]

GENERAL FORMULA (1-7)

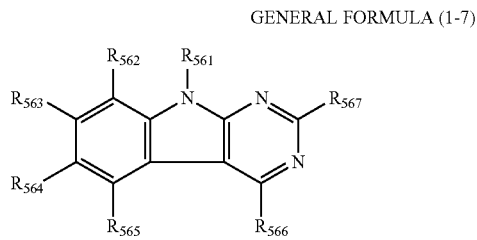

[Compound 16]

GENERAL FORMULA (1-8)

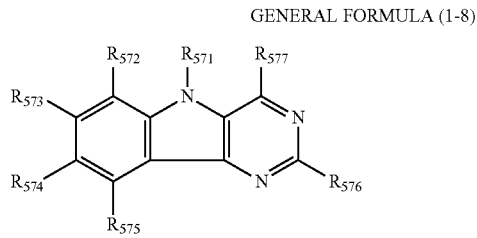

[Compound 17]

GENERAL FORMULA (1-9)

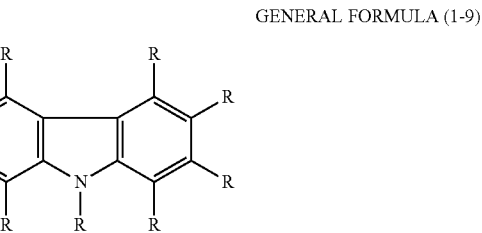

[Compound 18]

GENERAL FORMULA (1-10)

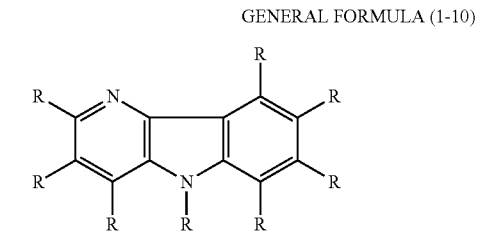

In General formula (1-1), $R_{501}$ to $R_{507}$ each represent a hydrogen atom or a substituent.

By using a compound represented by General formula (1-1), the light emission efficiency of the organic EL element can be further increased. Moreover, the lifetime thereof can be further lengthened.

In General formula (1-2), $R_{511}$ to $R_{517}$ each represent a hydrogen atom or a substituent.

By using a compound represented by General formula (1-2), the light emission efficiency of the organic EL element can be further increased. Moreover, the lifetime thereof can be further lengthened.

In General formula (1-3), $R_{521}$ to $R_{527}$ each represent a hydrogen atom or a substituent.

By using a compound represented by General formula (1-3), the light emission efficiency of the organic EL element can be further increased. Moreover, the lifetime thereof can be further lengthened.

In General formula (1-4), $R_{531}$ to $R_{537}$ each represent a hydrogen atom or a substituent.

By using a compound represented by General formula (1-4), the light emission efficiency of the organic EL element can be further increased. Moreover, the lifetime thereof can be further lengthened.

In General formula (1-5), $R_{541}$ to $R_{548}$ each represent a hydrogen atom or a substituent.

By using a compound represented by General formula (1-5), the light emission efficiency of the organic EL element can be further increased. Moreover, the lifetime thereof can be further lengthened.

In General formula (1-6), $R_{551}$ to $R_{558}$ each represent a hydrogen atom or a substituent.

By using a compound represented by General formula (1-6), the light emission efficiency of the organic EL element can be further increased. Moreover, the lifetime thereof can be further lengthened.

In General formula (1-7), $R_{561}$ to $R_{567}$ each represent a hydrogen atom or a substituent.

By using a compound represented by General formula (1-7), the light emission efficiency of the organic EL element can be further increased. Moreover, the lifetime thereof can be further lengthened.

In General formula (1-8), $R_{571}$ to $R_{577}$ each represent a hydrogen atom or a substituent.

By using a compound represented by General formula (1-8), the light emission efficiency of the organic EL element can be further increased. Moreover, the lifetime thereof can be further lengthened.

In General formula (1-9), each R represents a hydrogen atom or a substituent. The plural Rs may be either the same or different.

By using a compound represented by General formula (1-9), the light emission efficiency of the organic EL element can be further increased. Moreover, the lifetime thereof can be further lengthened.

In General formula (1-10), each R represents a hydrogen atom or a substituent. The plural Rs may be either the same or different.

By using the compounds represented by General formula (1-10), an organic EL element having higher luminescence efficiency can be obtained. Further an organic EL element having longer lifetime can be obtained.

The preferred compounds represented by General formula (1) above are compounds each having at least one group represented by any one of General formulae (2-1) to (2-8) above. More preferably, two to four groups represented by any of General formulae (2-1) to (2-8) are included in a molecule. At this time, in the structure represented by General formula (1), part other than $R_{101}$ may be substituted with any of General formulae (2-1) to (2-8).

[Compound 19]

GENERAL FORMULA (2-1)
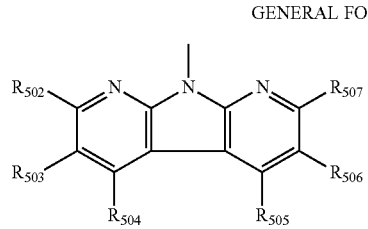

GENERAL FORMULA (2-2)
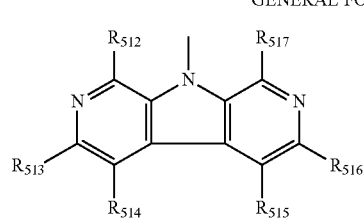

GENERAL FORMULA (2-3)
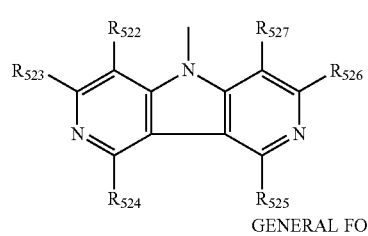

GENERAL FORMULA (2-4)
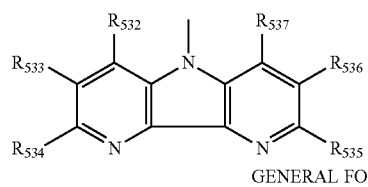

GENERAL FORMULA (2-5)
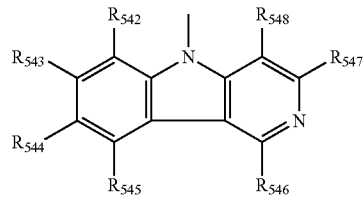

GENERAL FORMULA (2-6)
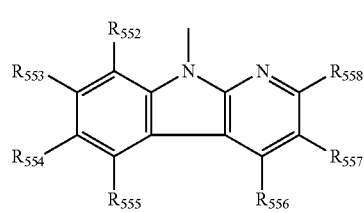

GENERAL FORMULA (2-7)
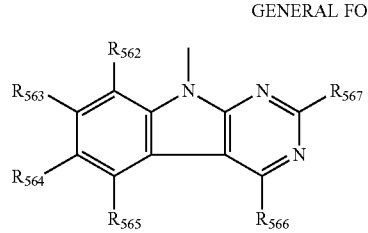

-continued

GENERAL FORMULA (2-8)
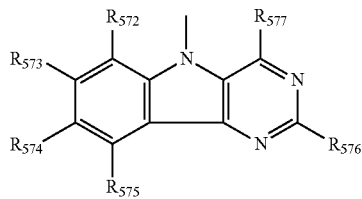

At this time, compounds represented by General formulae (3) to (17) are especially preferred for providing the effect of the present invention.

[Compound 20]

GENERAL FORMULA (3)
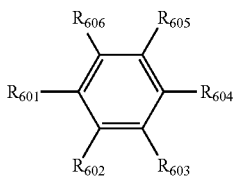

[Compound 21]

GENERAL FORMULA (4)
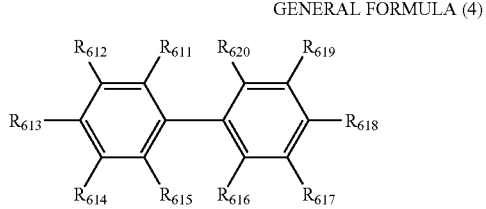

[Compound 22]

GENERAL FORMULA (5)
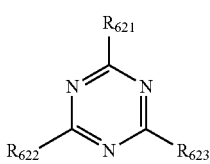

[Compound 23]

GENERAL FORMULA (6)
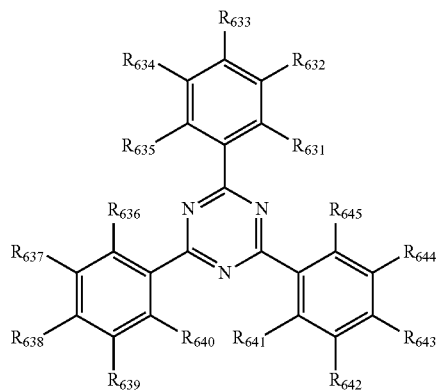

-continued
[Compound 24]
GENERAL FORMULA (7)
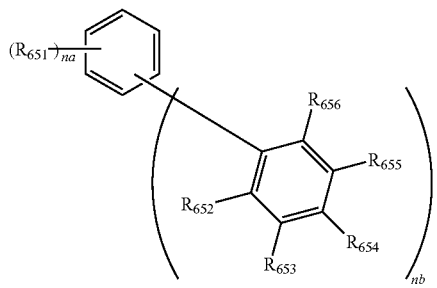
[Compound 25]
GENERAL FORMULA (8)
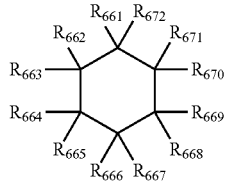
[Compound 26]
GENERAL FORMULA (9)
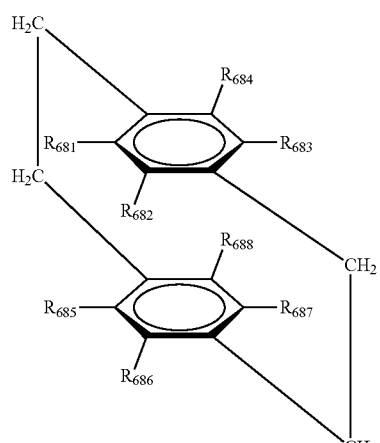
[Compound 27]
GENERAL FORMULA (10)
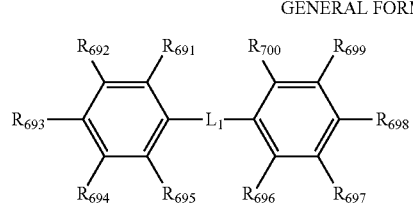
[Compound 28]
GENERAL FORMULA (11)
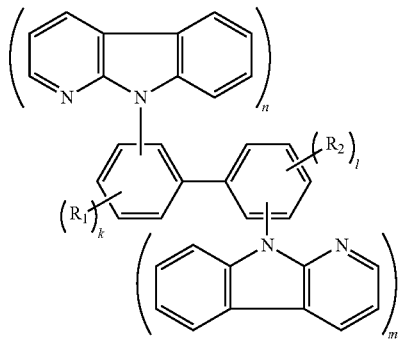
[Compound 29]
GENERAL FORMULA (12)
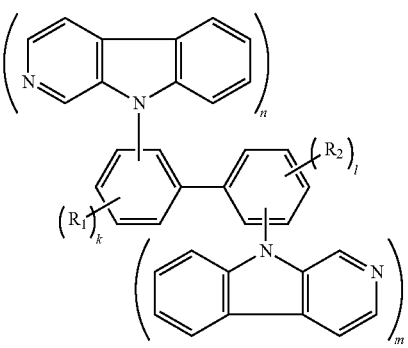
[Compound 30]
GENERAL FORMULA (13)
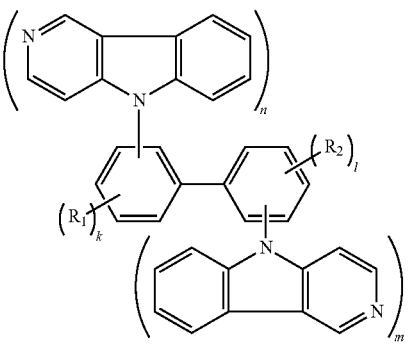
[Compound 31]
GENERAL FORMULA (14)
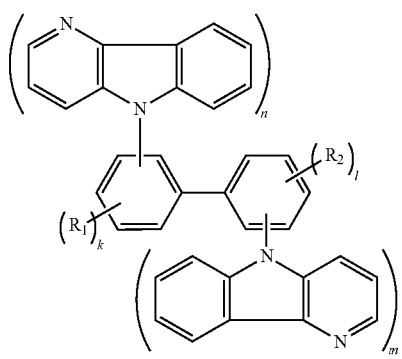

[Compound 32]

GENERAL FORMULA (15)

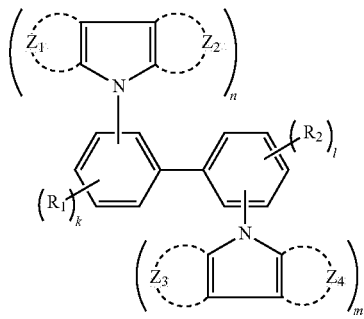

[Compound 33]

GENERAL FORMULA (16)

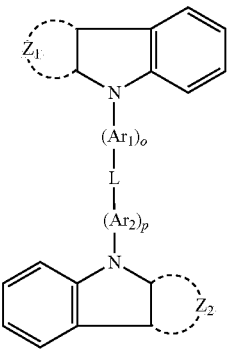

[Compound 34]

GENERAL FORMULA (17)

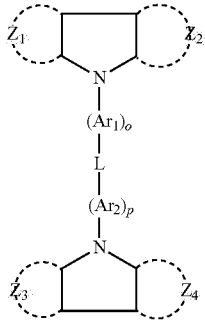

In General formula (3), $R_{601}$ to $R_{606}$ each represent a hydrogen atom or a substituent, and at least one of $R_{601}$ to $R_{606}$ is a group represented by any one of General formulae (2-1) to (2-4).

By using the compound represented by General formula (3) above, the light emission efficiency of the organic EL element can be further increased. Moreover, the lifetime thereof can be further lengthened.

In General formula (4), $R_{611}$ to $R_{620}$ each represent a hydrogen atom or a substituent, and at least one of $R_{611}$ to $R_{620}$ is a group represented by any one of General formulae (2-1) to (2-4).

By using the compound represented by General formula (4) above, the light emission efficiency of the organic EL element can be further increased. Moreover, the lifetime thereof can be further lengthened.

In General formula (5), $R_{621}$ to $R_{623}$ each represent a hydrogen atom or a substituent, and at least one of $R_{611}$ to $R_{620}$ is a group represented by any one of General formulae (2-1) to (2-4).

By using the compound represented by General formula (5) above, the light emission efficiency of the organic EL element can be further increased. Moreover, the lifetime thereof can be further lengthened.

In General formula (6), $R_{631}$ to $R_{645}$ each represent a hydrogen atom or substituent, and at least one of $R_{631}$ to $R_{645}$ is a group represented by any one of General formulae (2-1) to (2-4).

By using the compound represented by General formula (6) above, the light emission efficiency of the organic EL element can be further increased. Moreover, the lifetime thereof can be further lengthened.

In General formula (7), $R_{651}$ to $R_{656}$ each represent a hydrogen atom or a substituent, and at least one of $R_{651}$ to $R_{656}$ is a group represented by any one of General formulae (2-1) to (2-4). na represents an integer of 0 to 5, and nb represents an integer of 1 to 6. Herein, the sum of na and nb is 6.

By using the compound represented by General formula (7) above, the light emission efficiency of the organic EL element can be further increased. Moreover, the lifetime thereof can be further lengthened.

In General formula (8), $R_{661}$ to $R_{672}$ each represent a hydrogen atom or a substituent, and at least one of $R_{661}$ to $R_{672}$ is a group represented by any one of General formulae (2-1) to (2-4).

By using the compound represented by General formula (8) above, the light emission efficiency of the organic EL element can be further increased. Moreover, the lifetime thereof can be further lengthened.

In General formula (9), $R_{681}$ to $R_{688}$ each represent a hydrogen atom or a substituent, and at least one of $R_{681}$ to $R_{688}$ is a group represented by any one of General formulae (2-1) to (2-4).

By using the compound represented by General formula (9) above, the light emission efficiency of the organic EL element can be further increased. Moreover, the lifetime thereof can be further lengthened.

In General formula (10), $R_{691}$ to $R_{700}$ each represent a hydrogen atom or a substituent, and at least one of $R_{691}$ to $R_{700}$ is a group represented by any one of General formulae (2-1) to (2-4).

In General formula (10) above, the divalent linking group represented by $L_1$ is a hydrocarbon group such as: an alkylene group (for example, an ethylene group, trimethylene group, tetramethylene group, propylene group, ethylethylene group, pentamethylene group, hexamethylene group, 2,2,4-trimethylhexamethylene group, heptamethylene group, octamethylene group, nonamethylene group, decamethylene group, undecamethylene group, dodecamethylene group, cyclohexylene group (for example, a 1,6-cyclohexanediyl group or the like), or cyclopentylene group (for example, a 1,5-cyclopentanediyl group or the like)); an alkenylene group (for example, a vinylene group, propylene group, or the like); an alkynylene group (for example, an ethynylene group, 3-pentynylene group, or the like); or an arylene group. Moreover, the divalent linking group represented by $L_1$ is a group including a hetero atom (for example, a divalent group including a charcogen atom such as —O— or —S—, a —N(R)— group (herein, R represents a hydrogen atom or alkyl group, which is synonymous with the alkyl group represented by $R_{101}$ in General formula (1)), or the like.

In each of the above alykylene, alkenylene, alkynylene, and arylene groups, at least one of carbon atoms constituting the divalent linking group may be substituted with a chalcogen atom (oxygen, sulfur, or the like), the aforementioned —N(R)— group or the like.

Furthermore, the divalent linking group represented by $L_1$ is a group including a divalent heterocyclic group, for example. Examples thereof include an oxazolediyl group, pyrimidinediyl group, pyridazinediyl group, pyrandiyl group, pyrrolinediyl group, imidazolinediyl group, pyrazolidinediyl group, pyrazolinediyl group, piperidinediyl group, piperazinediyl group, morpholinediyl group, quinuclidinediyl group, or the like. Moreover, the divalent linking group represented by $L_1$ may be a divalent linking group derived from a compound having an aromatic heterocyclic ring (also called a heteroaromatic compound) such as a thiophen-2,5-diyl group or pyradine-2,3-diyl group.

Alternatively, the divalent linking group represented by $L_1$ may be a group linked through a hetero atom, such as an alkylimino group, dialkylsilanediyl group, or diarylgermanediyl group.

By using the compound represented by General formula (10), the light emission efficiency of the organic EL element can be further increased. Moreover, the lifetime thereof can be further lengthened.

The substituents represented by $R_1$ and $R_2$ in each of the compounds represented by General formulae (11) to (15) are each synonymous with the substituent represented by $R_{101}$ in General formula (1).

Examples of each of six-membered aromatic heterocyclic rings which are represented by $Z_1$, $Z_2$, $Z_3$, and $Z_4$ in General formula (15) above and each include at least one nitrogen atom are a pyridine ring, pyridazine group, pyrimidine group, pyrazine group, and the like.

Examples of each of six-membered aromatic heterocyclic rings which are represented by $Z_1$ and $Z_2$ in General formula (16) above and each include at least one nitrogen atom are a pyridine ring, pyridazine group, pyrimidine group, pyrazine group.

Each of the arylene groups represented by $Ar_1$ and $Ar_2$ in General formula (16) above is an o-phenylene group, m-phenylene group, p-phenylene group, naphthalenediyl group, anthracenediyl group, naphthacenediyl group, pyrenediyl group, naphthylnaphthalenediyl group, biphenyldiyl group (for example, a 3,3'-biphenyldiyl group, 3,6-biphenyldiyl group, or the like), terphenyldiyl group, quaterphenyldiyl group, quinquephenyldiyl group, sexiphenyldiyl group, septiphenyldiyl group, octiphenyldiyl group, nobiphenyldiyl group, deciphenyldiyl group, or the like. The arylene group may further include a later-described substituent.

Each of the divalent heterocyclic groups represented by $Ar_1$ and $Ar_2$ in General formula (16) above is a divalent group derived from a furan ring, thiophen ring, pyridine ring, pyridazine ring, pyrimidine ring, pyrazine ring, triadine ring, benzoimidazole ring, oxadiazole ring, triazole ring, imidazole ring, pyrazole ring, thiazole ring, indole ring, benzoimidazole ring, benzothiazole ring, benzoxazole ring, quinoxaline ring, quinazoline ring, phthalazine ring, carbazole ring, carboline ring, ring which is a carboline ring having a hydrocarbon ring with a carbon atom further substituted with a nitrogen atom, or the like. Furthermore, the aromatic heterocyclic group may include a substituent represented by $R_{101}$.

The divalent linking group represented by L in General formula (16) is synonymous with the divalent linking group represented by $L_1$ in General formula (10). The divalent linking group represented by L is preferably an alkylene group or a divalent group including a chalcogen atom such as —O— and —S— and, more preferably, an alkylene group.

The arylene groups represented by $Ar_1$ and $Ar_2$ in General formula (17) are synonymous with the arylene groups represented by $Ar_1$ and $Ar_2$ in General formula (16).

The aromatic heterocyclic groups represented by $Ar_1$ and $Ar_2$ in General formula (17) are synonymous with the divalent aromatic heterocyclic groups represented by $Ar_1$ and $Ar_2$ in General formula (16).

Examples of each of the six-membered aromatic heterocyclic rings which are represented by $Z_1$, $Z_2$, $Z_3$, and $Z_4$ in General formula (17) above and each include at least one nitrogen atom are a pyridine ring, pyridazine ring, pyrimidine ring, pyrazine ring, and the like.

The divalent linking group represented by L in General formula (17) is synonymous with the divalent linking group represented by $L_1$ in General formula (10). The divalent linking group represented by L is preferably an alkylene group or a divalent group including a chalcogen atom such as -o- and -s- and more preferably an alkylene group.

In the following, specific examples of the compound represented by General formula (1) according to the present invention are shown, but the present invention is not limited to these examples.

| Compound | Central skeleton |
|---|---|
| [Compound 35] | |
| 1 | 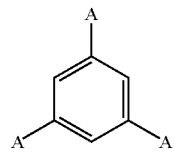 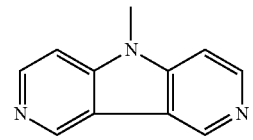 |
| 2 | 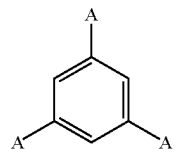 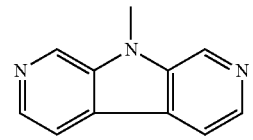 |

-continued

| Compound | Central skeleton | |
|---|---|---|
| 3 | (tetramethylbenzene with 3 A substituents) | (N-methyl pyrrole fused with two pyridines, N atoms shown) |
| 4 | (tetramethylbenzene with 3 A substituents) | (N-methyl pyrrole fused with two pyridines) |
| 5 | (dimethylbenzene with 2 A substituents) | (N-methyl dipyridopyrrole with two mesityl groups) |
| 6 | (terphenyl with one A substituent) | (N-methyl pyrrole fused with two pyridines) |
| 7 | (biphenyl with two A substituents) | (N-methyl pyrrole fused with two pyridines) |

[Compound 36]

| 8 | (biphenyl with two A substituents) | (N-methyl pyrrole fused with two pyridines) |
|---|---|---|
| 9 | (dimethylbiphenyl with two A substituents) | (N-methyl pyrrole fused with two pyridines) |
| 10 | (dimethylbiphenyl with two A substituents) | (N-methyl pyrrole fused with two pyridines) |

-continued

| Compound | Central skeleton | |
|---|---|---|
| 11 | (biphenyl with 2,2'-CF3 groups, A substituents at 4,4') | (N-methyl pyrrolo-dipyridine) |
| 12 | (terphenyl-type with phenyl substituents, A at two positions) | (N-methyl pyrrolo-dipyridine with CH3 groups) |
| 13 | (biphenyl with 2,2',6,6'-tetramethyl, A at 4,4') | (N-methyl pyrrolo-dipyridine) |

[Compound 37]

| 14 | (1,3,5-substituted benzene-biphenyl with four A groups) | (N-methyl pyrrolo-dipyridine) |
| 15 | (octafluorobiphenyl with A at 4,4') | (N-methyl pyrrolo-dipyridine) |
| 16 | (1,3,5-triazine with three A groups) | (N-methyl pyrrolo-dipyridine) |
| 17 | (1,3,5-triazine with three A groups) | (N-methyl pyrrolo-dipyridine isomer) |

-continued

| Compound | Central skeleton | |
|---|---|---|
| 18 | (triazine with two A substituents and one phenyl) | (N-methyl pyrrole fused with two pyridines) |
| 19 | (1,3,5-triazine with three 4-A-phenyl substituents) | (N-methyl pyrrole fused with two pyridines, different isomer) |

[Compound 38]

| Compound | Central skeleton | |
|---|---|---|
| 20 | (1,3,5-triazine with three 4-A-phenyl substituents) | (N-methyl pyrrolodipyridine with two CH$_3$ groups) |
| 21 | (1,3,5-triazine with one phenyl and two 4-A-phenyl substituents) | (N-methyl pyrrolodipyridine with two CH$_3$ on pyridine rings) |
| 22 | (1,3,5-triazine with three 2-methyl-4-A-phenyl substituents) | (N-methyl pyrrole fused with two pyridines) |

-continued
| Compound | Central skeleton | |
|---|---|---|
| 23 | 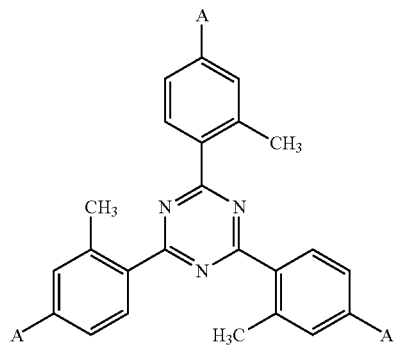 | 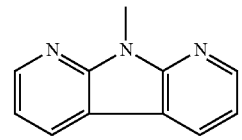 |
[Compound 39]
| 24 | 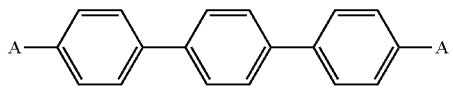 | 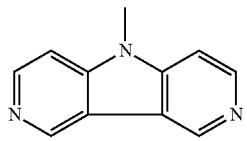 |
| 25 | 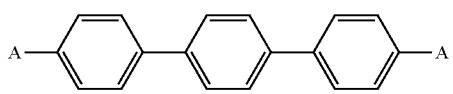 | 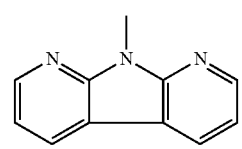 |
| 26 | 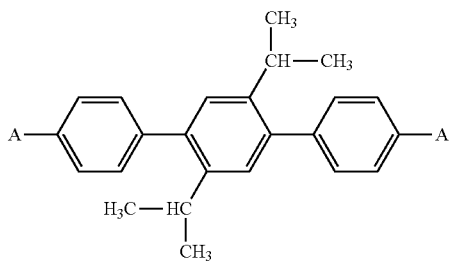 | 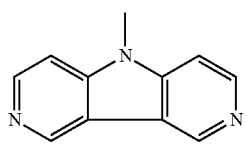 |
| 27 | 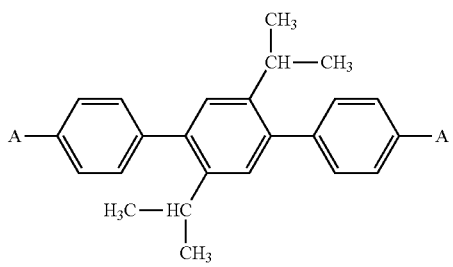 | 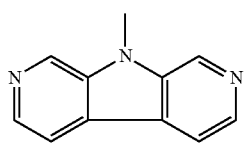 |
| 28 | 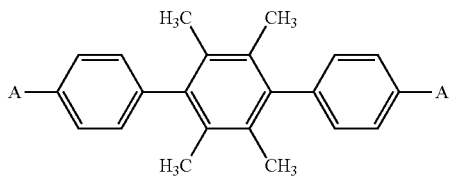 | 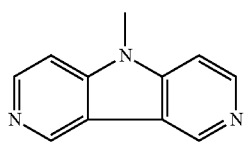 |

-continued
| Compound | Central skeleton | |
|---|---|---|
| 29 | 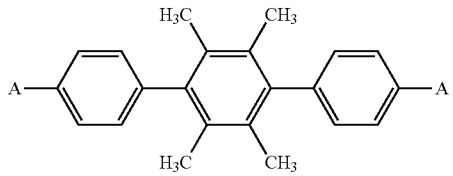 | 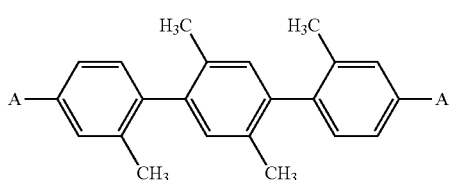 |
| 30 | 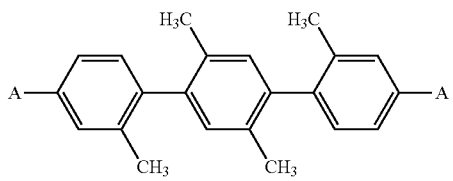 | 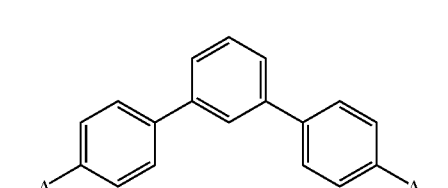 |
[Compound 40]
| 31 | 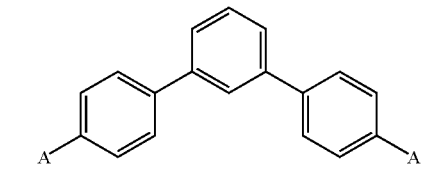 | 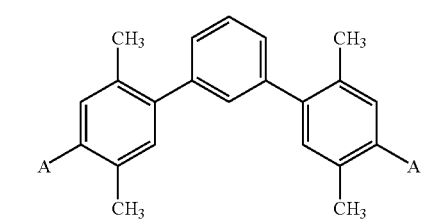 |
| 32 | | |
| 33 | | |
| 34 | | |

-continued
| Compound | Central skeleton | |
|---|---|---|
| 35 | 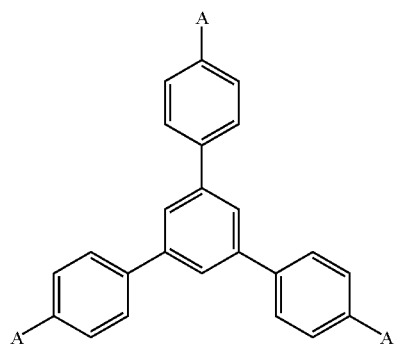 | 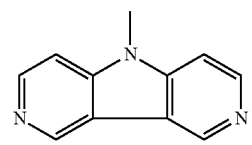 |
[Compound 41]
| | | |
|---|---|---|
| 36 | 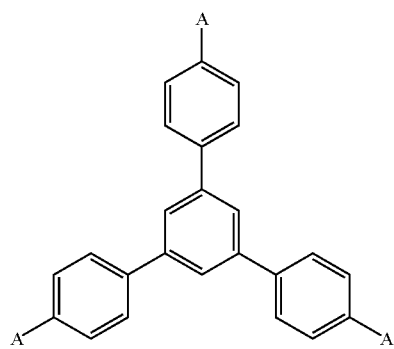 | 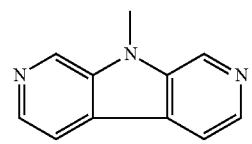 |
| 37 | 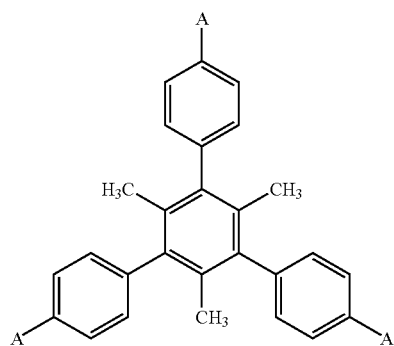 | 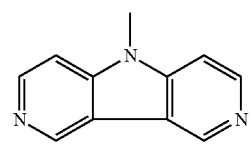 |
| 38 | 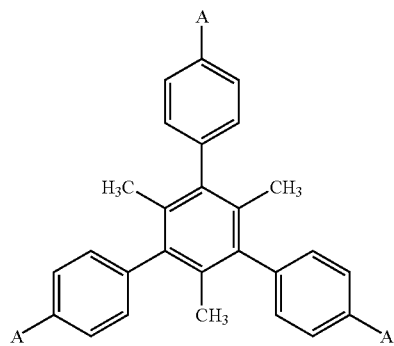 | 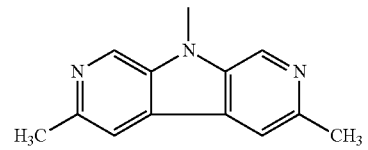 |

-continued

| Compound | Central skeleton | |
|---|---|---|
| 39 | (structure) | (structure) |

[Compound 42]

| 40 | (structure) | (structure) |
| 41 | (structure) | (structure) |
| 42 | (structure) | (structure) |
| 43 | (structure) | (structure) |

-continued

| Compound | Central skeleton | |
|---|---|---|
| 44 | (triphenylamine with two A-substituted phenyl groups) | (N-methyl pyrrole fused with two pyridines) |
| 45 | (cyclohexane with two A substituents) | (N-methyl pyrrole fused with two pyridines) |
| 46 | (cyclohexane with two A substituents) | (N-methyl pyrrole fused with two methyl-pyridines, H₃C substituents) |
| 47 | (benzene ring with three CH₂ groups connected to another benzene ring with A and CH₂) | (N-methyl pyrrole fused with two pyridines) |
| 48 | (bisphenol-type: A-Ph-C(CH₃)₂-Ph-A) | (N-methyl pyrrole fused with two pyridines) |
| 49 | (bisphenol-type: A-Ph-C(CH₃)₂-Ph-A) | (N-methyl pyrrole fused with two pyridines) |
| 50 | (A-Ph-C(CF₃)₂-Ph-A) | (N-methyl pyrrole fused with two pyridines) |
| 51 | (A-Ph-C(CF₃)₂-Ph-A) | (N-methyl pyrrole fused with two pyridines) |

[Compound 43]

-continued
| Compound | Central skeleton | |
|---|---|---|
| | [Compound 44] | |
| 52 | 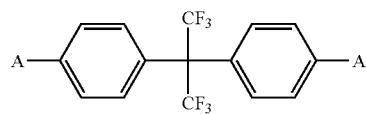 | 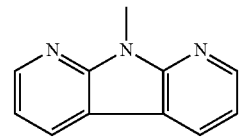 |
| 53 | 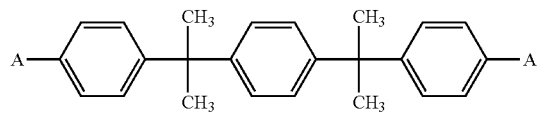 | 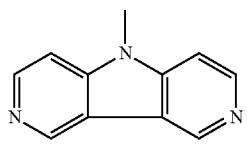 |
| 54 | 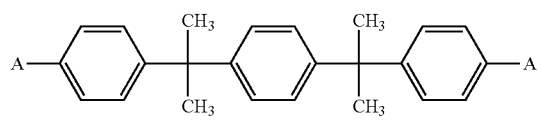 | 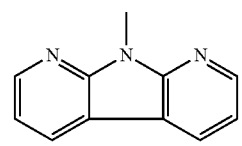 |
| 55 | 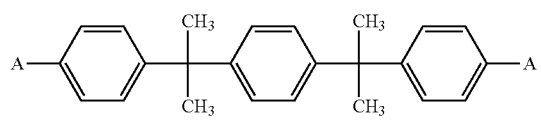 | 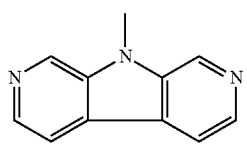 |
| 56 | 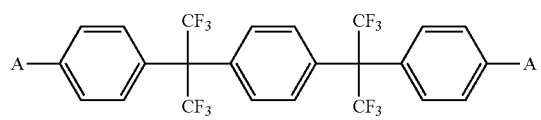 | 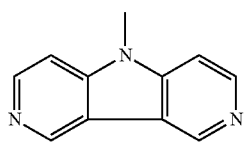 |
| 57 | 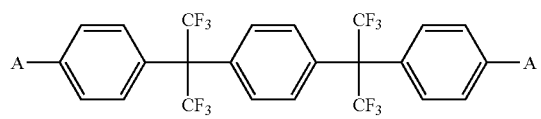 | 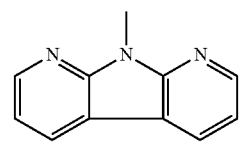 |
| 58 | 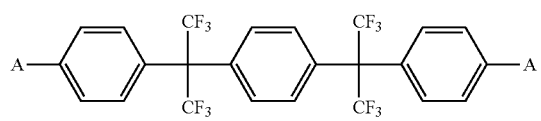 | 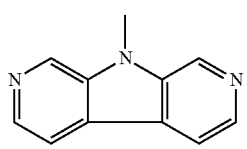 |
| 59 | 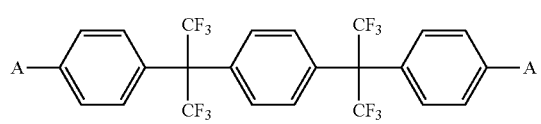 | 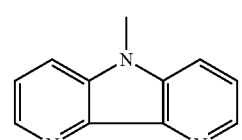 |

[Compound 45]
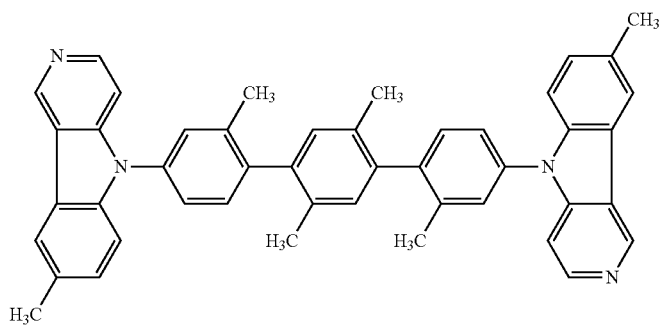
71
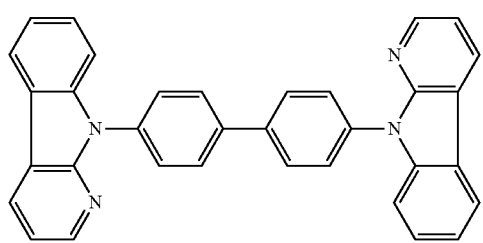
72
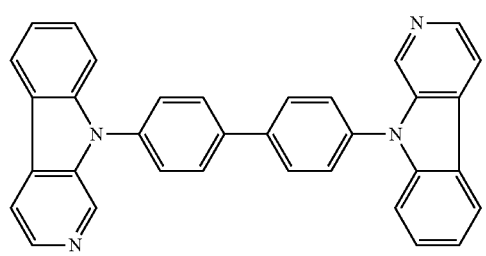
73
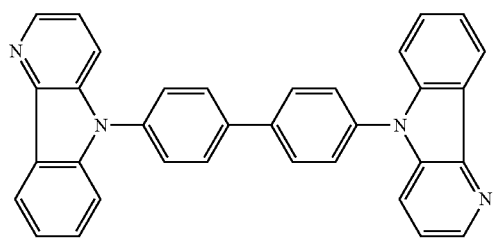
74
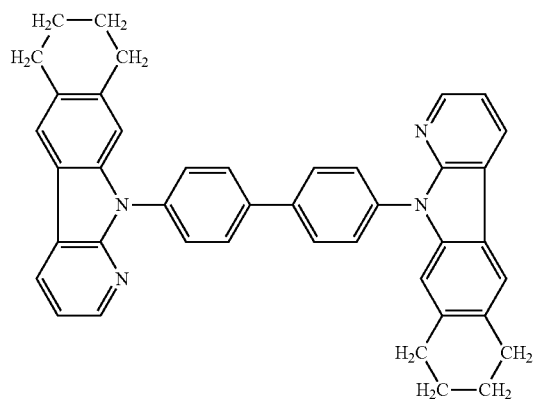
75
[Compound 48]
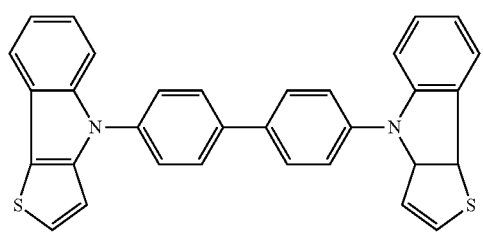
76
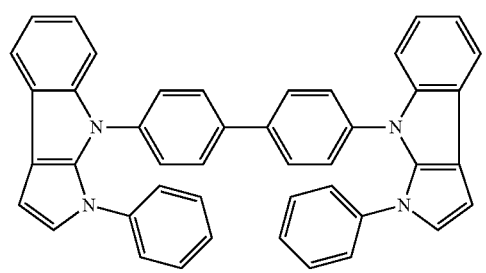
77

-continued
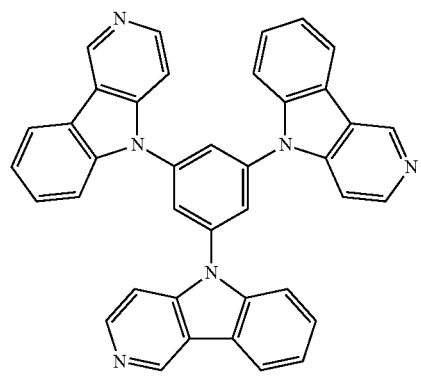
78
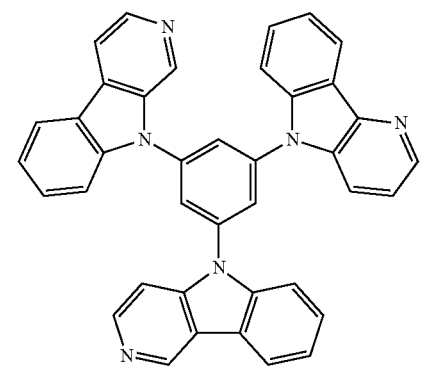
79
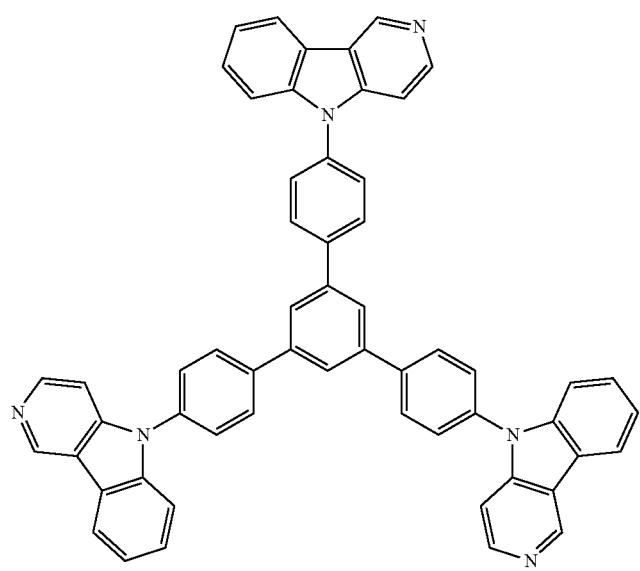
80
[Compound 49]
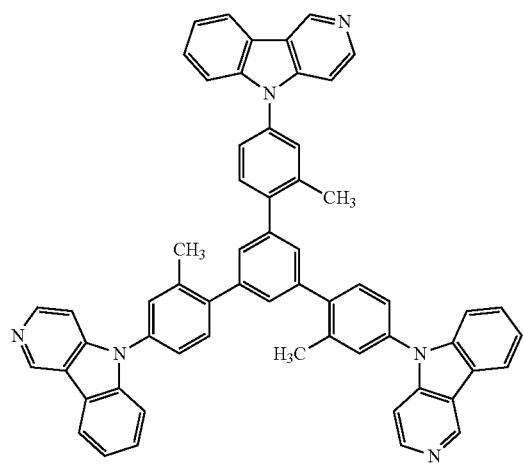
81
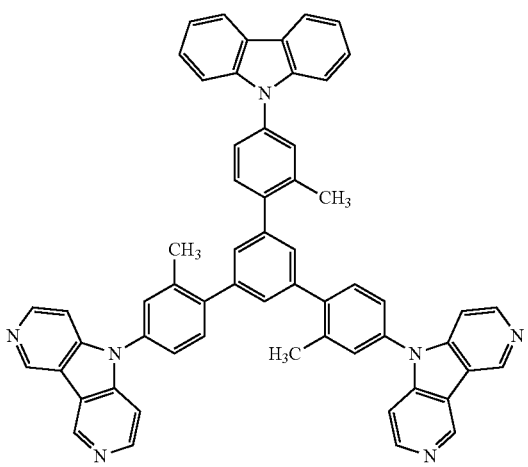
82

[Compound 50]
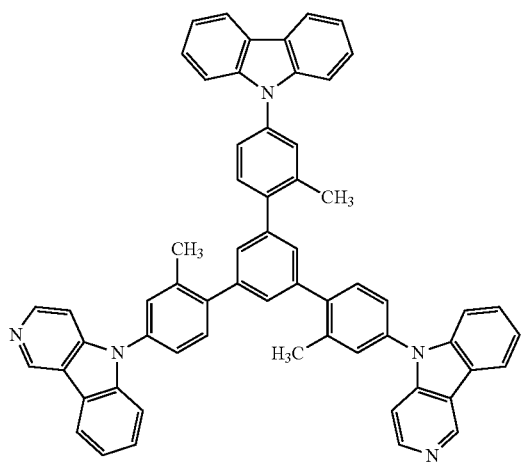
83
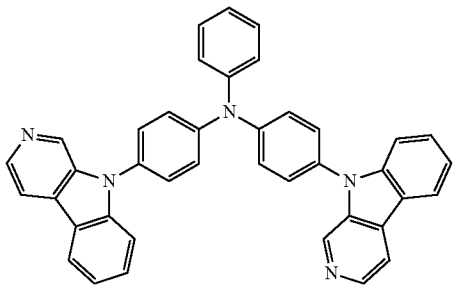
84
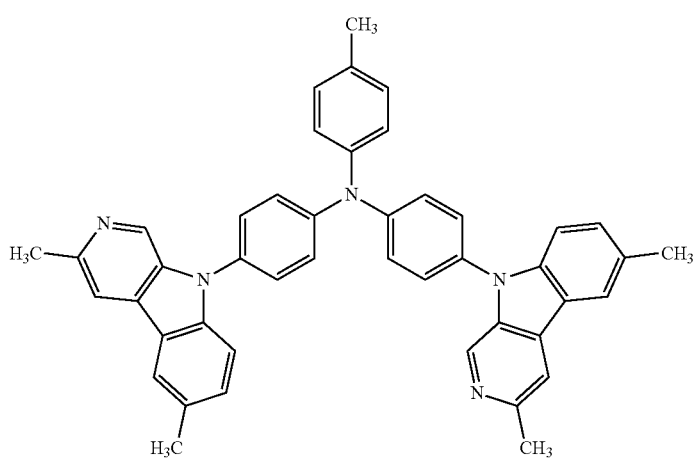
85
[Compound 51]
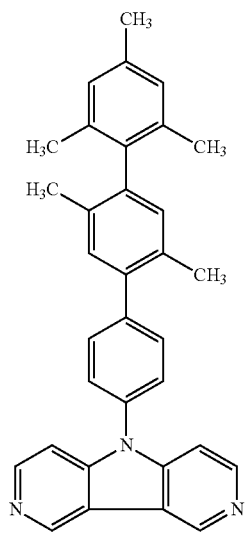
86
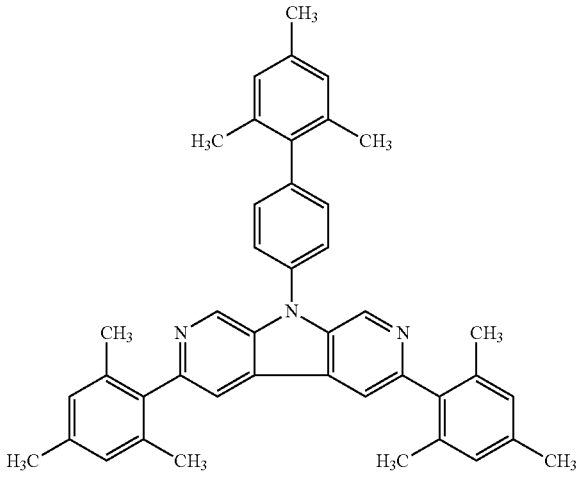
87

-continued
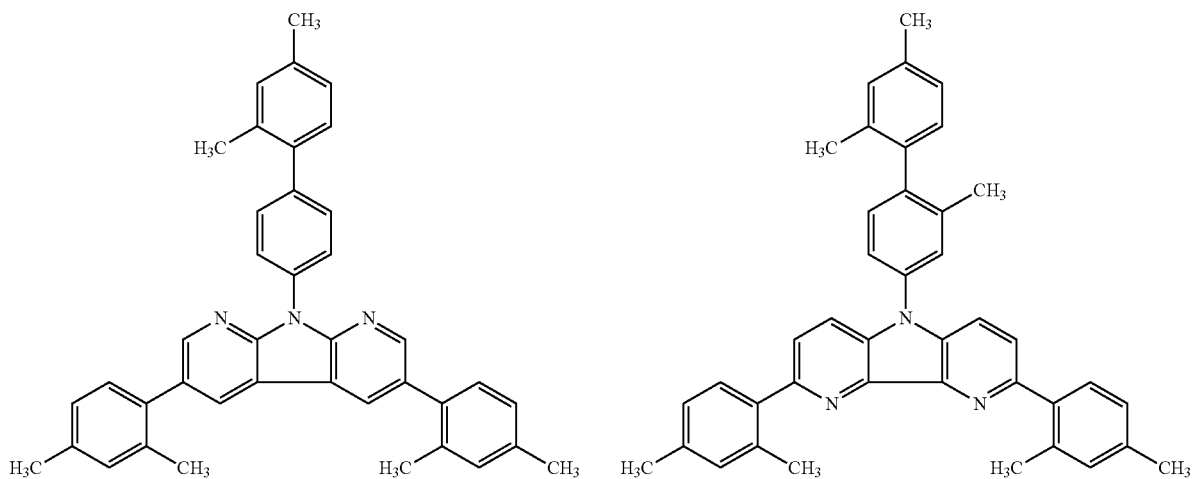
[Compound 52]
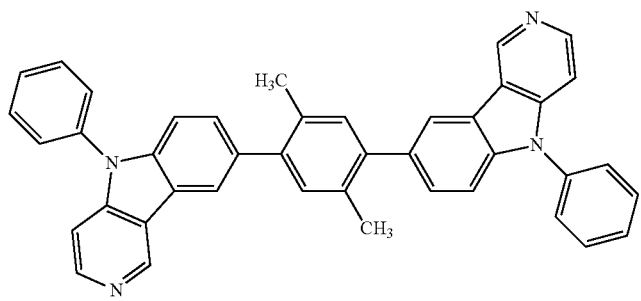
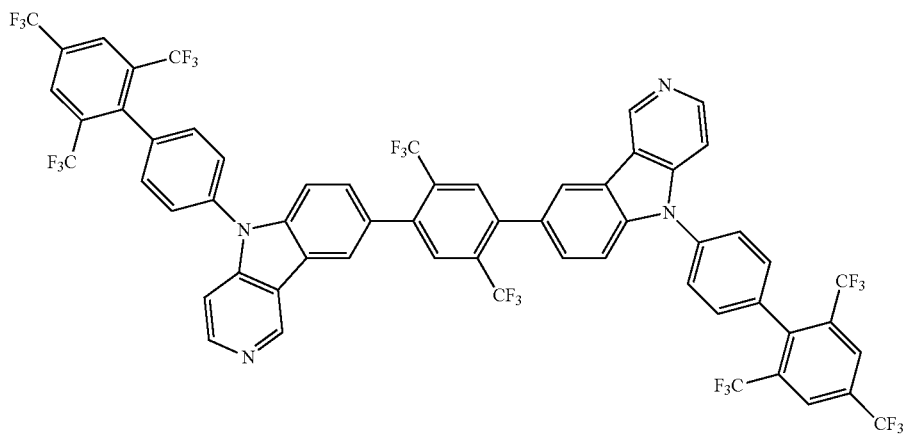
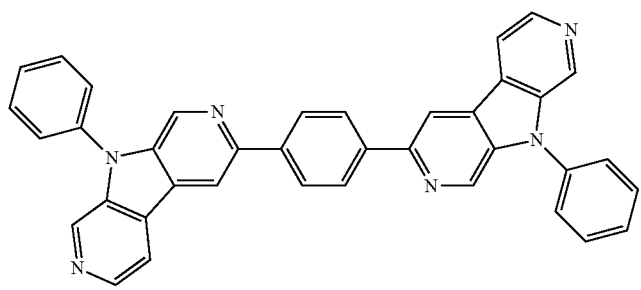

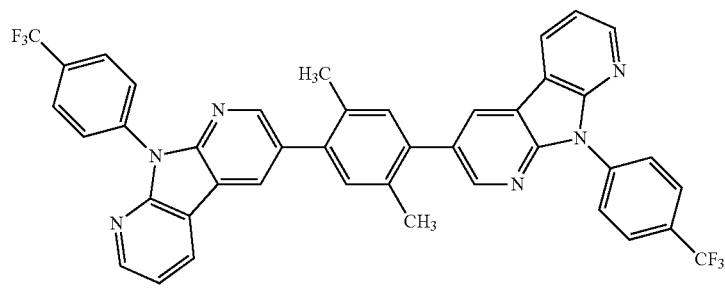
93
[Compound 53]
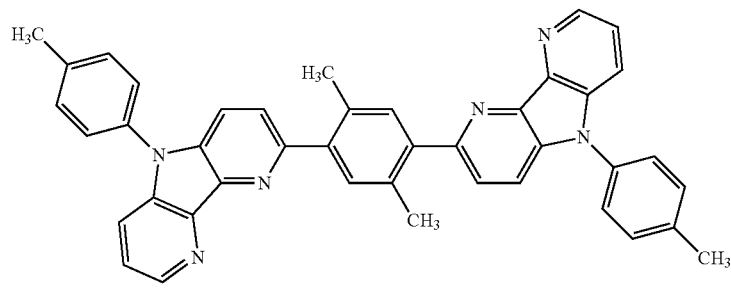
94
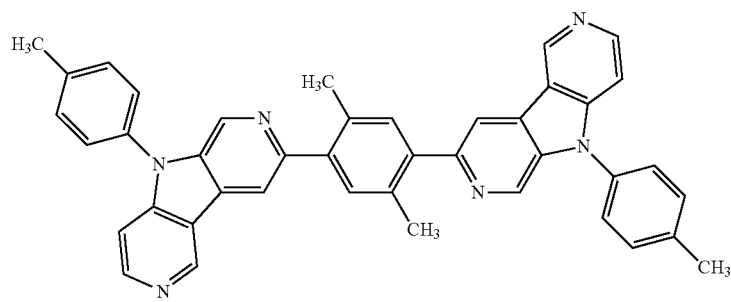
95
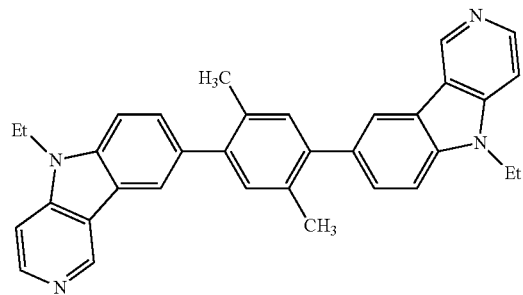
96
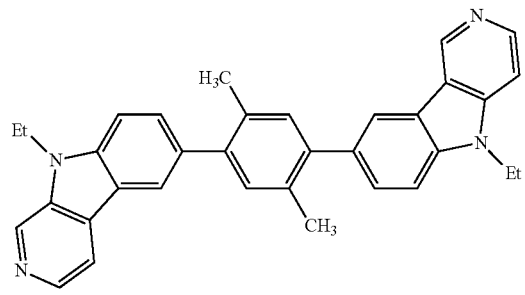
97
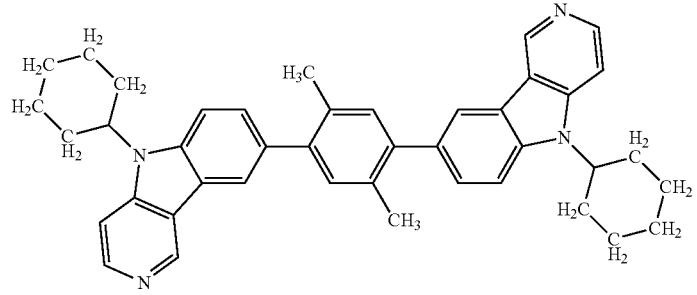
98

[Compound 54]
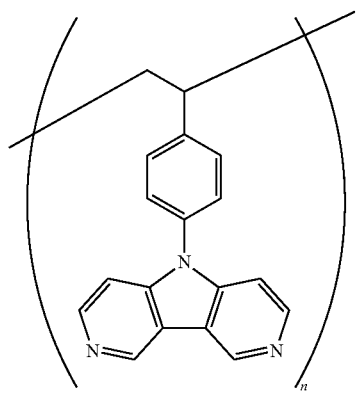
99
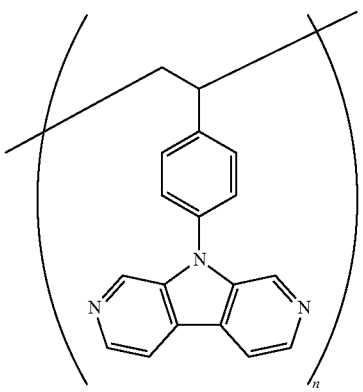
100
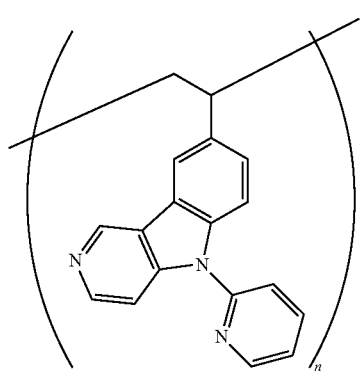
101
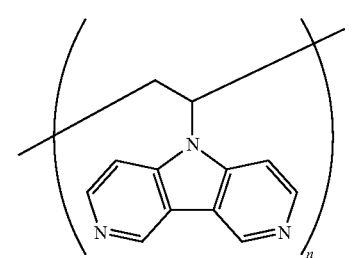
102
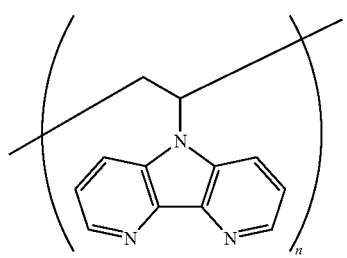
103
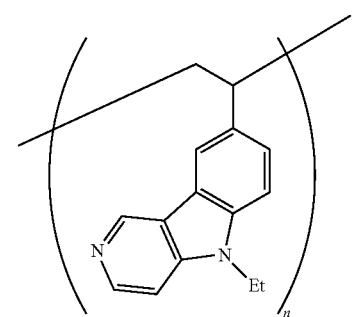
104
[Compound 55]
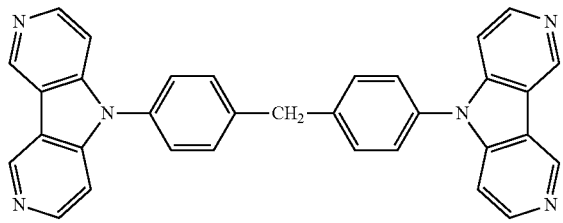
105
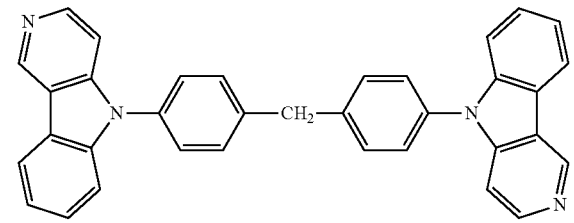
106
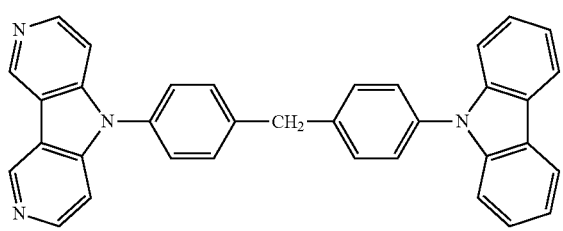
107
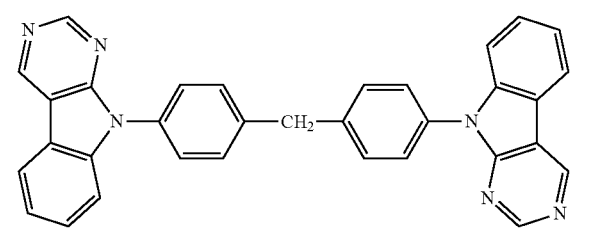
108

-continued
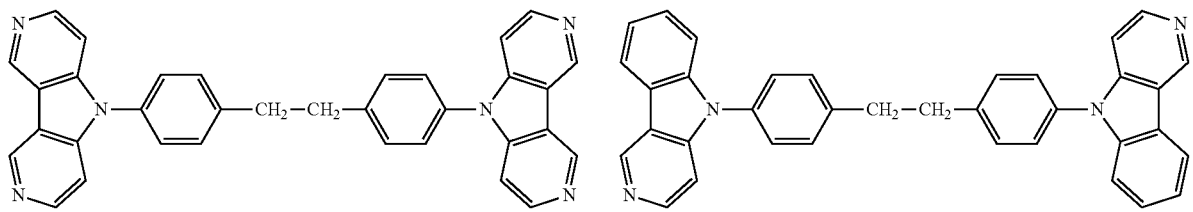
109
110
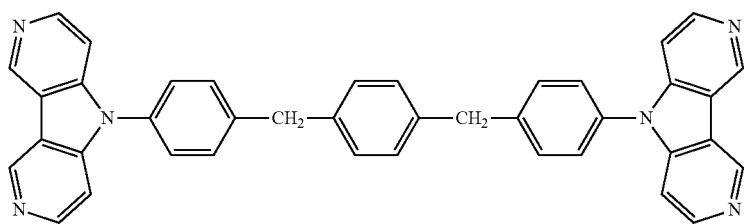
111
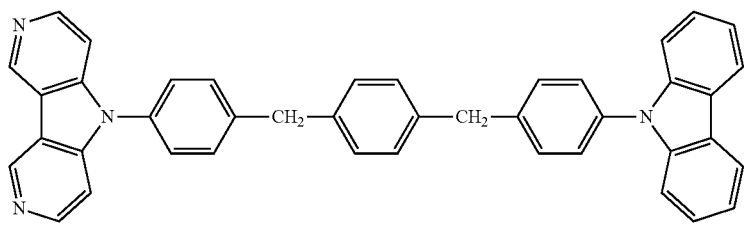
112
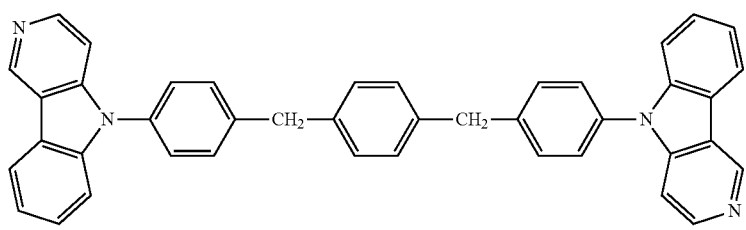
113
[Compound 56]
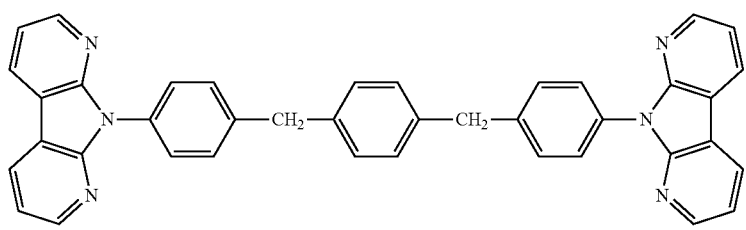
114
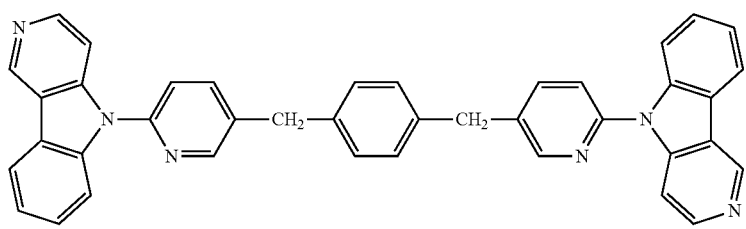
115

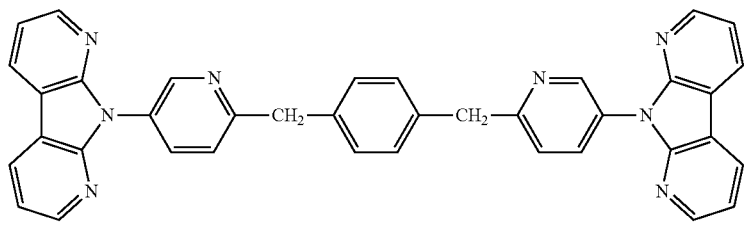
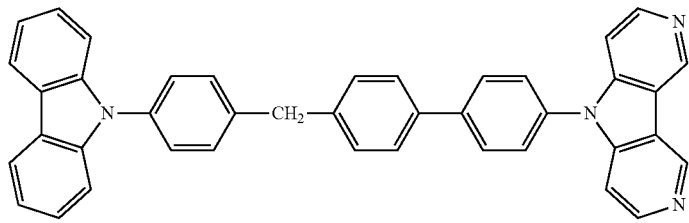
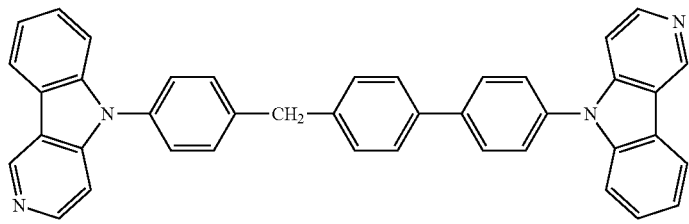
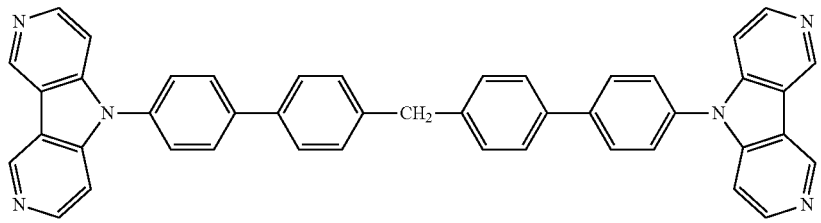
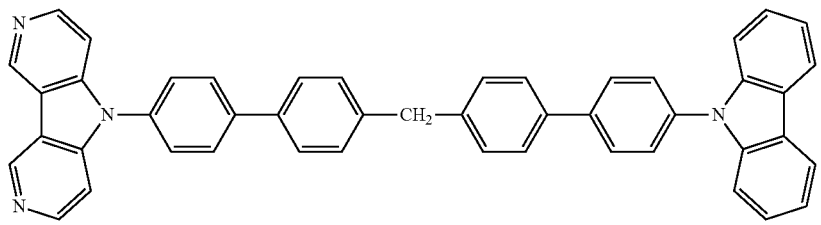
[Compound 57]
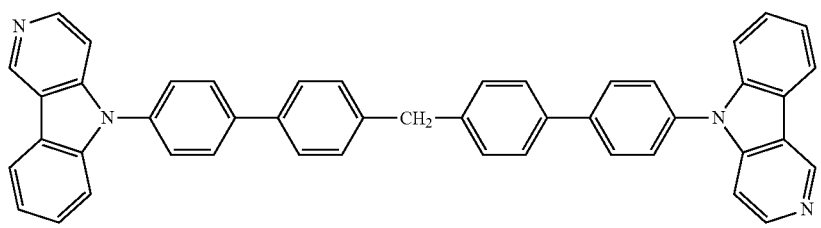
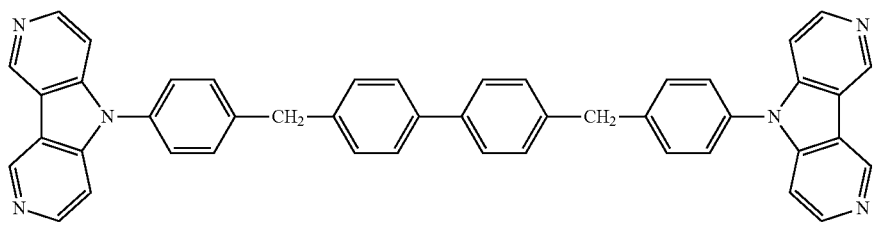

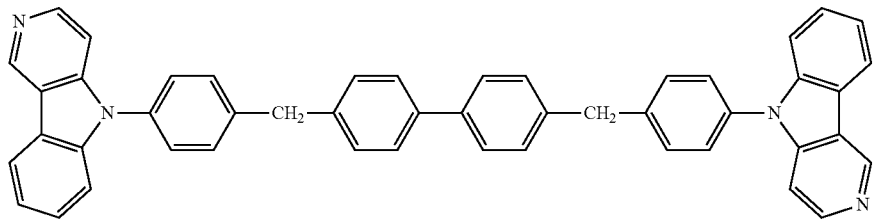
123
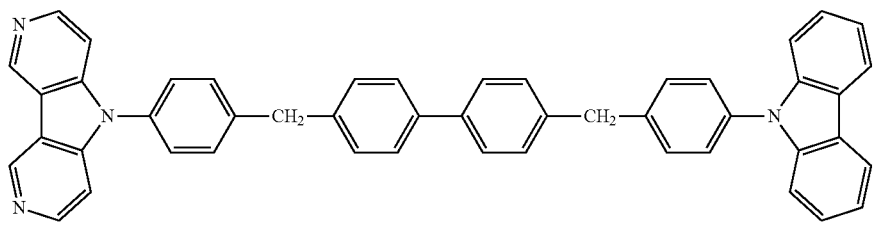
124
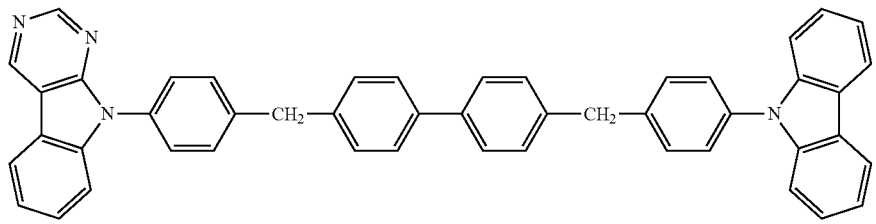
125
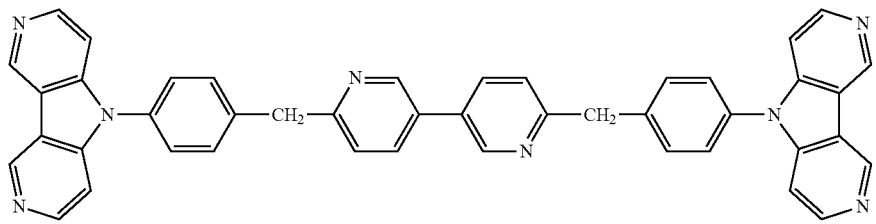
126
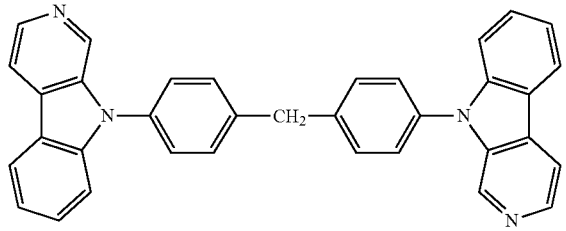
127
[Compound 58]
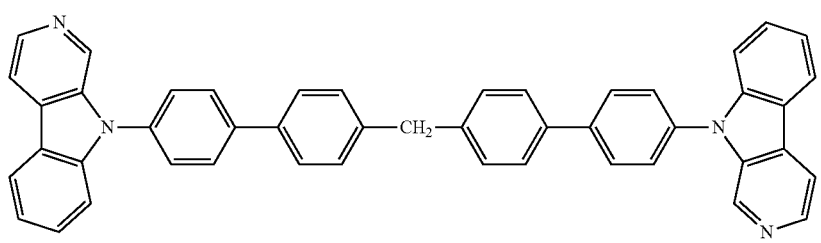
128

129
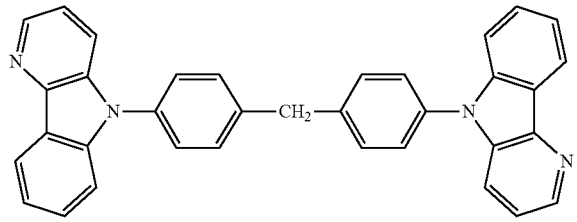
130
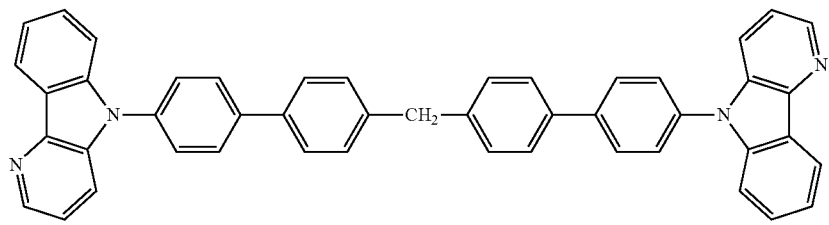
131
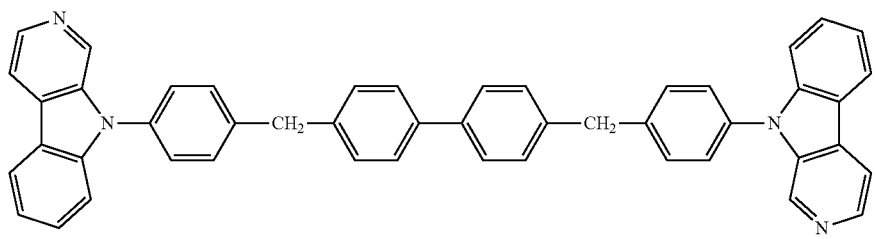
132
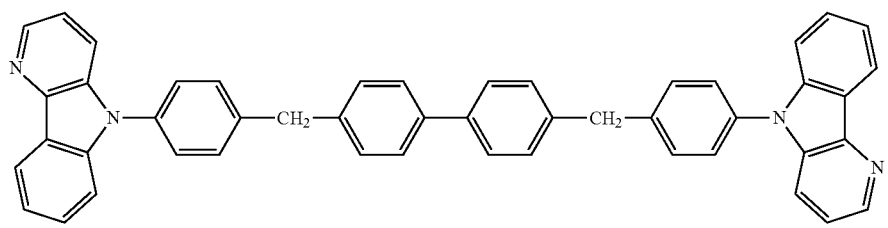
133
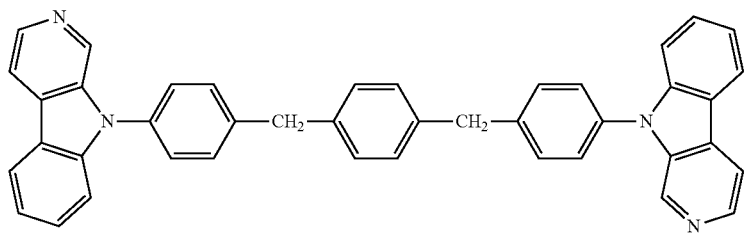
134
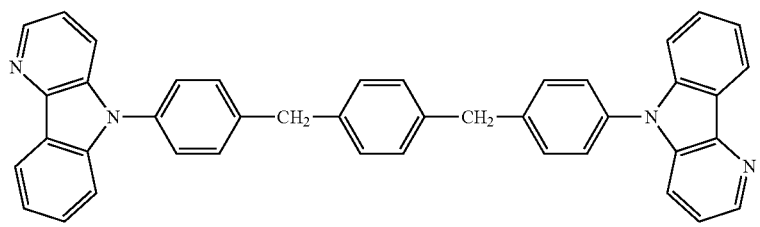

[Compound 59]
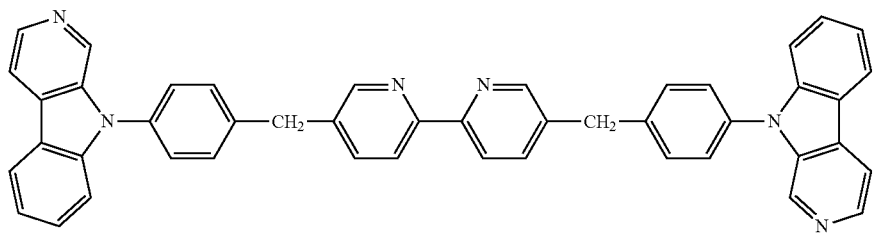
135
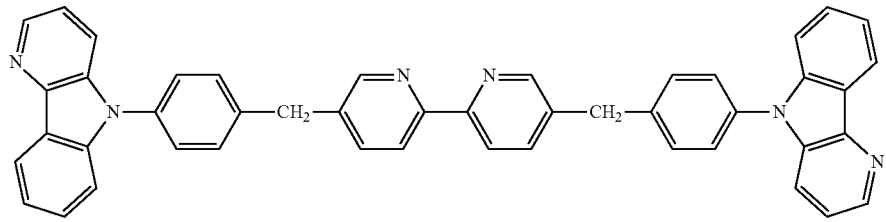
136
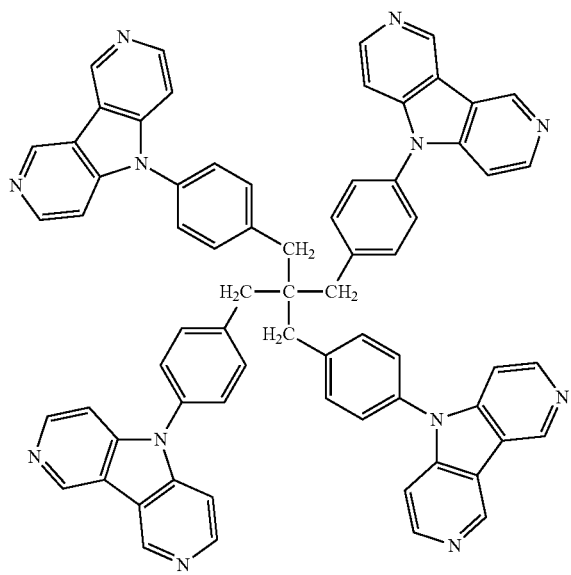
137
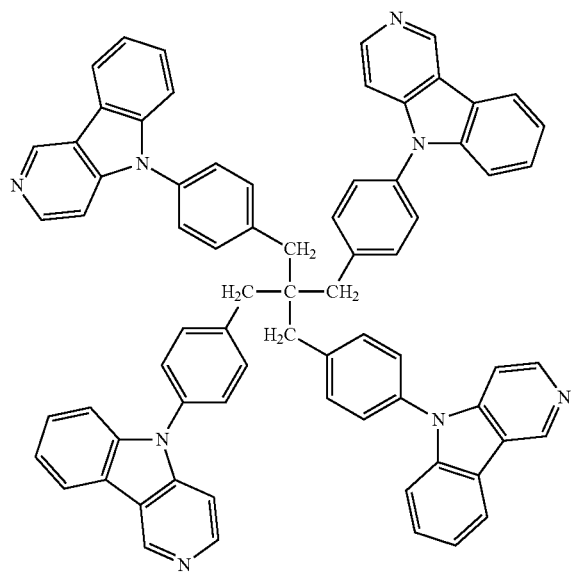
138
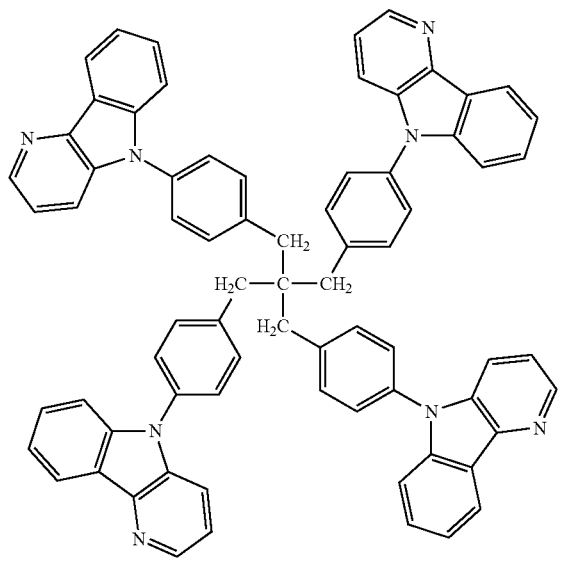
139

[Compound 60]
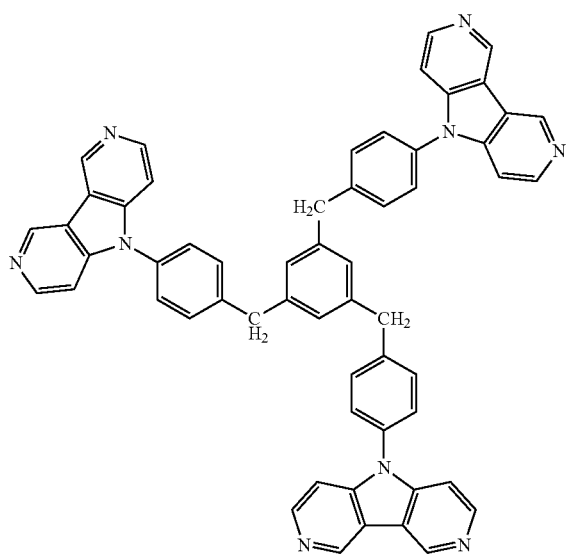
140
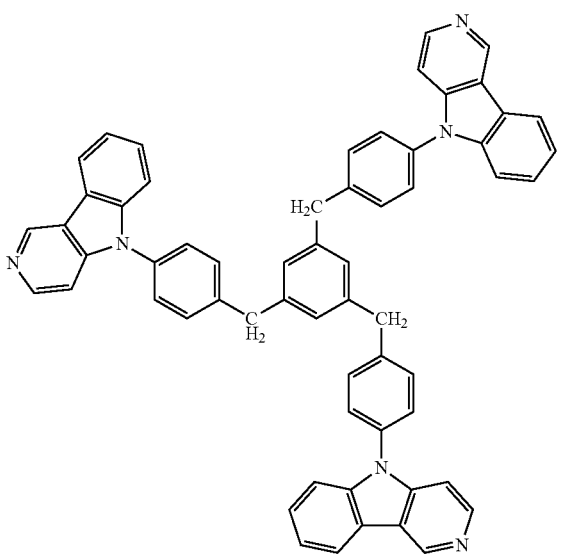
141
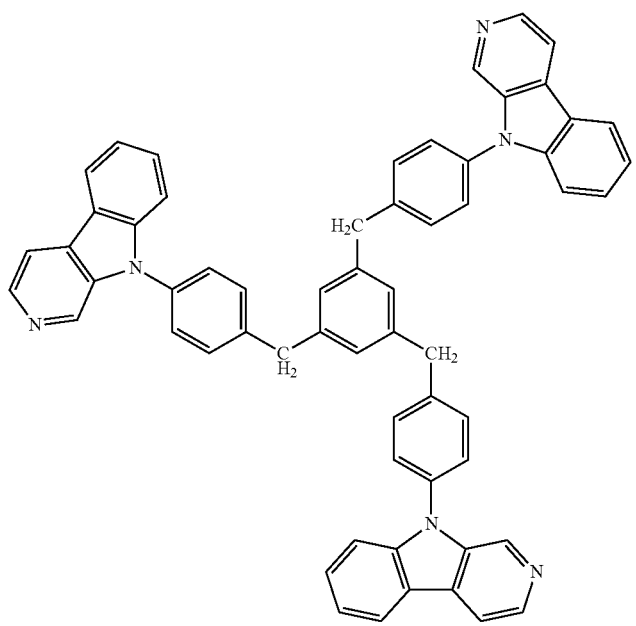
142
[Compound 61]
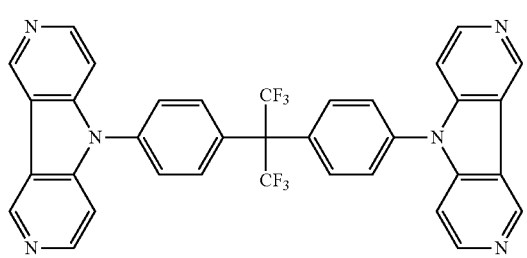
143

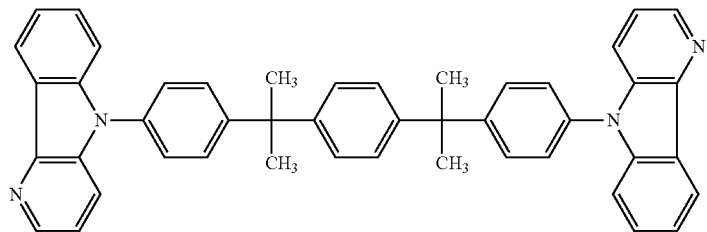
144
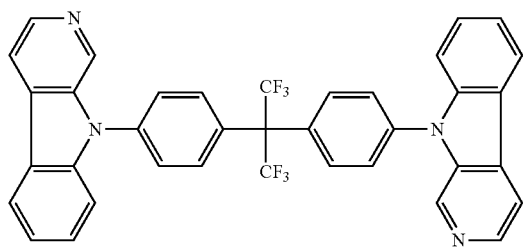
145
[Compound 62]
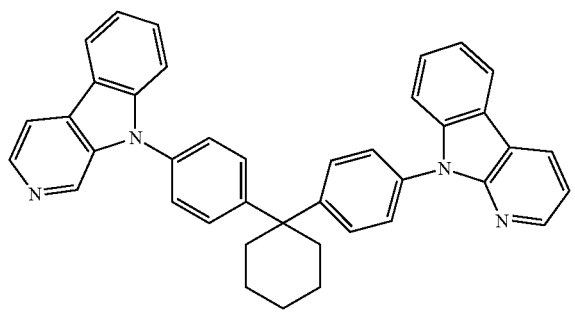
146
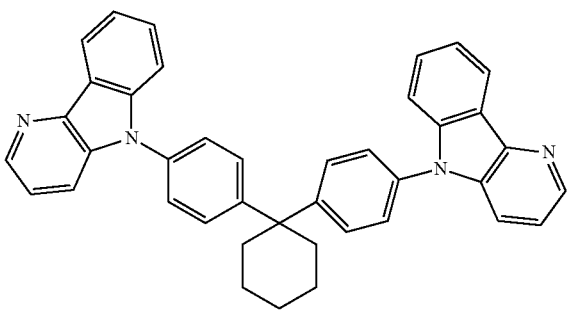
147 148
149
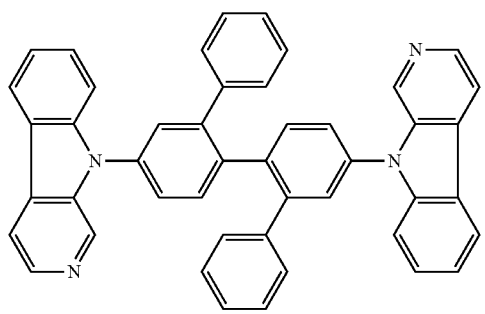
[Compound 63]
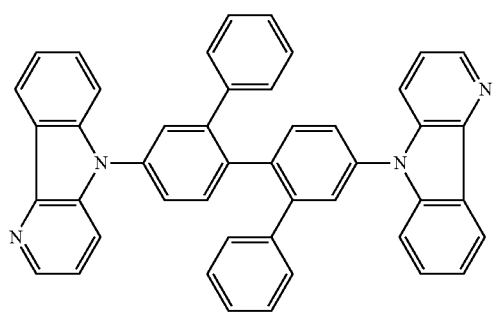
150
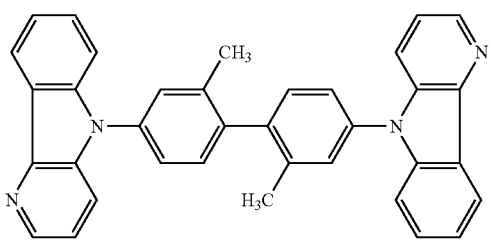
151

-continued
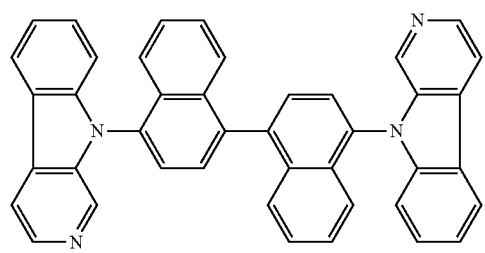
152
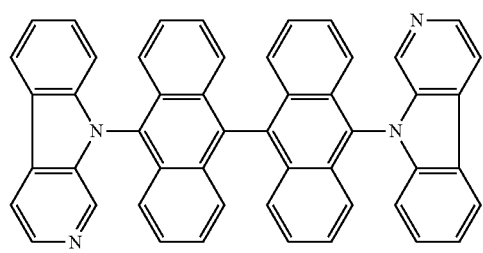
153
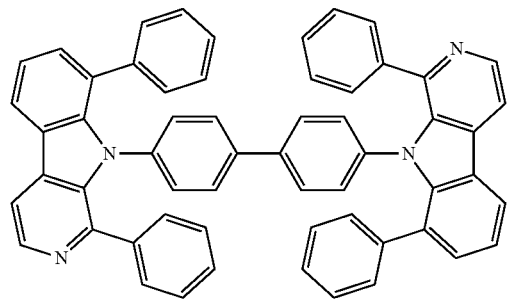
154
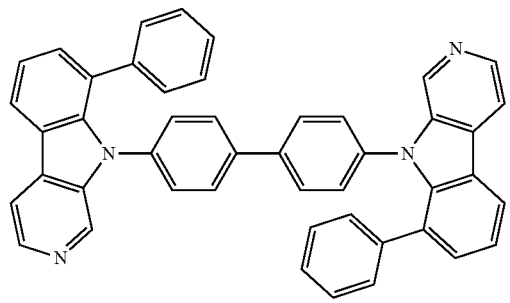
155
[Compound 64]
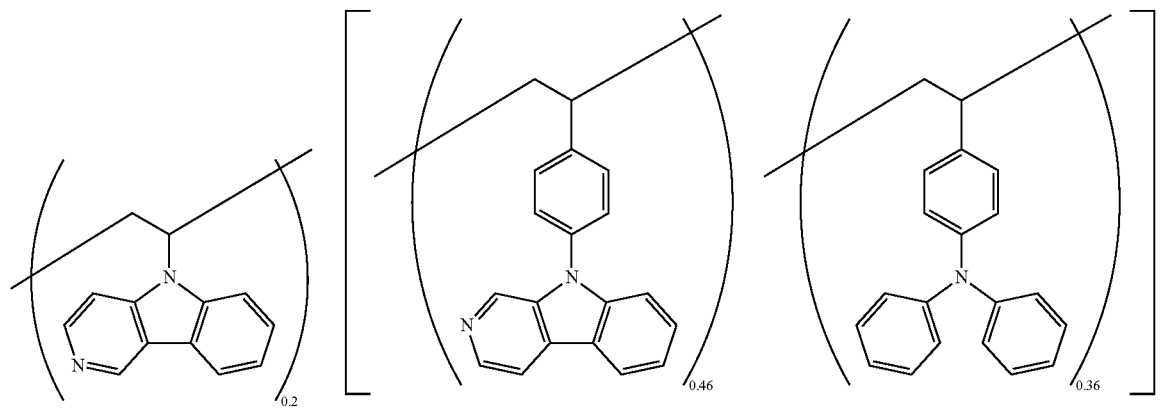
156
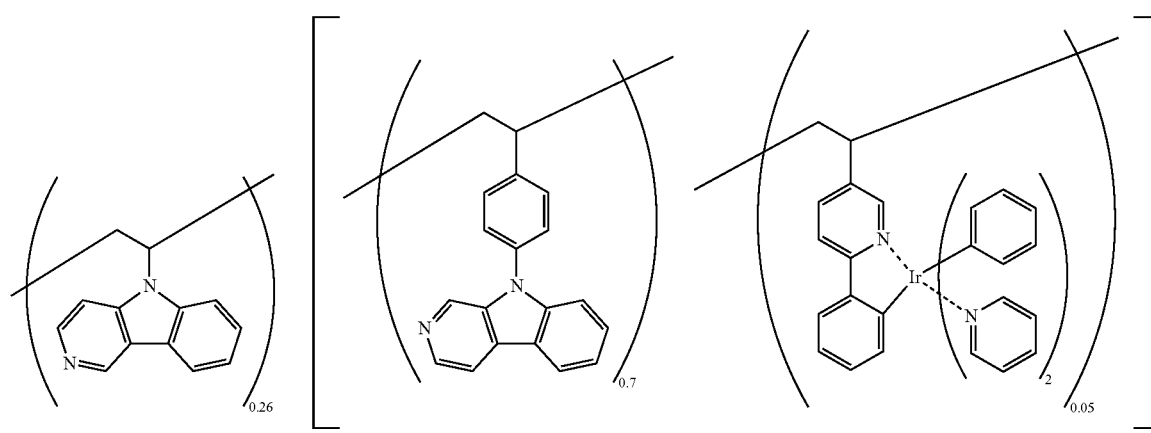
157

[Compound 65]
158
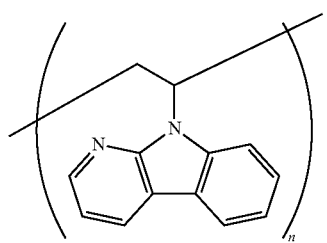
159
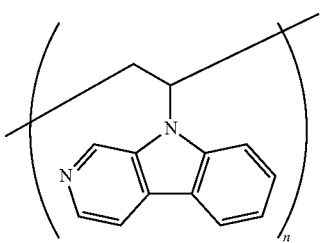
160
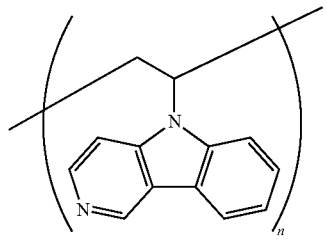
161
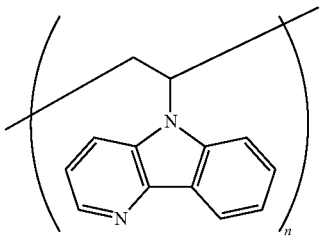
162
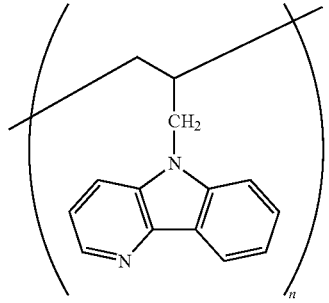
163
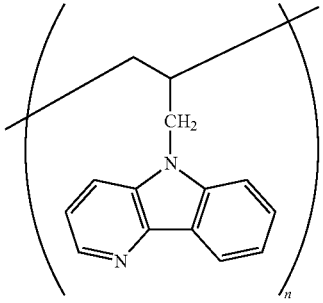
164
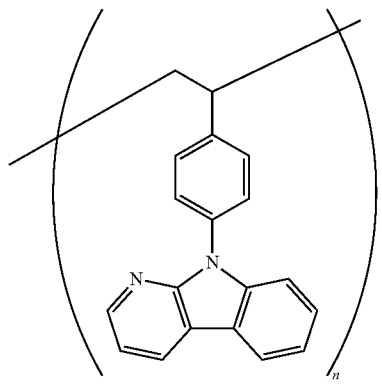
165
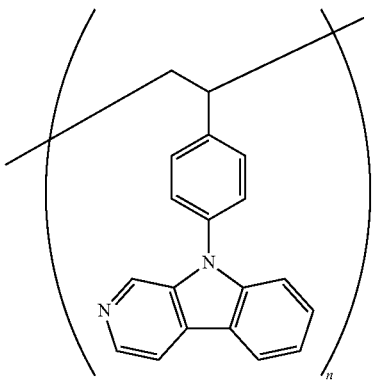
[Compound 66]
166
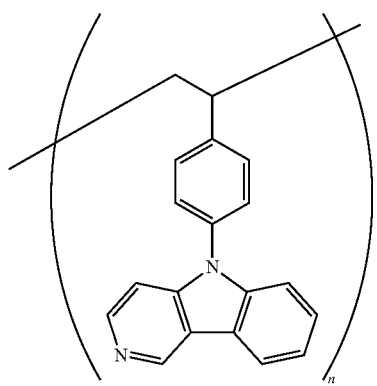
167
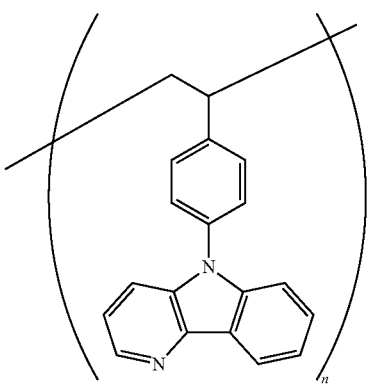

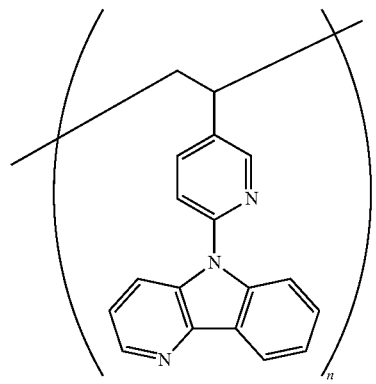
168
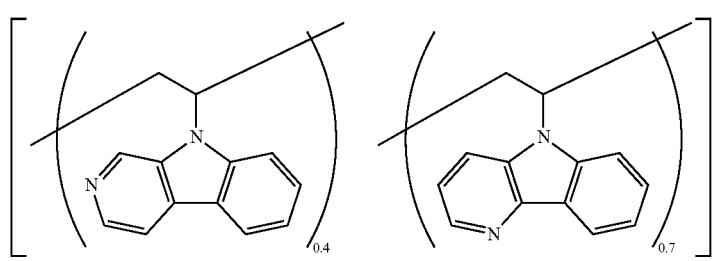
169
[Compound 67]
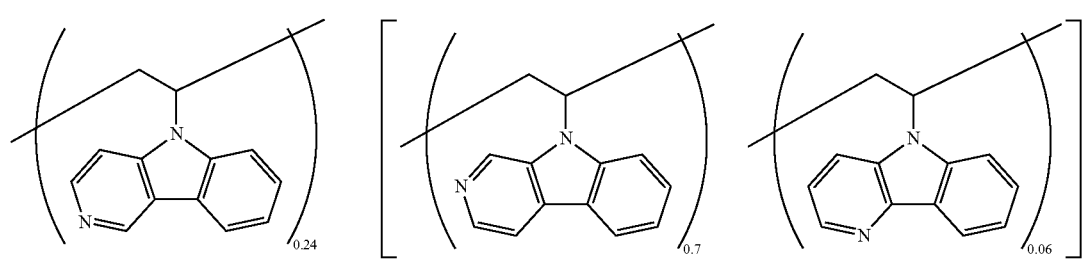
170
[Compound 68]
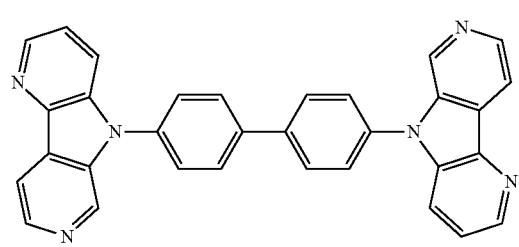
171
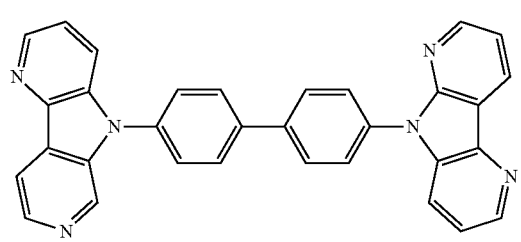
172
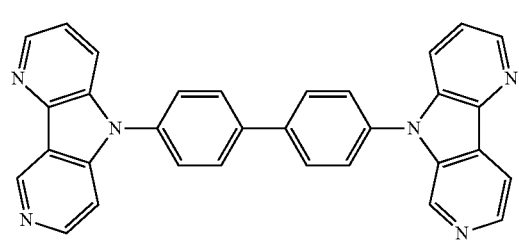
173
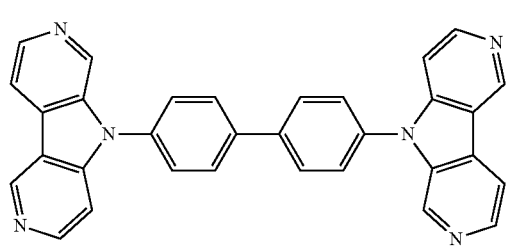
174

-continued
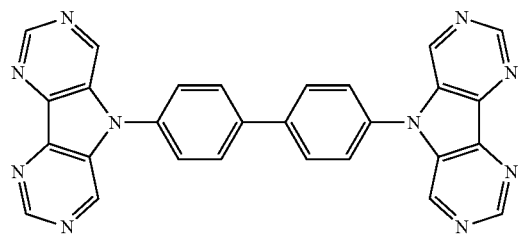
175
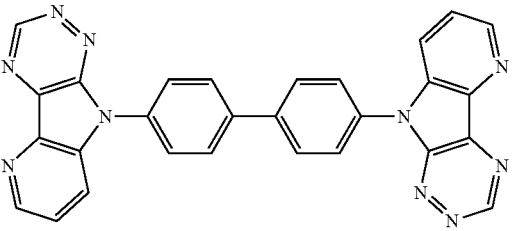
176
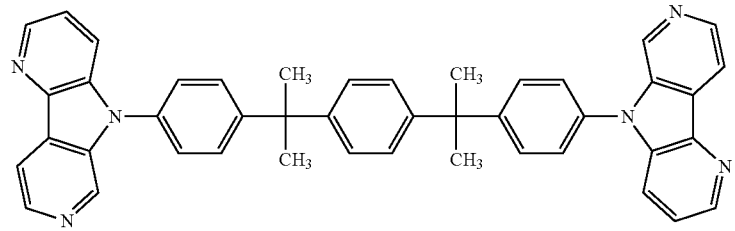
177
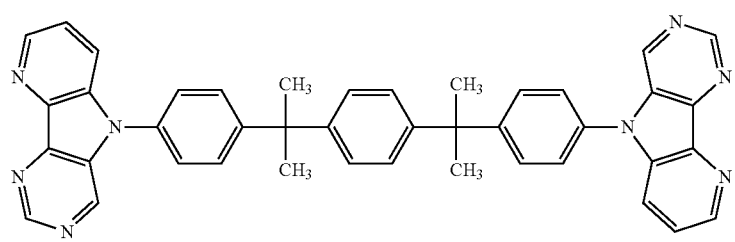
178
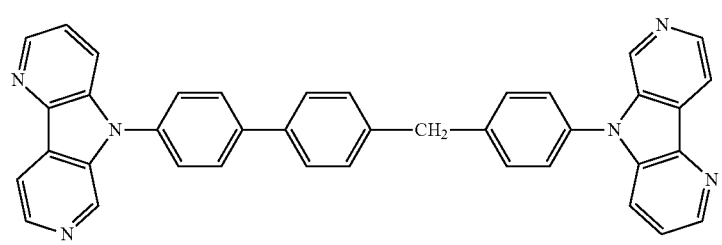
179
[Compound 69]
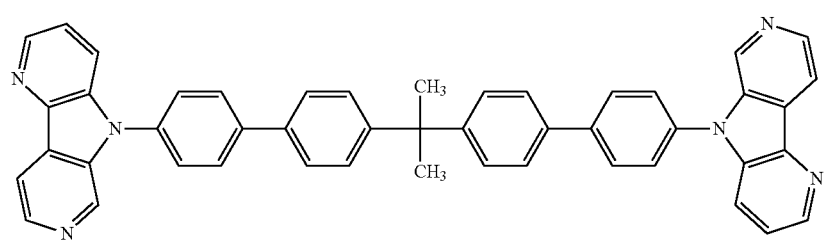
180
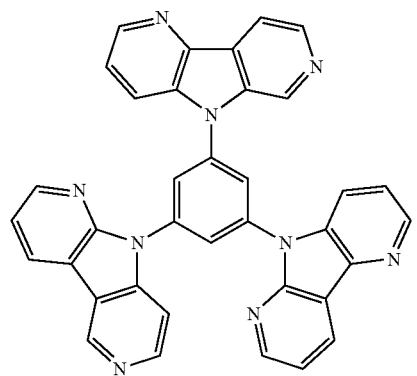
181
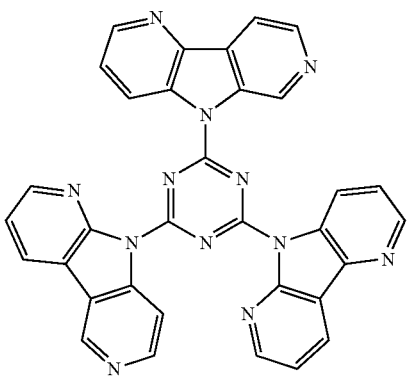
182

183
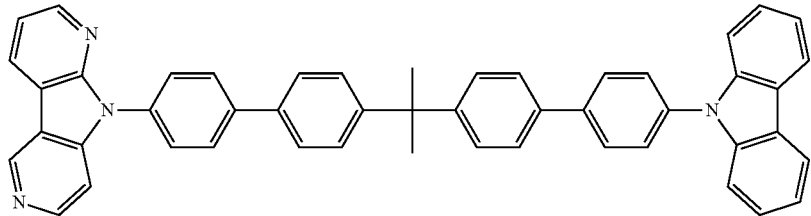
184
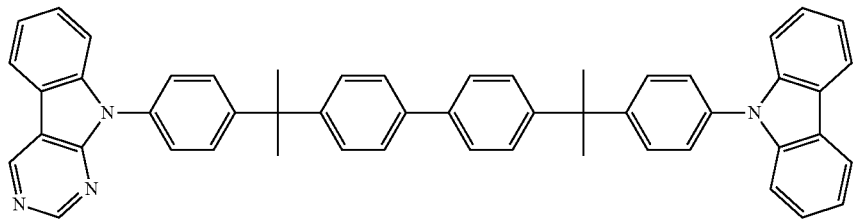
185
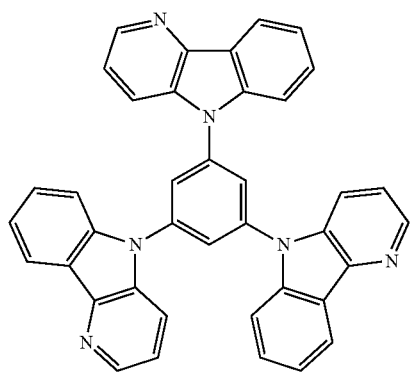
186
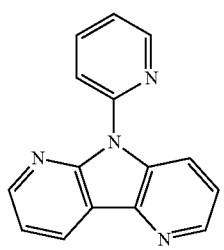
187
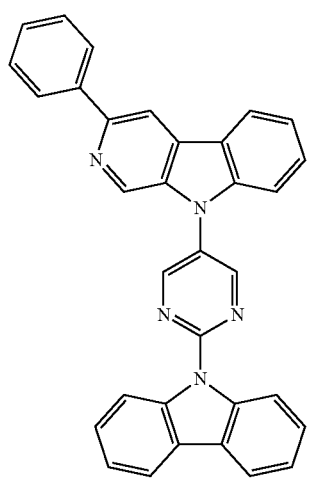
188
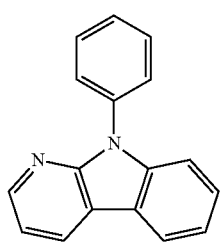
[Compound 70]
189
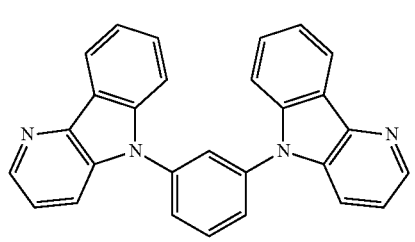
190
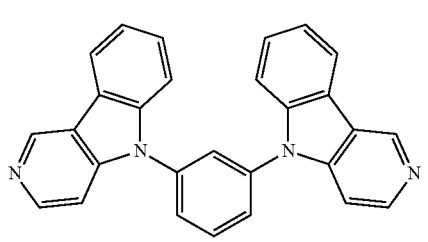

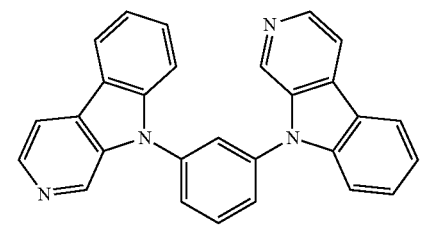

191

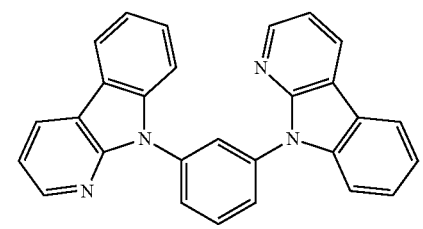

192

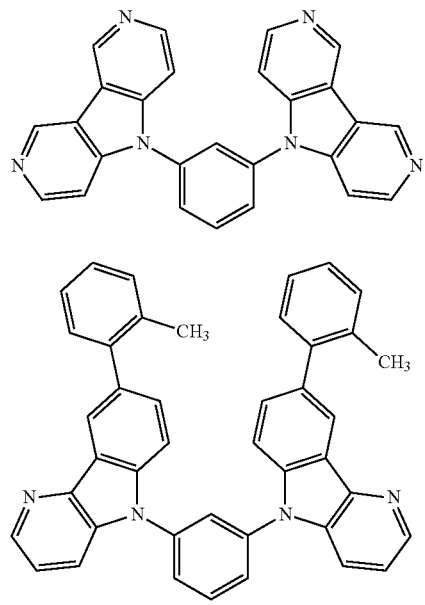

193

194

These azacarbazole rings and their analogs of the organic EL element material can be synthesized by a synthesis method described in J. Chem. Soc., Perkin Trans. 1, 1505-1510 (1999), Pol. J. Chem., 54, 1585 (1980), (Tetrahedron Lett. 41 (2000), 481-484).

The synthesized azacarbazole rings, the analogs thereof, aromatic hydrocarbon rings, aromatic heterocyclic rings, aromatic rings, heterocyclic rings, alkyl groups, and the like are introduced into cores and linking groups by using a publicly-known method such as Ullman coupling, coupling using Pd catalyst, or Suzuki coupling.

The preferable compounds represented by General formula (A) according to the present invention have a molecular weight of not less than 400.

(4) Light Emitting Layer 5

The light emitting layer constituting the organic EL element of the present invention is a layer in which electrons and holes, that are injected from the electrodes or the electron and hole transport layers, are recombined to emit light. The part emitting light may be either inside the light emitting layer or on the interface between the light emitting layer and the layer adjacent thereto.

The light emitting layer according to the present invention is not limited in terms of the structure thereof as long as the contained light emission materials satisfy the aforementioned requirements.

Moreover, some of the light emitting layers may have a same light emission spectrum or a same light emission maximum wavelength. Preferably, non-light emitting intermediate layers are provided between adjacent light emitting layers.

The sum of the thicknesses of the light emitting layers in the present invention is preferably in a range of 1 to 100 nm and more preferably not more than 50 nm to implement lower driving voltage. When the non-light emitting intermediate layers are provided between the light emitting layers, the sum of the thicknesses of the light emitting layers in the present invention refers to a thickness including the thicknesses of the intermediate layers.

The thickness of each light emitting layer is preferably adjusted in a range of 1 to 50 nm. The thickness relationship among the blue, green, and red light emitting layers is not particularly limited.

The light emitting layers can be formed by film formation of the later-described light emission materials and host compound with a publicly-known thinning method such as vacuum deposition, spin coating, casting, the LB method, and the ink-jet method, for example.

In the present invention, plural light emission materials may be mixed in each light emitting layer, and a phosphorescent light-emitting material and a fluorescent light-emitting material may be mixed in a same light emitting layer.

In the present invention, the light emitting layers preferably has such a configuration that contains a host compound and a light emitting material (also called a light emitting dopant compound) to cause the light emitting material to emit light.

(4.1) Host Compound

The host compound contained in the light emitting layers of the organic EL element of the present invention is a compound having a phosphorescence quantum yield of preferably less than 0.1 in phosphorescent light emission at room temperature (25° C.) and more preferably less than 0.01. Furthermore, the volume ratio of the host compound to the compounds contained in each light emitting layer is not less than 50%.

Each light emitting layer may include either a single publicly-known host compound or plural types of host compounds. By using plural types of host compounds, the movement of charges can be controlled, so that the efficiency of the organic EL element can be increased. Moreover, by using plural types of light emitting materials described later, different emitted lights can be mixed to provide an arbitrary emission color.

The host compounds used in the present invention may be conventionally-known low-molecular compounds, high-molecular compounds having repeating units, or low-molecular compounds having polymerizable groups such as a vinyl or epoxy group (evaporation polymerizable emission host).

Compounds preferred as the publicly-known host compounds have hole and electron transporting capabilities, prevent an increase in wavelength of light emission, and have a high Tg (glass-transition temperature). Herein, the glass-transition temperature (Tg) is a value calculated using DSC (differential scanning colorimetry) with a method compliant with JIS-K-7121.

Specific examples of the publicly-known host compounds are compounds described in the following documents, for example: Japanese Patent Laid-open Publications Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, 2002-308837, and the like.

Preferably, the host compounds used in the present invention are carbazole derivatives.

The host compounds are preferably compounds represented by GENERAL FORMULA (2).

[Compound 71]

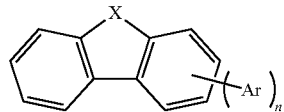

GENERAL FORMULA (2)

In the formula, X represents NR', O, S, CR', R'', or SiR'R''. R' and R'' each represent a hydrogen atom or a substituent. Ar represents an aromatic ring. n represents an integer of 0 to 8.

As for X in General formula (2), each substituent represented by R' or R'' is: an alkyl group (for example, a methyl group, ethyl group, propyl group, isopropyl group, t-butyl group, pentyl group, hexyl group, octyl group, dodecyl group, tridecyl group, tetradecyl group, pentadecyl group, or the like); a cycloalkyl group (for example, a cyclopentyl group, cyclohexyl group, or the like); an alkenyl group (for example, a vinyl group, aryl group, or the like); an alkynyl (for example, an ethinyl group, propargyl group, or the like); an aromatic hydrocarbon ring group (also called an aromatic carbon ring group, aryl group, or the like. For example, a phenyl group, p-chlorophenyl group, mesityl group, tolyl group, xylyl group, naphthyl group, anthryl group, azulenyl group, acenaphthenyl group, fluorenyl group, phenanthryl group, indenyl group, pirenyl group, biphenyl group, or the like); an aromatic heterocyclic group (for example, a pyridyl group, pyrimidinyl group, furyl group, pyrrolyl group, imidazolyl group, benzoimidazolyl group, pyrazolyl group, pyradinyl group, triazolyl group (for example, a 1,2,4-triazole-1-yl, 1,2,3-triazole-1-yl group, or the like), oxazolyl group, benzoxazolyl group, thiazolyl group, isoxazolyl group, isothiazolyl group, furazanyl group, thienyl group, quinolyl group, benzofuryl group, dibenzofuryl group, benzothienyl group, dibenzothienyl group, indolyl group, carbazolyl group, carbolinyl group, diazacarbazolyl group (the carbolinyl group in which one of carbon atoms constituting a carboline ring is substituted with a nitrogen atom), quinoxalinyl group, pyridazinyl group, triazinyl group, quinazolinyl group, phthalazinyl group, or the like); a heterocyclic group (for example, a pyrrolidyl group, imidazolidyl group, morpholyl group, oxazolidyl group, or the like); an alkoxy group (for example, a methoxy group, ethoxy group, propyloxy group, pentyloxy group, hexyloxy group, octyloxy group, dodecyloxy group, or the like); a cycloalkoxy group (for example, a cyclopentyloxy group, cyclohexyloxy group, or the like); an aryloxy group (for example, a phenoxy group, naphthyloxy group, or the like); an alkylthio group (for example, a methylthio group, ethylthio group, propylthio group, pentylthio group, hexylthio group, octylthio group, dodecylthio group, or the like); a cycloalkylthio group (for example, a cyclopentylthio group, cyclohexylthio group, or the like); an arylthio group (for example, a phenylthio group, a naphthylthio group, or the like); an alkoxycarbonyl group (for example, a methyloxycarbonyl group, ethyloxycarbonyl group, butyloxycarbonyl group, octyloxycarbonyl group, dodecyloxycarbonyl group, or the like); an aryloxycarbonyl group (for example, a phenyloxycarbonyl group, naphthyloxycarbonyl group, or the like); a sulfamoyl group (for example, an aminosulfonyl group, methylaminosulfonyl group, dimethylaminosulfonyl group, butylaminosulfonyl group, hexylaminosulfonyl group, cyclohexylaminosulfonyl group, octylaminosulfonyl group, dodecylaminosulfonyl group, phenylaminosulfonyl group, naphthylaminosulfonyl group, 2-pyridylaminosulfonyl group, or the like); an acyl group (for example, an acetyl group, ethylcarbonyl group, propylcarbonyl group, pentylcarbonyl group, cyclohexylcarbonyl group, octylcarbonyl group, 2-ethylhexylcarbonyl group, dodecylcarbonyl group, phenylcarbonyl group, naphthylcarbonyl group, pyridylcarbonyl group, or the like); an acyloxy group (for example, an acetyloxy group, ethylcarbonyloxy group, butylcarbonyloxy group, octylcarbonyloxy group, dodecylcarbonyloxy group, phenylcarbonyloxy group, or the like); an amide group (for example, a methylcarbonylamino group, ethylcarbonylamino group, dimethylcarbonylamino group, propylcarbonylamino group, pentylcarbonylamino group, cyclohexylcarbonylamino group, 2-ethylhexylcarbonylamino group, octylcarbonylamino group, dodecylcarbonylamino group, phenylcarbonylamino group, naphthylcarbonylamino group, or the like); a carbamoyl group (for example, an aminocarbonyl group, methylaminocarbonyl group, dimethylaminocarbonyl group, propylaminocarbonyl group, pentylaminocarbonyl group, cyclohexylaminocarbonyl group, octylaminocarbonyl group, 2-ethylhexylaminocarbonyl group, dodecylaminocarbonyl group, phenylaminocarbonyl group, naphthylaminocarbonyl group, 2-pyridylaminocarbonyl group, or the like); an ureido group (for example, a methylureido group, ethylureido group, pentylureido group, cyclohexylureido group, octylureido group, dodecylureido group, phenylureido group, naphthylureido group, 2-pyridylaminoureido group, or the like); a sulfinyl group (for example, a methylsulfinyl group, ethylsulfinyl group, butylsulfinyl group, cyclohexylsulfinyl group, 2-ethyhexylsulfinyl group, dodecylsulfinyl group, phenylsulfinyl group, naphthylsulfinyl group, 2-pyridylsulfinyl group, or the like); an alkylsulfonyl group (for example, a methylsulfonyl group, ethylsulfonyl group, butylsulfonyl group, cyclohexylsulfonyl group, 2-ethyhexylsulfonyl group, dodecylsulfonyl group, or the like); an arylsulfonyl or heteroarylsulfonyl group (for example, a phenylsulfonyl group, naphthylsulfonyl group, 2-pyridylsulfonyl group, or the like); an amino group (for example, an amino group, ethylamino group, dimethylamino group, butylamino group, cyclopentylamino group, 2-ethylhexylamino group, dodecylamino group, aniline group, naphthylamino group, 2-pyridylamino group, or the like); a halogen atom (for example, a fluorine atom, chlorine atom, bromine atom, or the like); a fluorohydrocarbon group (for example, a fluoromethyl group, trifluoromethyl group, pentafluoroethyl group, pentafluorophenyl group, or the like); a cyano group; a nitro group; a hydroxyl group; a mercapto group; a silyl group (for example, a trimethylsilyl group, triisopropylsilyl group, triphenylsilyl group, phenydiethylsilyl group, or the like); or the like. These substituents may be further substituted with the aforementioned substituents. Some of these substituents may be bonded to form a ring.

Among the above substituents, preferably, X is NR' or O. R' is particularly preferably an aromatic hydrocarbon group (also called an aromatic carbon ring group, aryl group, or the like. For example, a phenyl group, p-chlorophenyl group, mesityl group, tolyl group, xylyl group, naphthyl group, anthryl group, azulenyl group, acenaphthenyl group, fluorenyl group, phenanthryl group, indenyl group, pirenyl group, or biphenyl group); or an aromatic heterocyclic group (for example, a furyl group, thienyl group, pyridyl group, pyridazinyl group, pyrimidinyl group, pyradinyl group, triazinyl group, imidazolyl group, pyrazolyl group, thiazolyl group, quinazolyl group, phthalazinyl group, or the like).

The aforementioned aromatic hydrocarbon group and aromatic heterocyclic group may each include a substituent represented by R' or R" in X of General formula (2).

The aromatic ring represented by Ar in General formula (2) is an aromatic hydrocarbon ring or aromatic heterocyclic ring. The aromatic ring may be either a monocyclic or condensed ring. Moreover, the aromatic rings each may be unsubstituted or may have substituents represented by R' and R" in X of General formula (2).

The aromatic hydrocarbon ring represented by Ar in General formula (2) is a benzene ring, biphenyl ring, naphthalene ring, azulene ring, anthracene ring, phenanthrene ring, pyrene ring, chrysene ring, naphthacene ring, triphenylene ring, o-terphenyl ring, m-terphenyl ring, p-terphenyl ring, acenaphthene ring, coronene ring, fluorene ring, fluoranthrene ring, naphthacene ring, pentathene ring, perylene ring, pentaphene ring, picene ring, pyrene ring, pyranthrene ring, anthranthrene ring, or the like. Furthermore, these aromatic hydrocarbon rings each may include a substituent represented by R' or R" in X of a partial structure represented by General formula (a).

Examples of the aromatic heterocyclic ring represented by Ar in a partial structure represented by General formula (2) are a furan ring, dibenzofuran ring, thiophen ring, oxazole ring, pyrrole ring, pyridine ring, pyridazine ring, pyrimidine ring, pyrazine ring, triazine ring, benzoimidazole ring, oxadiazole ring, triazole ring, imidazole ring, pyrazole ring, thiazole ring, indole ring, indazole ring, benzoimidazole ring, benzothiazole ring, benzoxazole ring, quinoxaline ring, quinazoline ring, cinnoline ring, quinoline ring, isoquinoline ring, phthalazine ring, naphthyridine ring, carbazole ring, carboline ring, diazacarbazole ring (the carboline ring in which with one of the carbon atoms constituting a hydrocarbon ring is substituted with a nitrogen atom), and the like.

Each of these rings may have a substituent represented by R' or R" in General formula (2).

In the above description, the preferred rings used as the aromatic ring represented by Ar in General formula (2) include a carbazole ring, carboline ring, dibenzofuran ring, and benzene ring. The aromatic ring represented by Ar in General formula (2) is more preferably a carbazole, carboline, or benzene ring, still more preferably, a benzene ring including a substituent, and particularly preferably, a benzene ring including a carbazolyl group.

A preferred aspect of the aromatic ring represented by Ar in General formula (2) is a three or more membered condensed ring. Specifically, such a three or more membered condensed ring is a naphthacene ring, anthracene ring, tetracene ring, pentacene ring, hexacene ring, phenanthrene ring, pyrene ring, benzopyrene ring, benzoazurene ring, chrycene ring, benzochrycene ring, acenaphthene ring, triphenylene ring, coronene ring, benzocoronene ring, hexabenzocoronene ring, fluorene ring, benzofluorene ring, fluoranthene ring, perylene ring, naphthoperylene ring, pyrrole ring, benzoperylene ring, pentaphene ring, picene ring, pyranthrene ring, coronene ring, naphthocoronene ring, ovalene ring, anthranthrene ring, or the like. These rings each may further include any of the aforementioned substituents.

The three or more-membered condensed aromatic heterocyclic ring is specifically an acridine ring, benzoquinoline ring, carbazole ring, carboline ring, phenazine ring, phenanthridine ring, phenanthroline ring, carboline ring, cyclazine ring, quindoline ring, thebenidine ring, quinindoline ring, triphenodithiazine ring, triphenodioxazine ring, phenanthrazine ring, anthrazine ring, perimidine ring, diazacarbazole ring (in which an arbitrary one of the carbon atoms constituting the carboline ring is substituted with a nitrogen atom), phenanthroline ring, dibenzofuran ring, dibenzothiophene ring, naphthofuran ring, naphthothiophene ring, benzodifuran ring, benzodithiophene ring, naphthodifuran ring, naphthodithiophene ring, anthrafuran ring, anthradifuran ring, anthrathiophene ring, anthradithiophene ring, thianthrene ring, phenoxathiin ring, thiophanthrene (naphthothiophene) ring, or the like. These rings each may further include a substituent.

In General formula (2), n represents an integer of 0 to 8 and is preferably 0 to 2. Especially when X is O or S, it is preferable that n is 1 to 2.

In the present invention, a host compound including both dibenzofuran and carbazole rings is particularly preferred.

Specific examples of the host compound represented by General formula (2) are shown below, but the host compound is not limited to these examples.

[Compound 72]

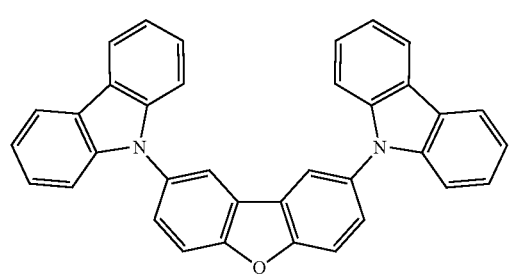

a-1

-continued
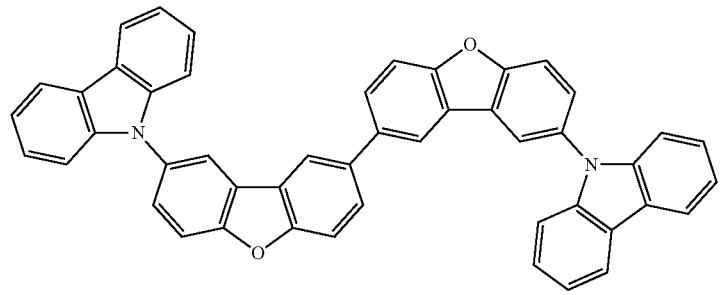
a-2
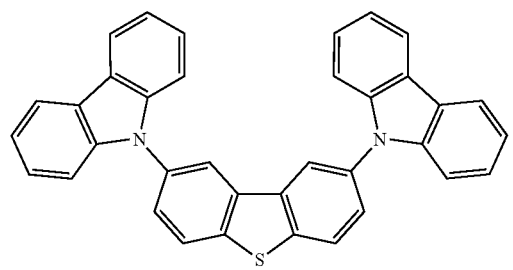
a-3
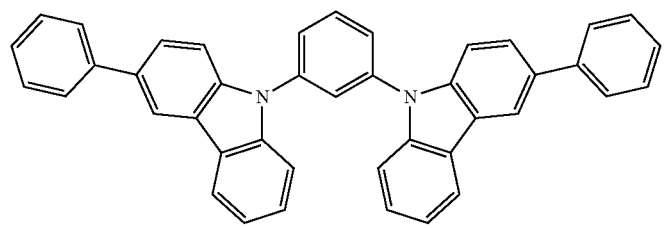
a-4
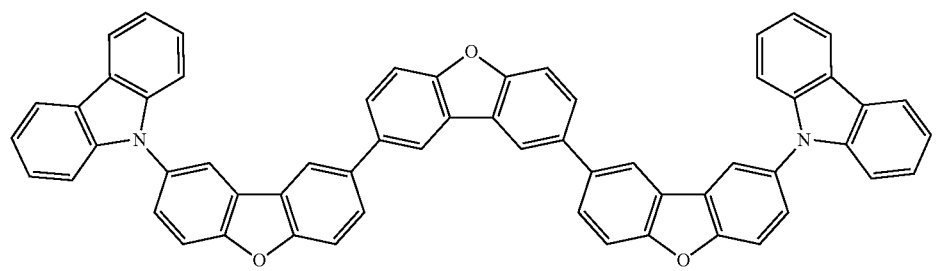
a-5
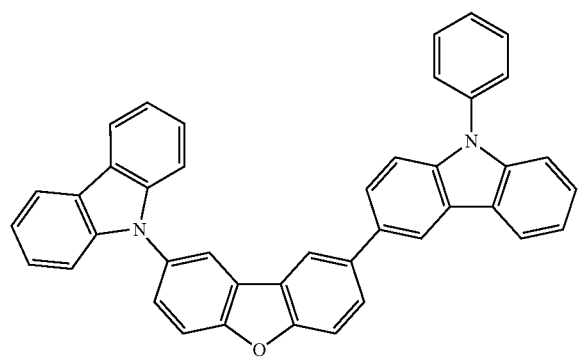
a-6

[Compound 73]
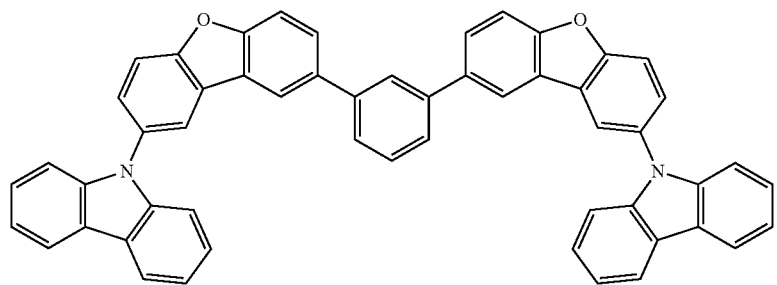
a-7
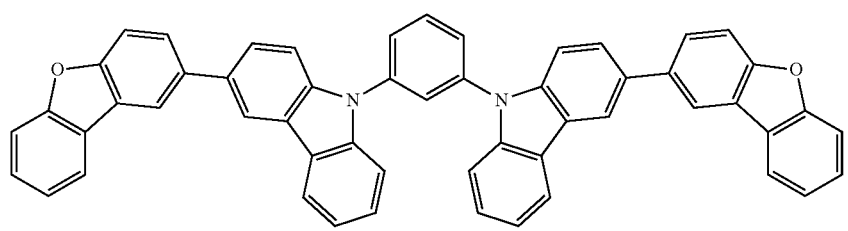
a-8
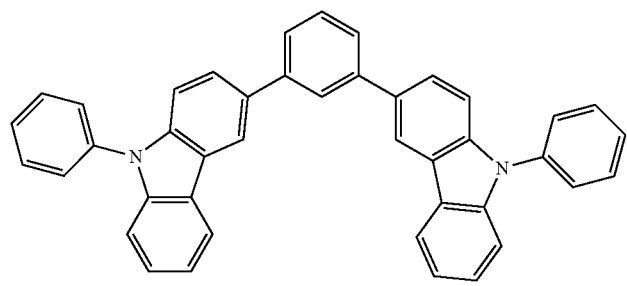
a-9
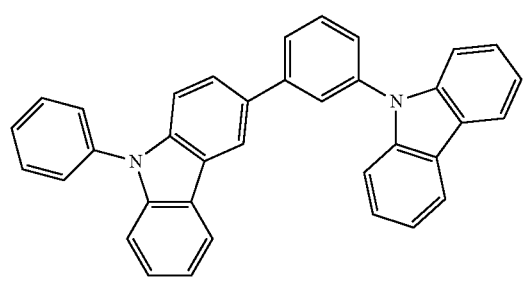
a-10
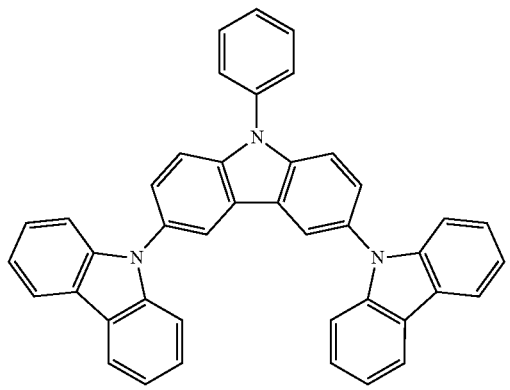
a-11 a-12
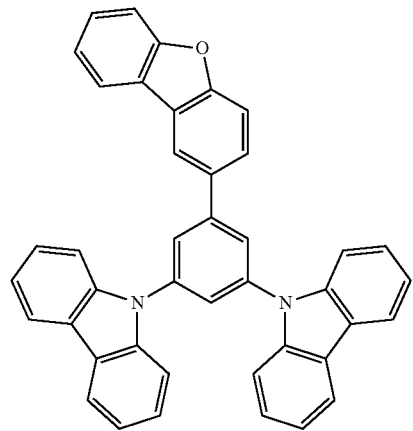
[Compound 74]
a-13
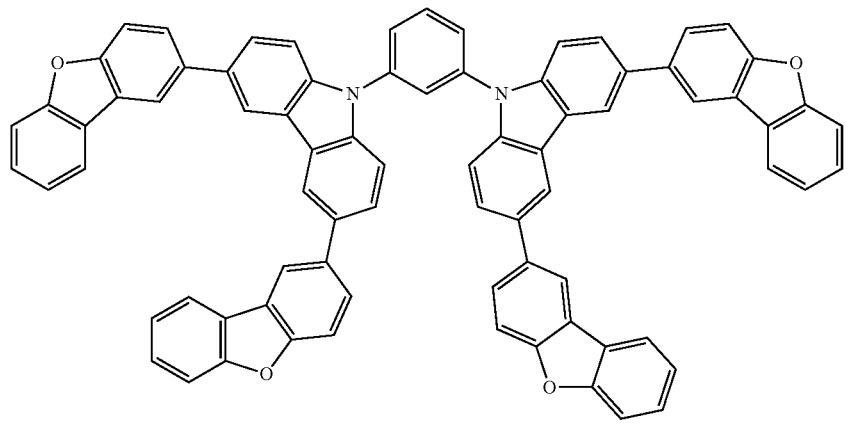
a-14
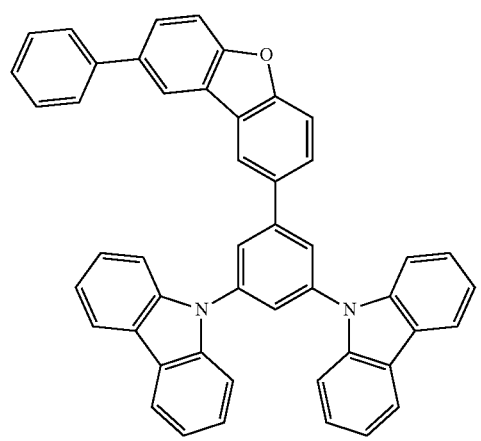
a-15
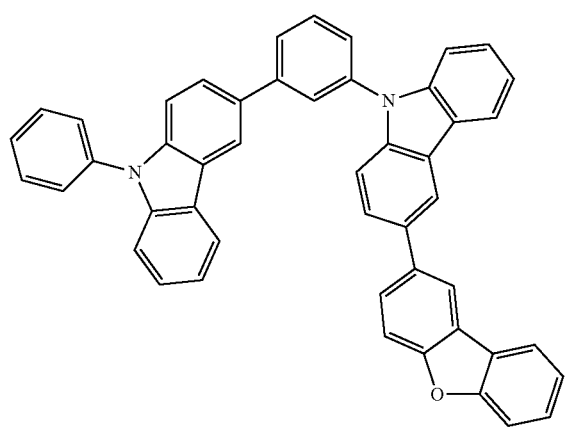

-continued
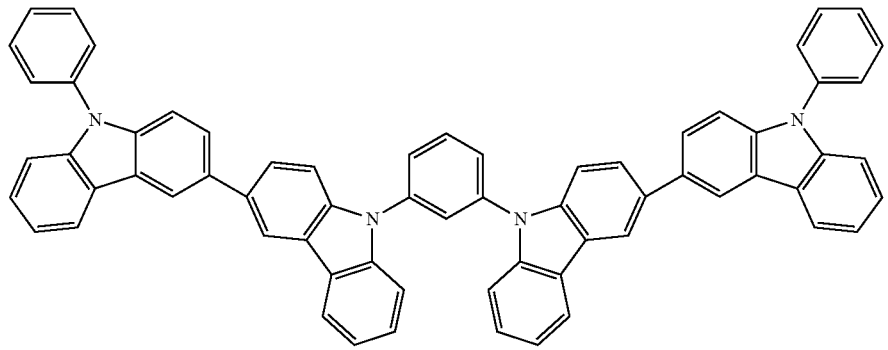
a-16
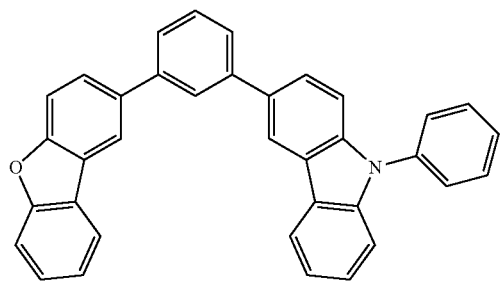
a-17
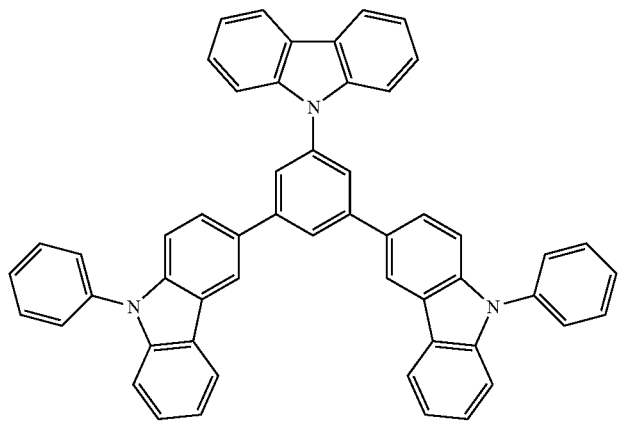
a-18
[Compound 75]
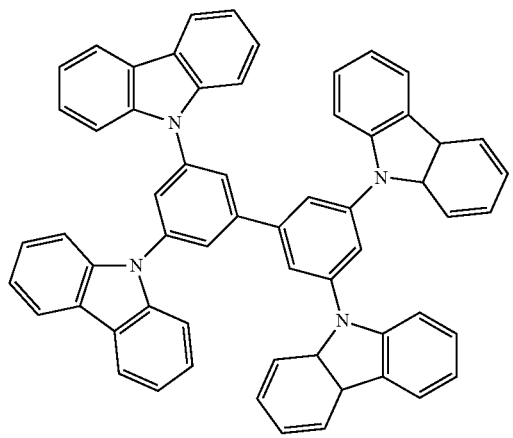
a-19

-continued
a-20
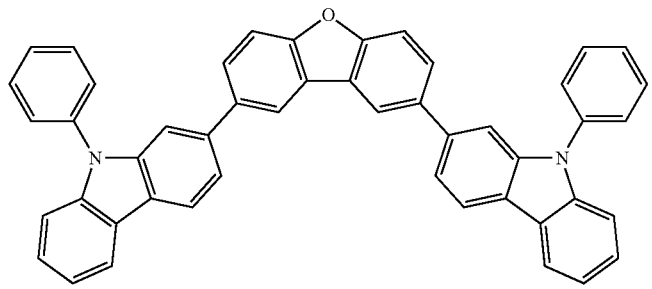
a-21
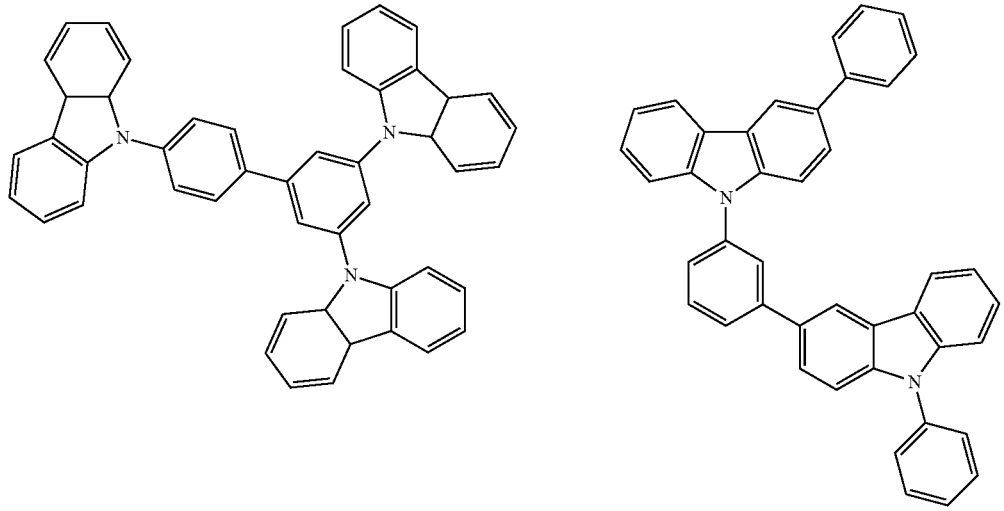
a-22
a-23
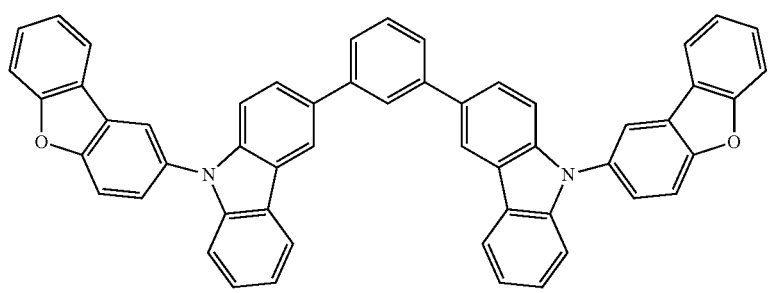
a-24
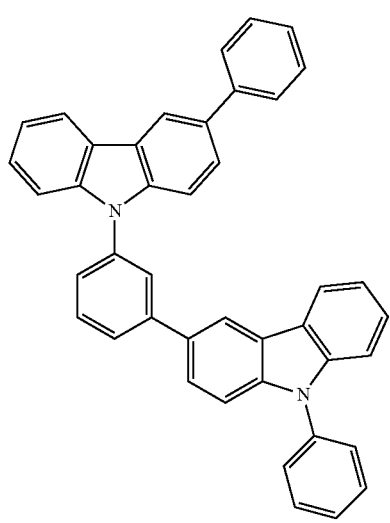

[Compound 76]
a-25
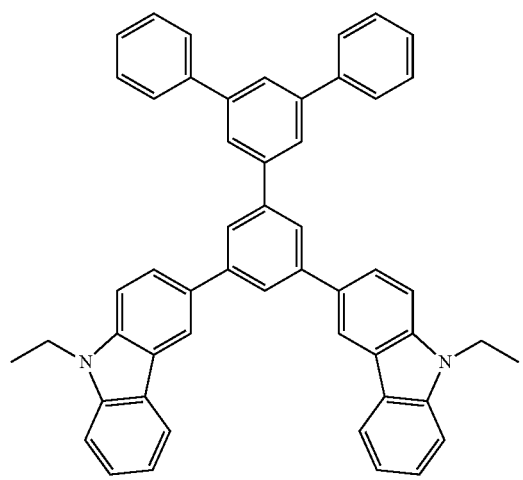
a-26
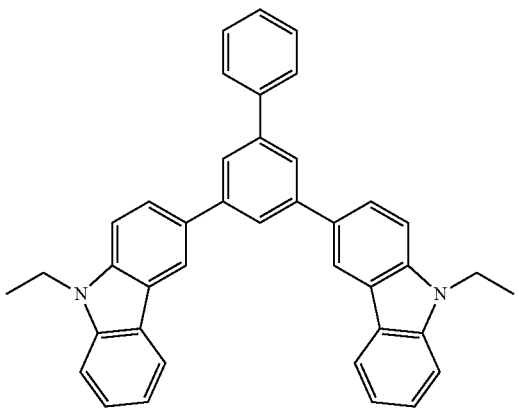
a-27
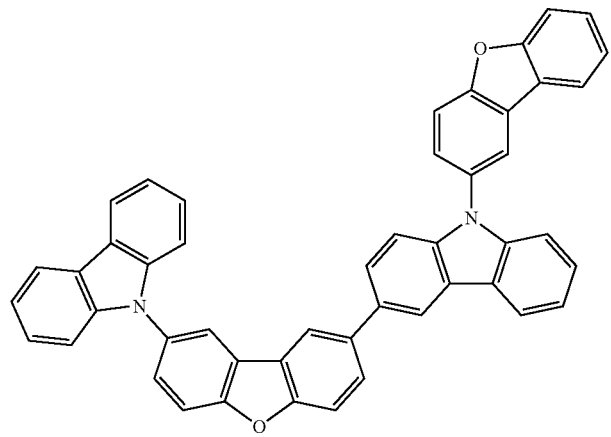
a-28
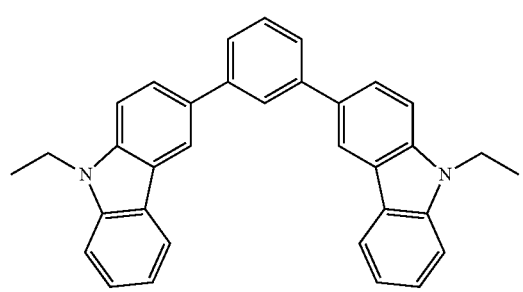
a-29
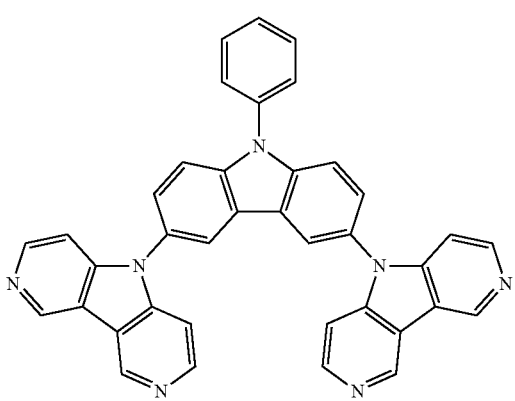

[Compound 77]
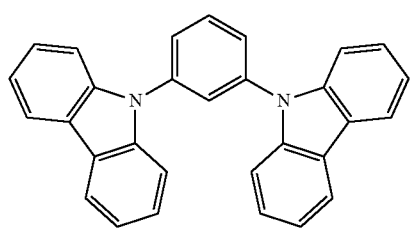
a-30
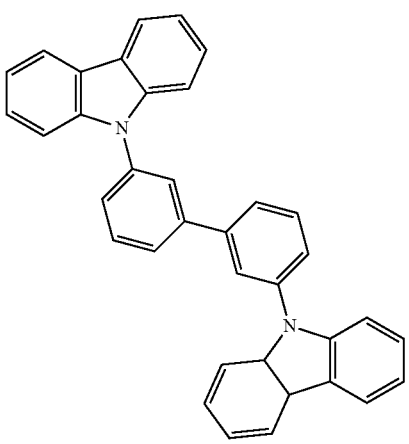
a-31
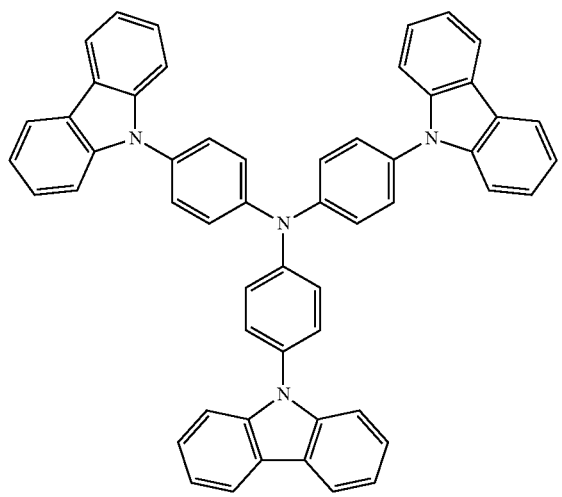
a-32
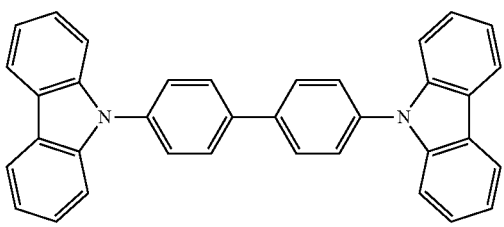
a-33
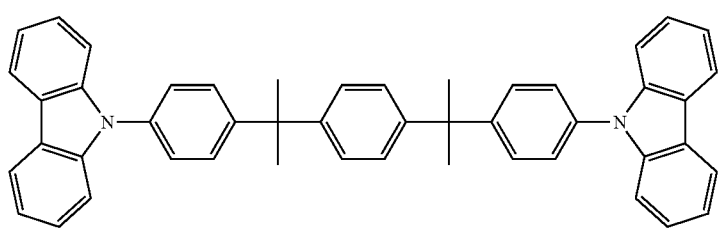
a-34
[Compound 78]
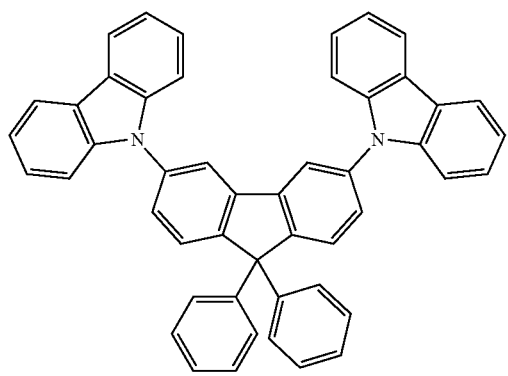
a-35
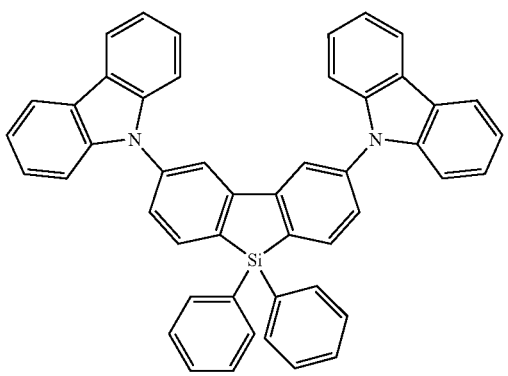
a-36

[Compound 79]
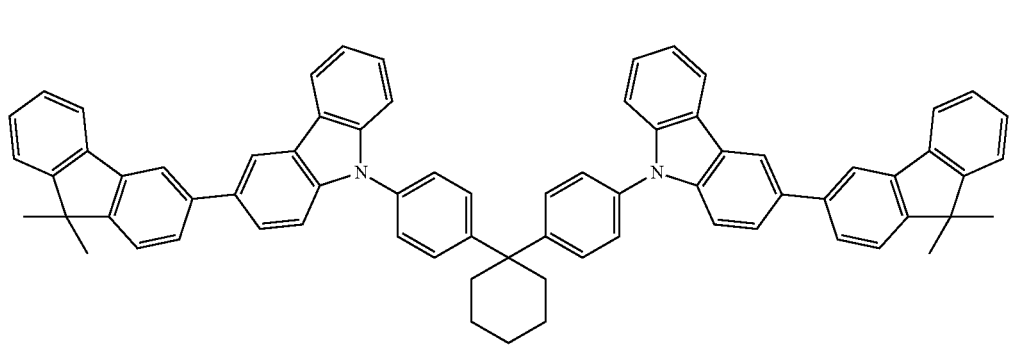
a-37
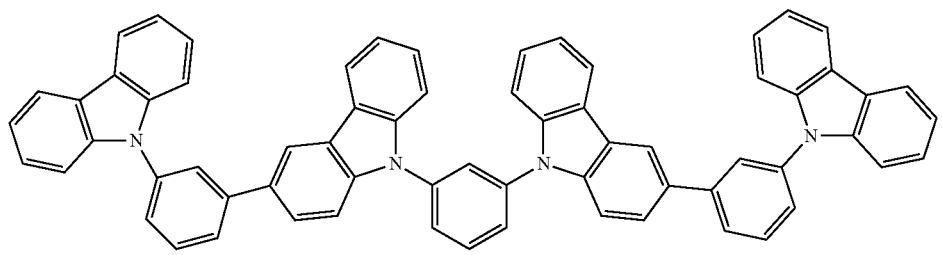
a-38
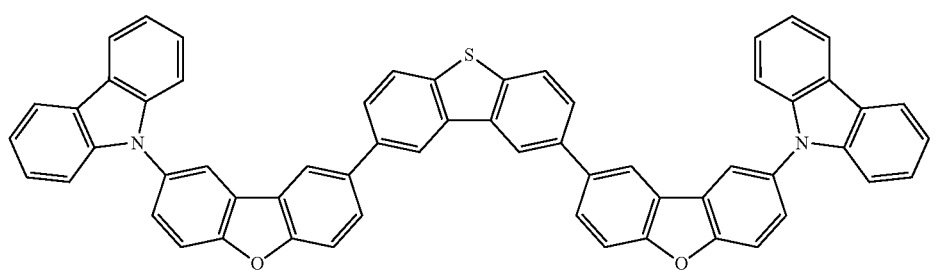
a-39
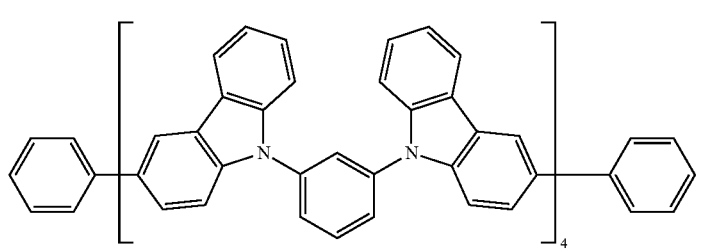
a-40
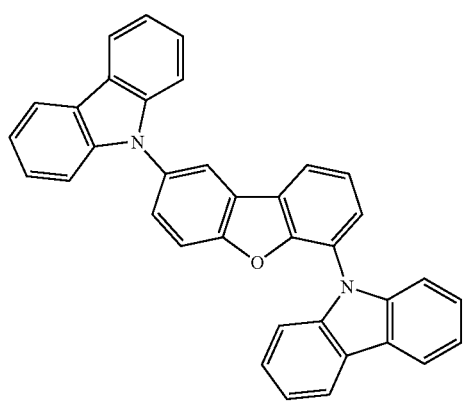
a-41

(4.2) Light-Emitting Material (Emitting Dopant)

As a light-emitting material (emitting dopant) according to the present invention, although it is possible to use a fluorescent compound or a phosphorescent emitting material (also referred to as a phosphorescent compound, a phosphorescent emitting compound, or the like), it is preferable that the material is phosphorescent emitting material.

In the present invention, although the phosphorescent emitting material is a compound from which phosphorescence from excited triplet state can be observed, and specifically a compound which emits phosphorescence in the room temperature (25° C.) and has a phosphorescence quantum yield of 0.01 or more in 25° C., a preferable phosphorescence quantum yield is 0.1 or more.

The phosphorescence quantum yield can be measured by a method described in page 398 of Bunko II, Dai 4-han Jikken Kagaku Kouza 7 (Spectroscopy II of 4$^{th}$ Edition Lecture of Experimental Chemistry 7), (1992-edition, Published by Maruzen CO., Ltd.). The phosphorescence quantum yield in a solution can be measured by use of various types of solvent and in a case where a phosphorescent emitting material is used in the present invention, it is acceptable if the above-mentioned phosphorescence quantum yield (0.01 or more) can be achieved by any of arbitrary solvent.

Two kinds of principles regarding emission of a phosphorescence-emitting dopant are cited. One is an energy transfer-type, wherein carriers recombine on a host compound on which the carriers are transferred to produce an excited state of the host compound, and then via transfer of this energy to a phosphorescence-emitting dopant, emission from the phosphorescence-emitting dopant is realized. The other is a carrier trap-type, wherein a phosphorescence-emitting dopant serves as a carrier trap and then carriers recombine on the phosphorescence-emitting dopant to generate emission from the phosphorescence-emitting dopant. In each case, the excited state energy of the phosphorescence-emitting dopant is required to be lower than that of the host compound.

The phosphorescence emitting materials can be suitably selected from known compounds which are used in a light emitting layer of an organic EL element. The phosphorescence emitting materials according to the present invention are complex based compounds which incorporate preferably metals in Groups 8-10 of the element periodic table, more preferably iridium compounds, osmium compounds, platinum compounds (platinum complex based compounds), and rare earth metal complexes, and of these, most preferred are iridium compounds.

Hereinafter, an explanation will be given of a compound used as the phosphorescence emitting dopant included in the light emitting layer. A compound used as the phosphorescence emitting dopant will be shown by the following general formula (B).

[Compound 80]

GENERAL FORMULA (B)

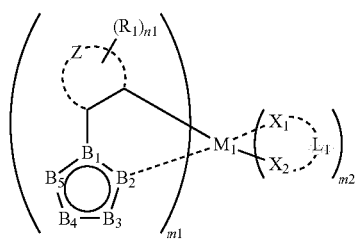

In the general formula (B), $R_1$ represents a substituent. Z represents a non-metal atom group necessary to form a five to seven-membered ring. n1 represents an integer of between 0 and 5. $B_1$ to $B_5$ represent a carbon atom, a nitrogen atom, an oxygen atom, or a sulfur atom, and at least one of them represents a nitrogen atom. $M_1$ represents a metal of Groups 8 to 10 of the element periodic table. $X_1$ and $X_2$ represent a carbon atom, a nitrogen atom, or an oxygen atom, and $L_1$ represents a group of atoms which forms a bidentate ligand together with $X_1$ and $X_2$. m1 represents an integer of any of 1, 2, or 3, and m2 represents an integer of any of 0, 1, or 2. However, m1+m2 equals 2 or 3.

HOMO and LUMO of the phosphorescence compound represented by the general formula (B) according to the present invention are between −5.15 and −3.50 eV and between −1.25 and +1.00 eV, respectively, and preferably, HOMO is between −4.80 and −3.50 eV while LUMO is between −0.800 and +1.00 eV.

In the general formula (B), the substituent represented by $R_1$ of the phosphorescence compound includes: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group and a pentadecyl group); a cycloalkyl group (for example, a cyclopentyl group and a cyclohexyl group); an alkenyl group (for example, a vinyl group and an allyl group); an alkynyl group (for example, an ethynyl group and a propargyl group); an aromatic hydrocarbon ring group (also called an aromatic carbon ring group or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group and a biphenyl group); an aromatic heterocyclic group (for example, a pyridyl group, a pyridazinyl group, a furyl group, a pyrrolyl group, an imidazolyl group, a benzoimidazolyl group, a pyrazolyl group, a pyrazinyl group, a triazolyl group (for example, a 1,2,4-triazole-1-yl group and a 1,2,3-triazole-1-yl group), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (indicating a ring structure formed in such a manner that one of the carbon atoms constituting the carboline ring is replaced with a nitrogen atom), a quinoxalinyl group, a pyridazinyl group, a triazinyl group, a quinazolinyl group, and a phthalazinyl group, a heterocyclic group (for example, a pyrrolidyl group, an imidazolidyl group, a morpholyl group, and an oxazilidyl group); an alkoxyl group (for example, a methoxy group, an ethoxy group, a propyloxy group, a pentyloxy group, an hexyloxy group, an octyloxy group and a dodecyloxy group); a cycloalkoxy group (for example, a cyclopentyloxy group and a cyclohexyloxy group); an aryloxy group (for example, a phenoxy group and a naphthyloxy group); an aryloxy group (for example, a phenoxy group and a naphthyloxy group); an alkylthio group (for example, a methylthio group, an ethylthio group, a propylthio group, a pentylthio group, a hexylthio group, an octylthio group and a dodecylthio group); a cycloalkylthio group (for example, a cyclopentylthio group and a cyclohexylthio group); an arylthio group (for example, a phenylthio group and a naphthylthio group); an alkoxycarbonyl group (for example, a methyloxycarbonyl group, an ethyloxycarbonyl group, a butyloxycarbonyl group, an octyloxycarbonyl group and a dodecyloxycarbonyl group); an aryloxycarbonyl group (for example, a phenyloxycarbonyl group and a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group and a 2-pyridylaminosulfonyl group); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group and a pyridylcarbonyl group); an acyloxy group (for example, an acetyloxy group, an ethylcarbonyloxy group, a butylcarbonyloxy group, an octylcarbonyloxy group, a dodecylcarbonyloxy group and a phenylcarbonyloxy group); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group and a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group and a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group and a 2-pyridylaminoureido group); a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group and a 2-pyridylsulfinyl group); an alkylsulfonyl group (for example, a methylsulfonyl group, an ethylsulfonyl group, a butylsulfonyl group, a cyclohexylsulfonyl group, a 2-ethylhexylsulfonyl group and a dodecylsulfonyl group); an arylsulfonyl group or a heteroarylsulfonyl group (for example, a phenylsulfonyl group, a naphthylsulfonyl group and a 2-pyridylsulfonyl group); an amino group (for example, an amino group, an ethylamino group, a dimethylamino group, a butylamino group, a cyclopentylamino group, 2-ethylhexylamino group, a dodecylamino group, an anilino group, a naphthylamino group, and a 2-pyridylamino group); a cyano group; a nitro group; a hydroxyl group; a mercapto group; and a silyl group (for example, a trimethylsilyl group, a triisopropylsilyl group, a triphenylsilyl group and a phenyldiethylsilyl group). Among these substituents, alkyl group or aryl group is preferable.

Z represents a group of non-metal atoms necessary to form a five to seven-membered ring. The five to seven-membered ring formed by Z includes, for example, a benzene ring, a naphthalene ring, a pyridine ring, a pyrimidine ring, a pyrrole ring, a thiophene ring, a pyrazole ring, an imidazole ring, an oxazole ring, and a thiazole ring. Among these rings, benzene ring is preferable.

$B_1$ to $B_5$ represent a carbon atom, a nitrogen atom, an oxygen atom, or a sulfur atom, and at least one of them represents a nitrogen atom. A monocyclic compound is preferable as an aromatic heterocyclic ring formed by these five atoms includes, for example, a pyrrole ring, a pyrazole ring, an imidazole ring, a triazole ring, a tetrazole ring, an oxazole ring, an isoxazole ring, a triazole ring, an isothiazole ring, and a thiadiazole ring. Among these rings, a pyrazole ring and an imidazole ring are preferable, and an imidazole ring having a nitrogen atom as $B_2$ and $B_5$ is particularly preferable. These rings may further be substituted by the above-mentioned substituent. Alkyl group and aryl group are preferable as the substituent and aryl group is more preferable.

$L_1$ represents a group of atoms which forms a bidentate ligand together with $X_1$ and $X_2$. A specific example of a bidentate ligand represented by $X_1$-$L_1$-$X_2$ includes: substituted or unsubstituted phenylpyridine, phenylpyrazole, phenylimidazole, phenyltriazole, phenyltetrazole, pyrazabole, picolinic acid and acetylacetone. These groups may be further substituted by the above-mentioned substituents.

m1 represents an integer of any of 1, 2, or 3, and m2 represents an integer of any of 0, 1, or 2. Among them it is preferable that m2 is 0. As the metal represented by $M_1$, a transition metal element of Groups 8 to 10 of the element periodic table (also simply referred to as transition metal), and among them, iridium and platinum are preferable and iridium is more preferable.

Hereinafter, specific phosphorescence compound represented by the general formula (B) will be shown in D-1 to D-133. However, the phosphorescence compound is not limited thereto.

[Compound 81]

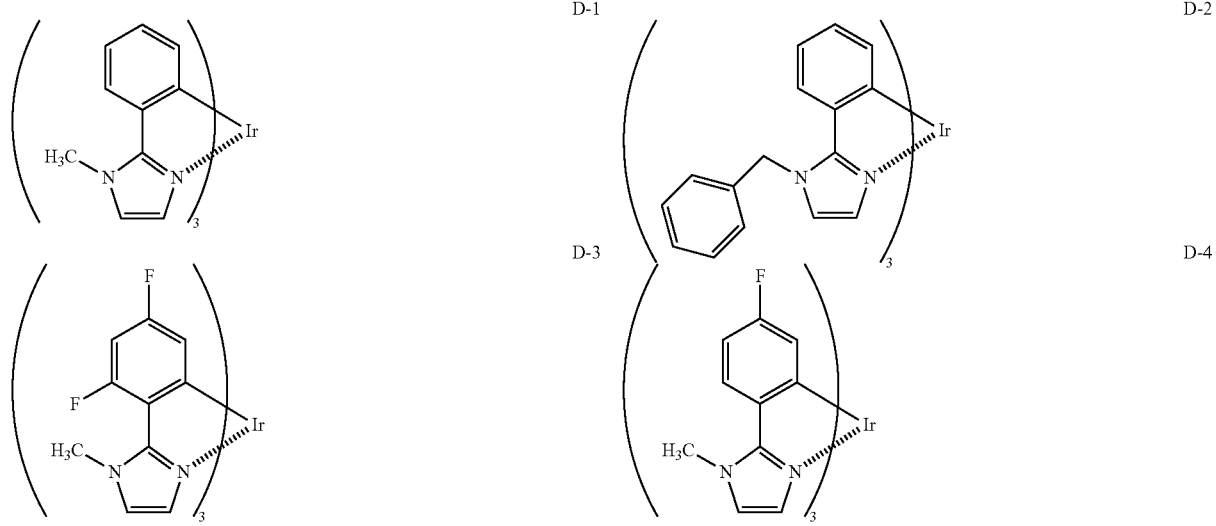

-continued
D-5
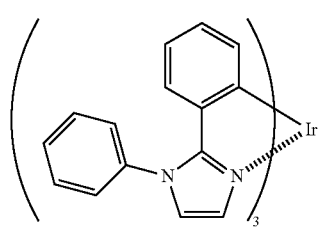
D-6
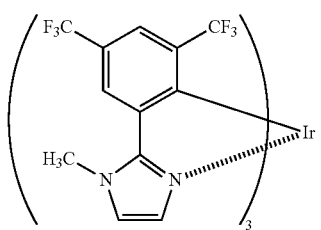
D-7
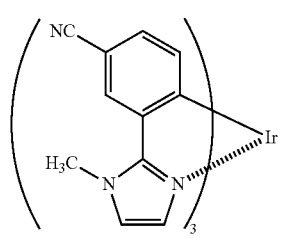
D-8
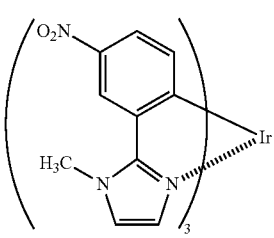
D-9
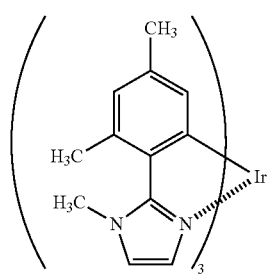
D-10
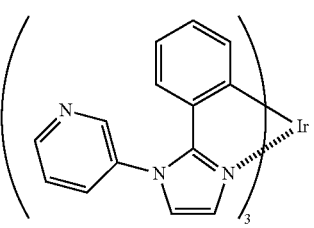
D-11
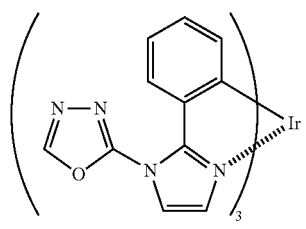
D-12
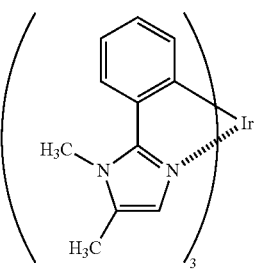
D-13
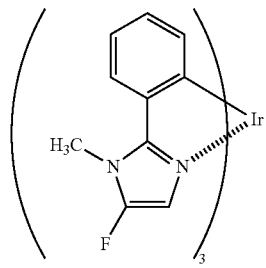
D-14
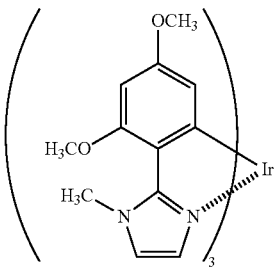
D-15
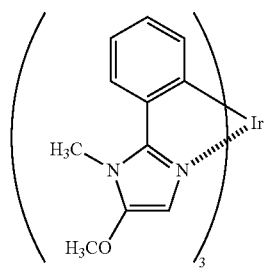

[Compound 82]
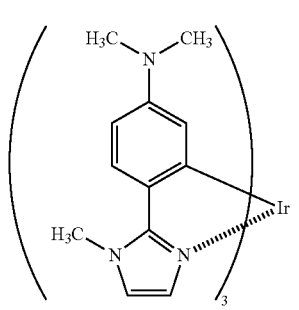
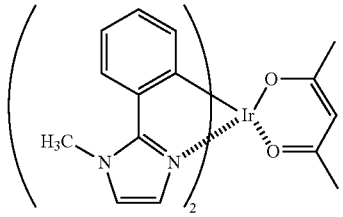
D-16
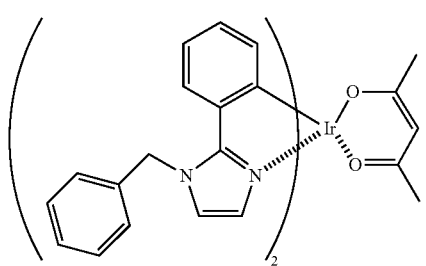
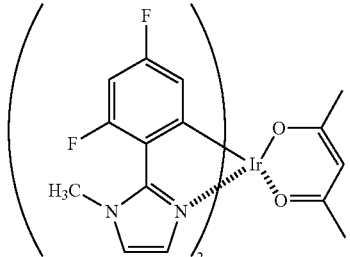
D-17
D-18
D-19
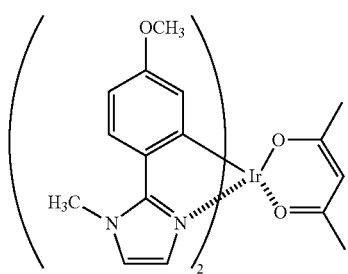
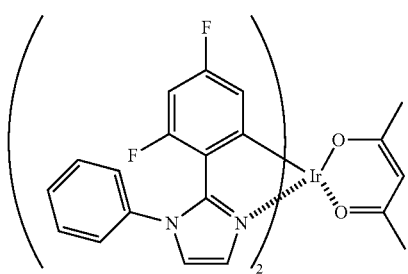
D-20
D-21
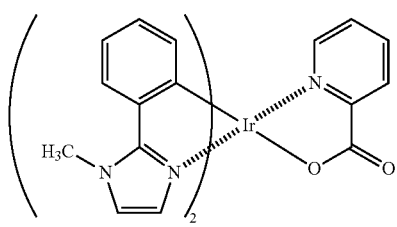
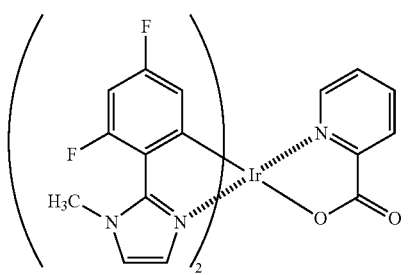
D-22
D-23
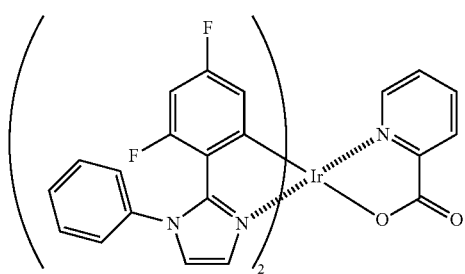
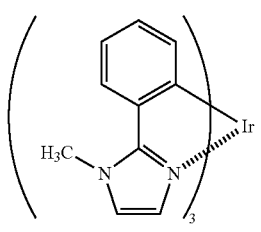
D-24
D-25

[Compound 83]
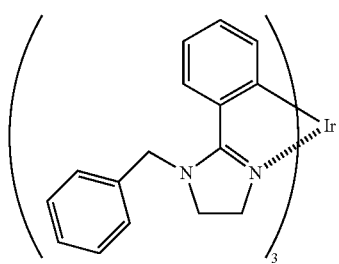
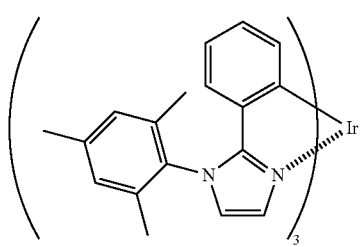
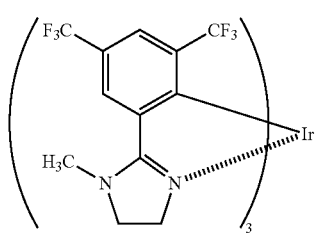
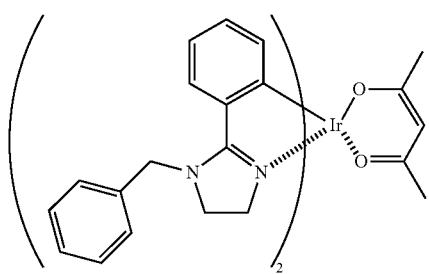
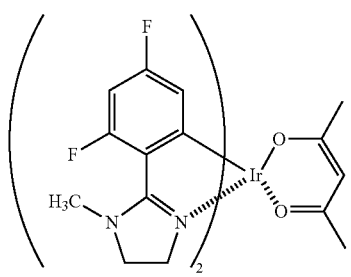
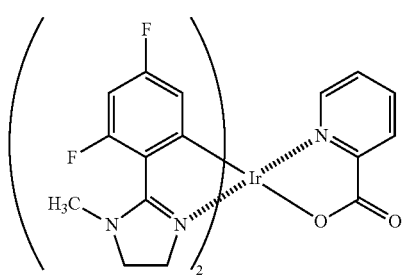
D-26 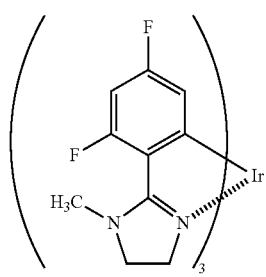 D-27
D-28 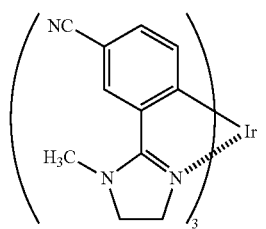 D-29
D-30 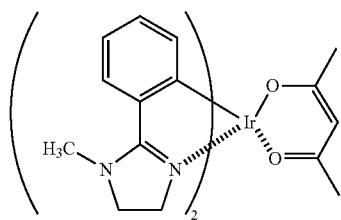 D-31
D-32 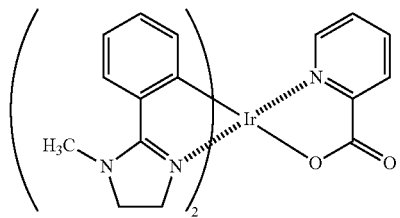 D-33
D-34 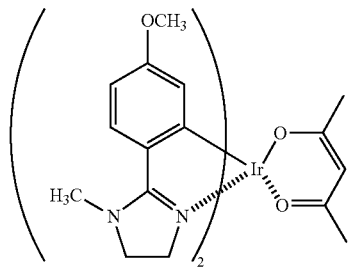 D-35
D-36 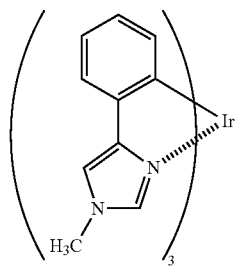 D-37

-continued
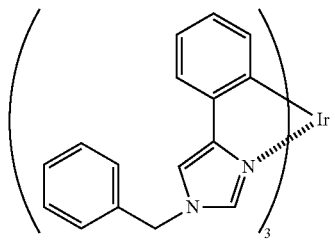
[Compound 84]
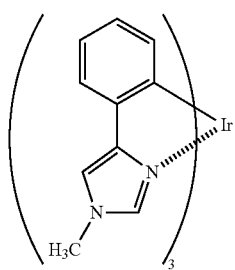
D-39
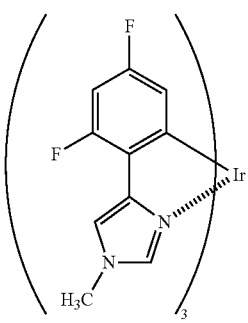
D-40
D-41
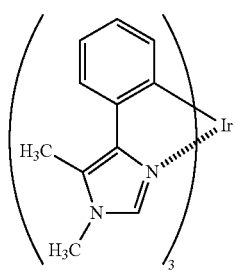
D-42
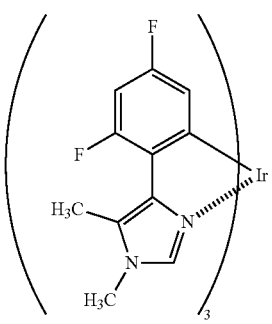
D-43
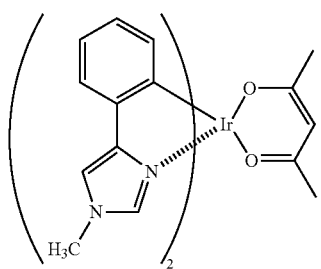
D-44
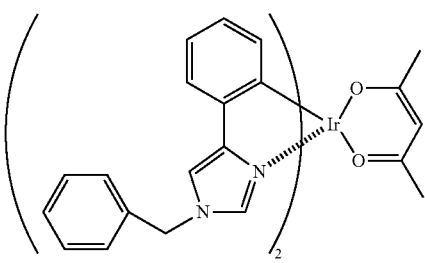
D-45
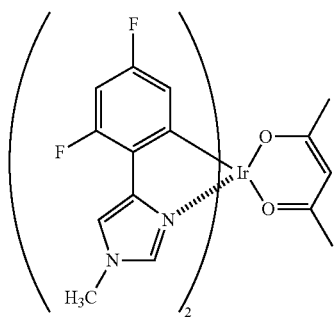
D-46
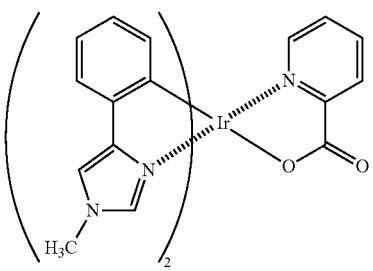
D-38

-continued
D-47
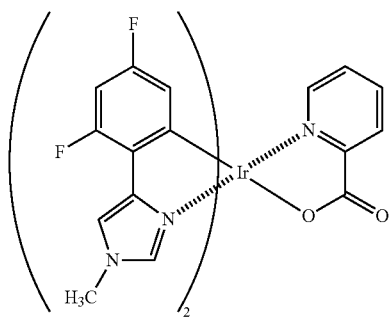
D-48
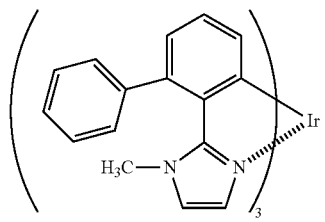
D-49
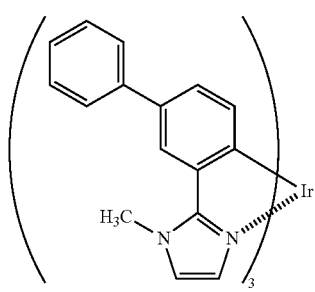
D-50
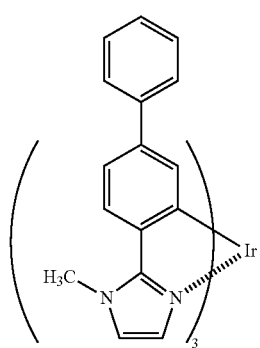
D-51
[Compound 85]
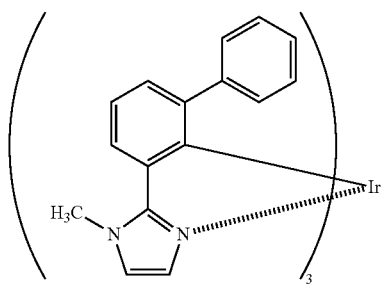
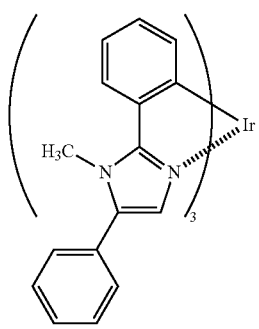
D-52
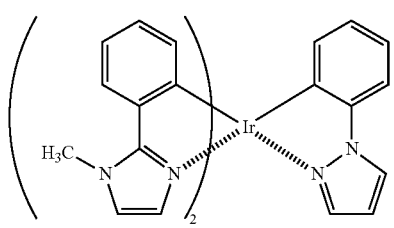
D-53
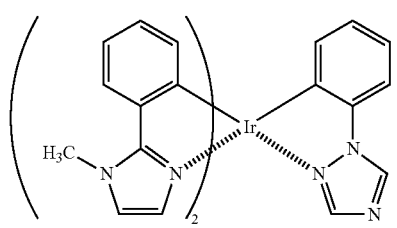
D-54
D-55

-continued
| D-56 | D-57 |
|---|---|
| 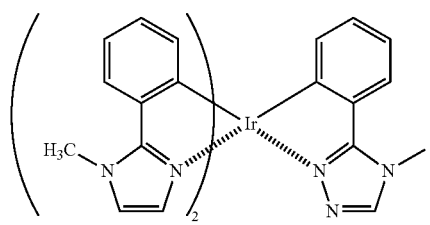 | 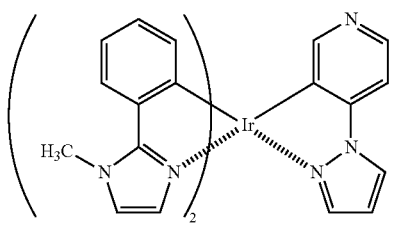 |
| D-58 | D-59 |
| 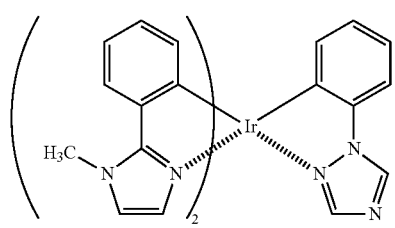 | 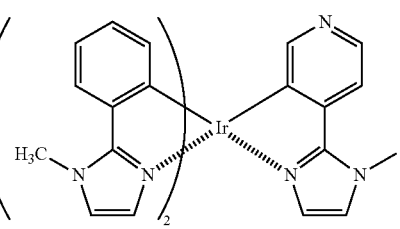 |
| D-60 | D-61 |
| 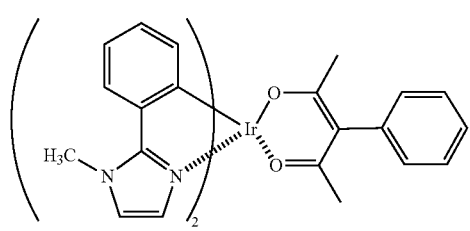 | 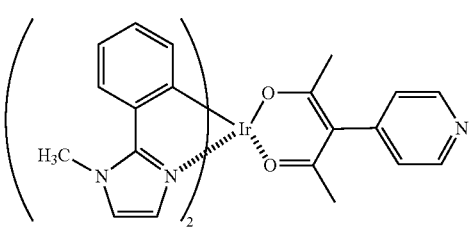 |
| D-62 | |
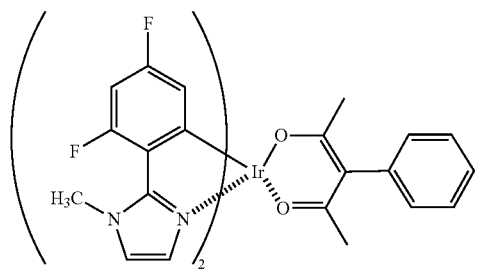
[Compound 86]
| D-63 | D-64 |
|---|---|
| 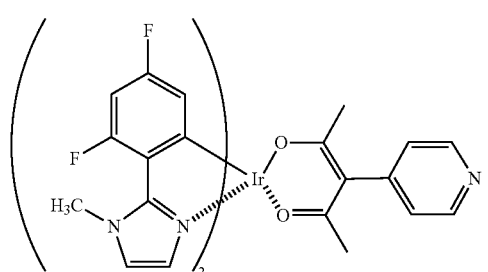 | 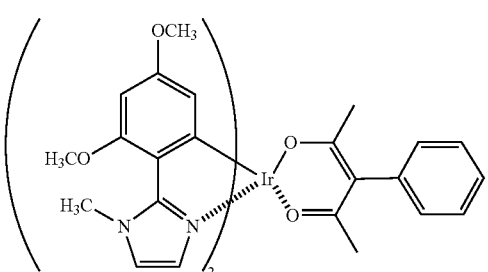 |
| D-65 | D-66 |
| 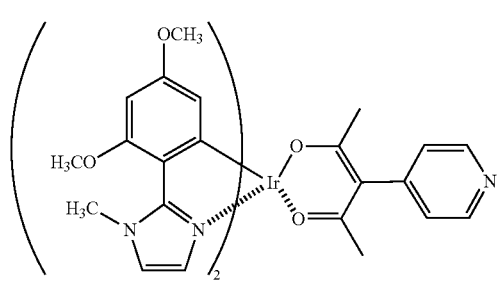 | 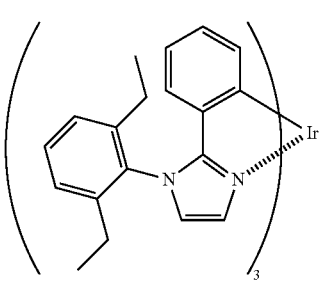 |

[Compound 87]
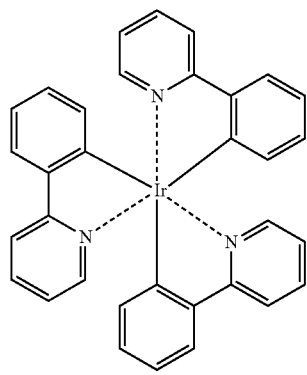
D-67
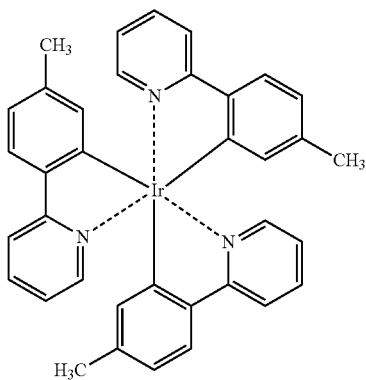
D-68
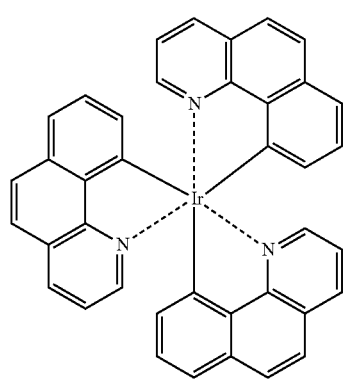
D-69
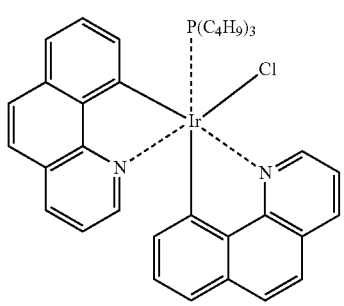
D-70
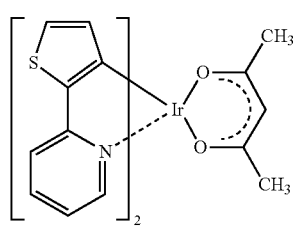
D-71
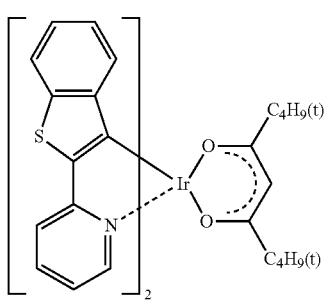
D-72
[Compound 88]
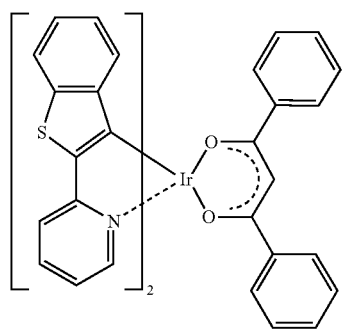
D-73
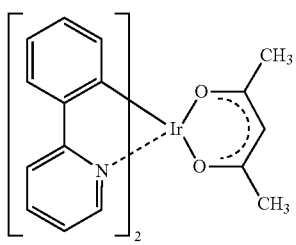
D-74

D-75 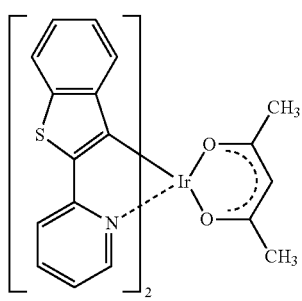
D-76 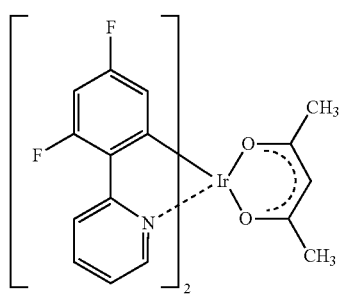
D-77 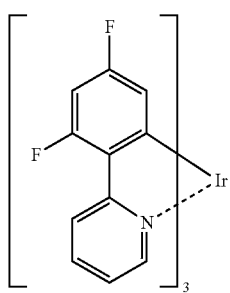
D-78 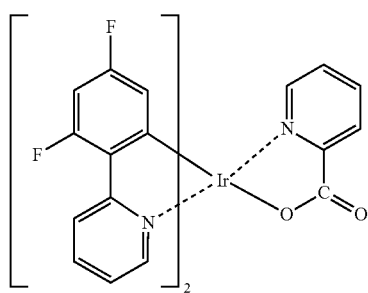
D-79 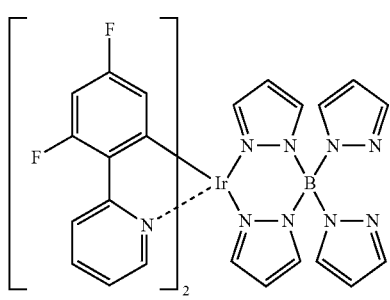
D-80 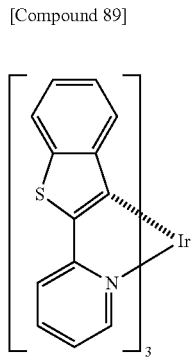
[Compound 89]
D-81 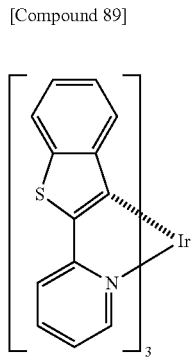
D-82 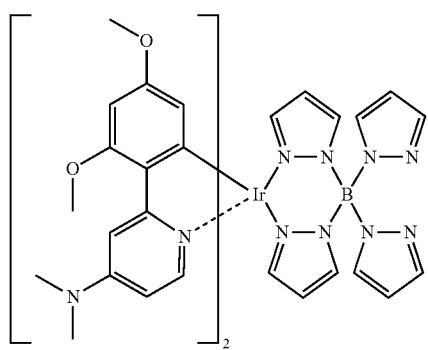

[Compound 90]
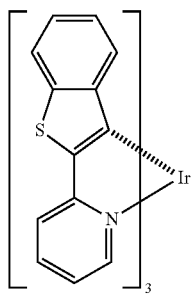
[Compound 91]
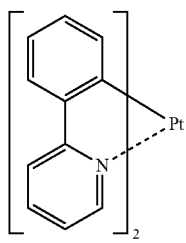
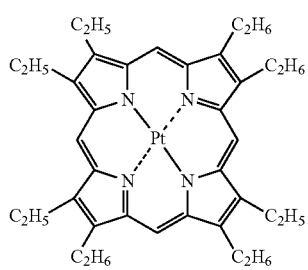
[Compound 92]
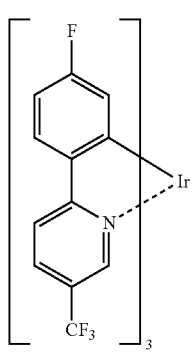
-continued
D-81
D-82
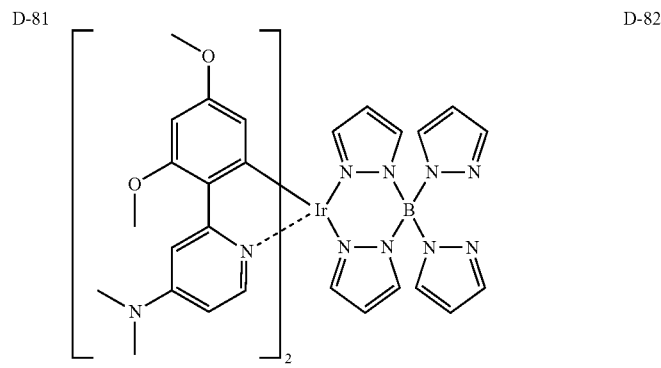
D-83
D-84
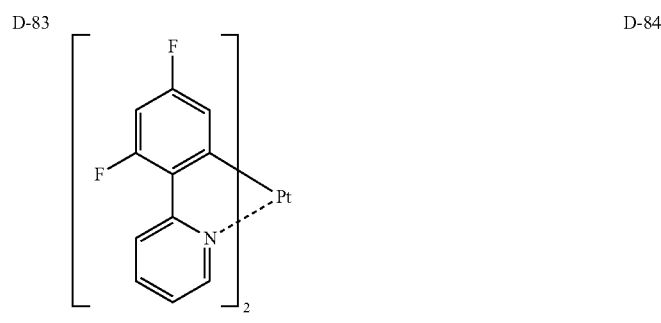
D-85
D-86
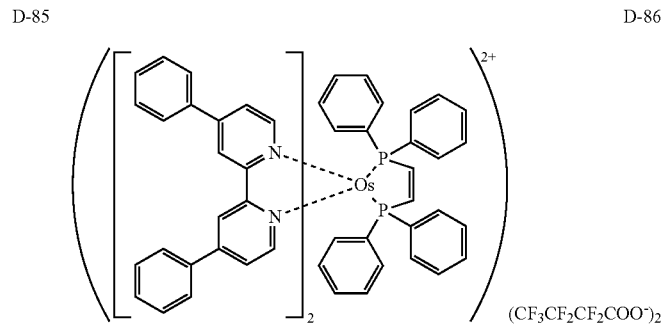
D-87
D-88
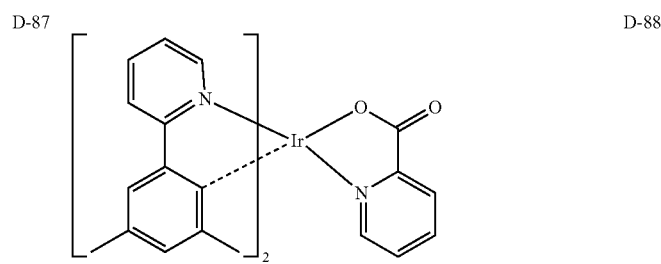

-continued
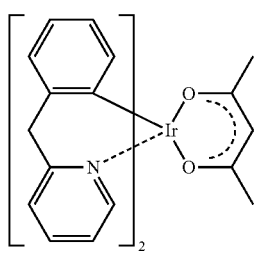
D-89
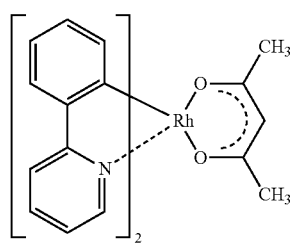
D-90
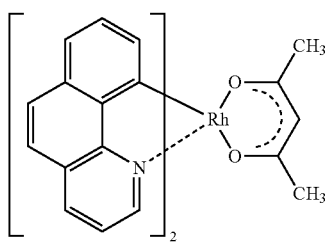
D-91
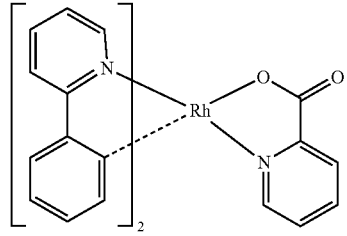
D-92
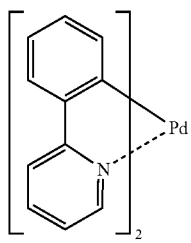
D-93
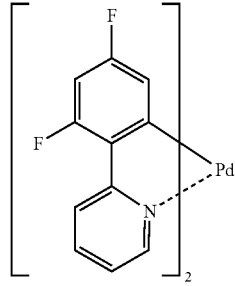
D-94
D-95
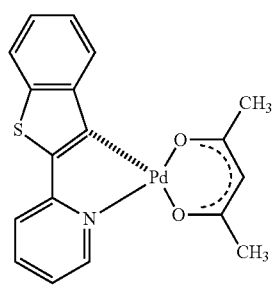
[Compound 93]
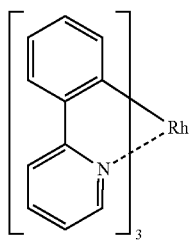
D-96
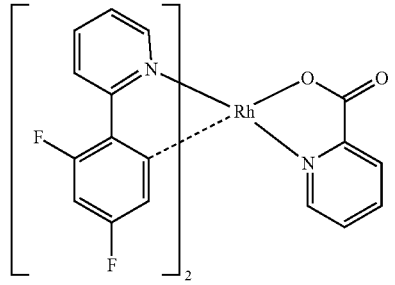
D-97
D-98
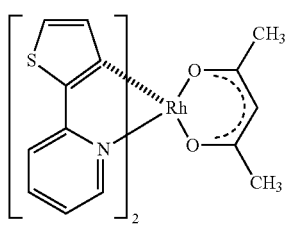

-continued
[Compound 94]
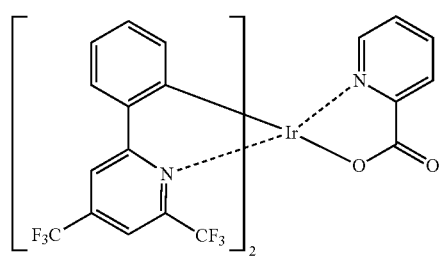
D-99
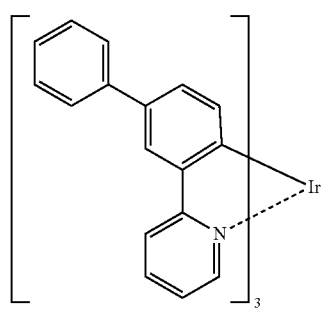
D-100
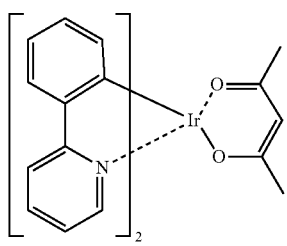
D-101
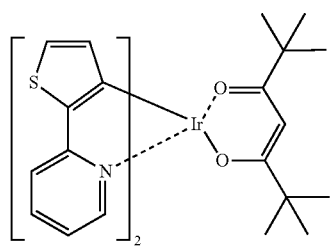
D-102
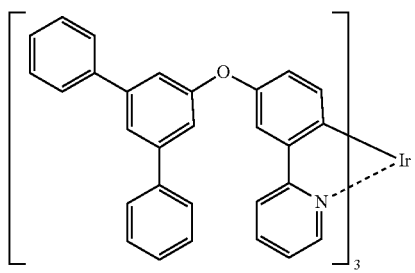
D-103
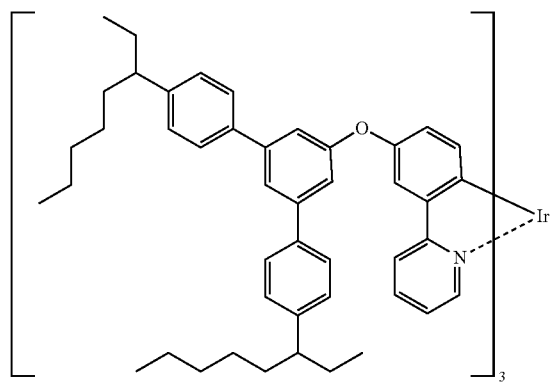
D-104
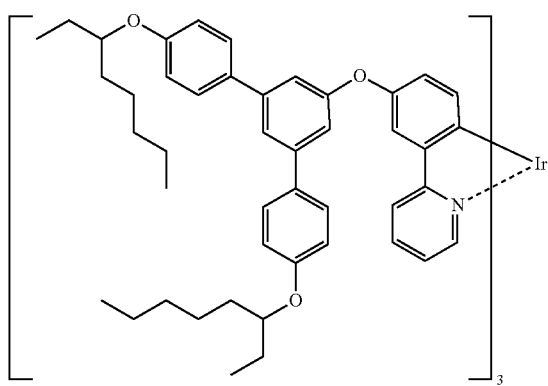
D-105

-continued
[Compound 95]
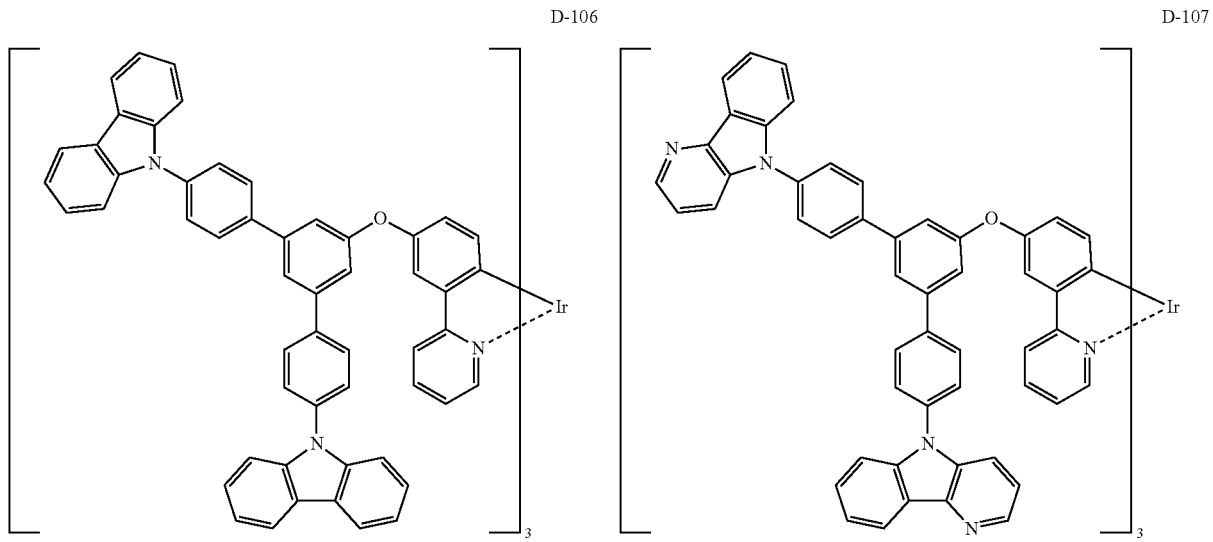
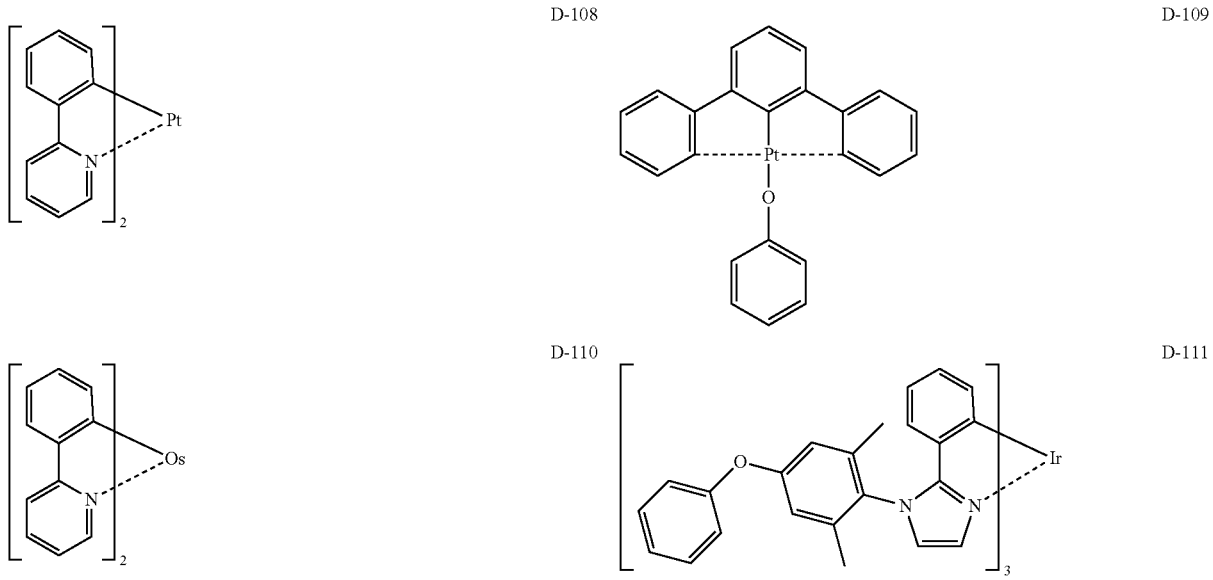
[Compound 96]
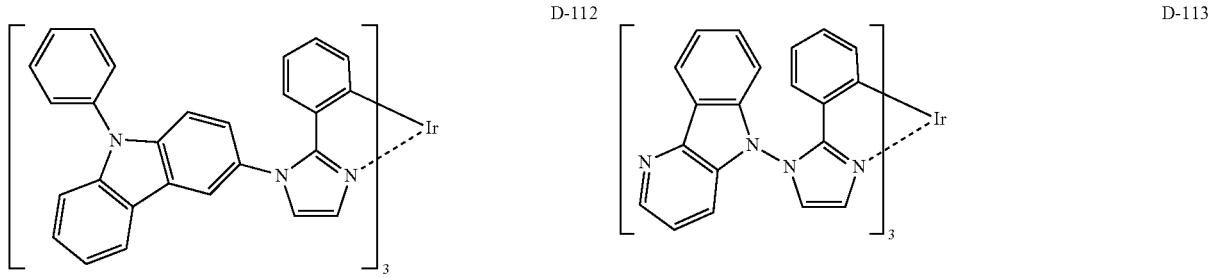

-continued
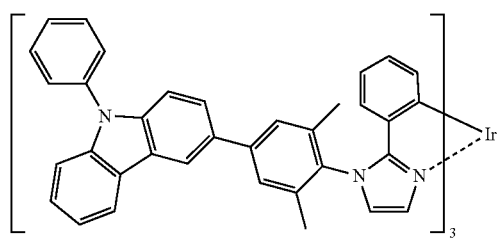
D-114
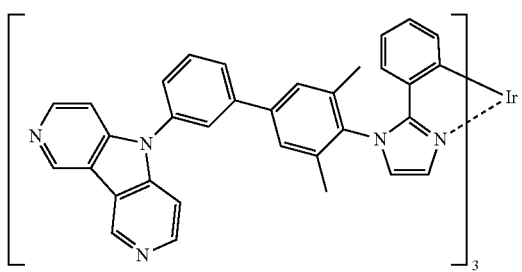
D-115
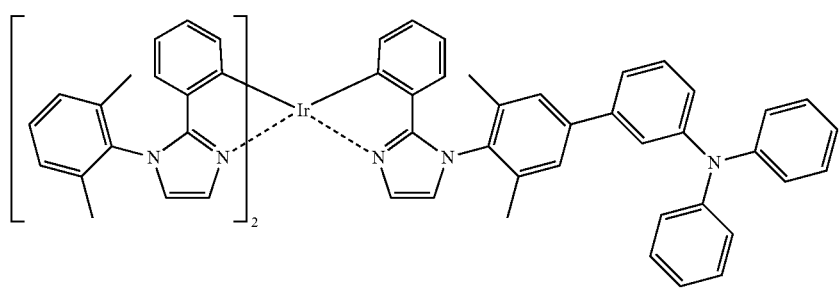
D-116
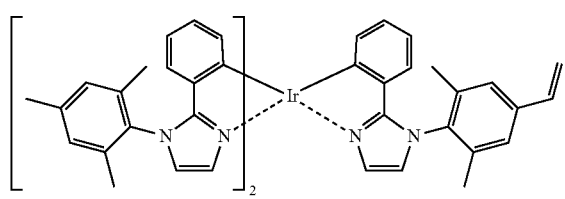
D-117
[Compound 97]
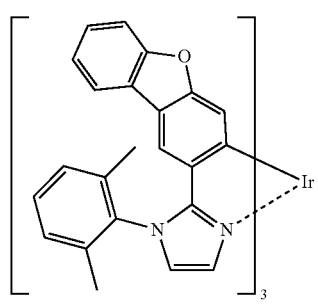
D-118
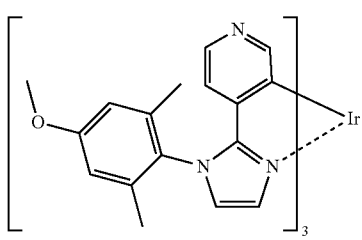
D-119
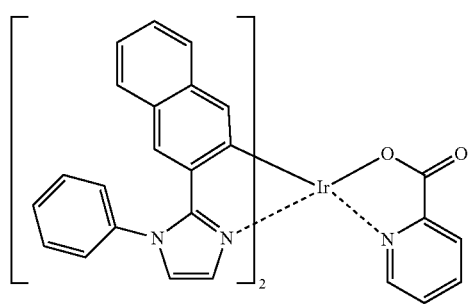
D-120
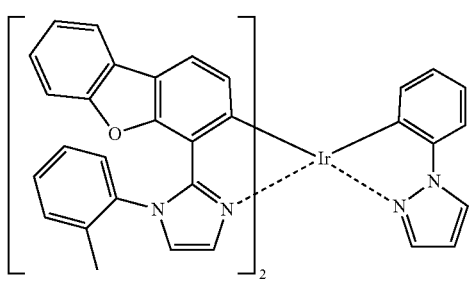
D-121

-continued
D-122
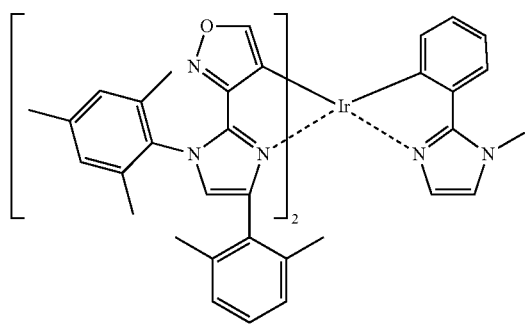
D-123
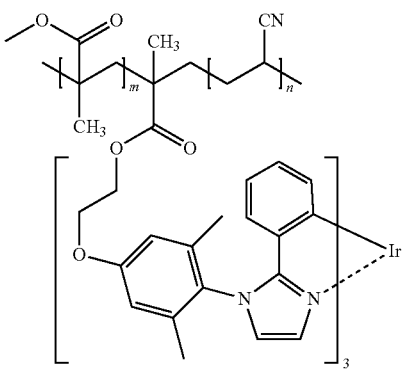
[Compound 98]
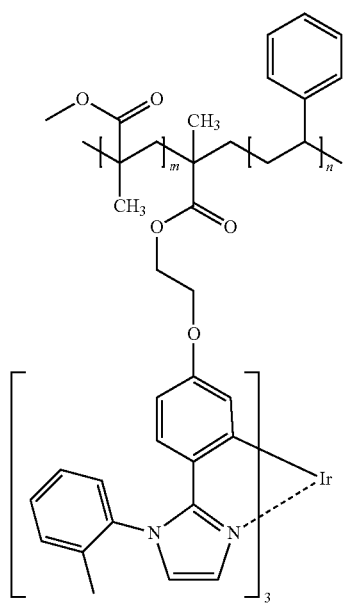
D-124
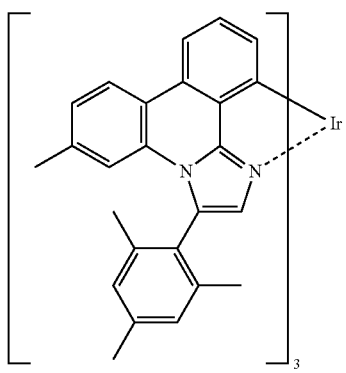
D-125
D-126
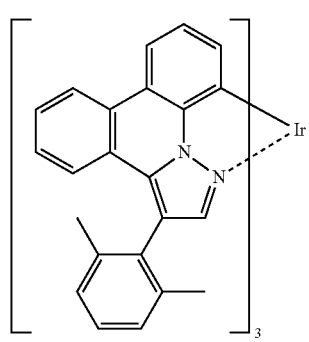
D-127
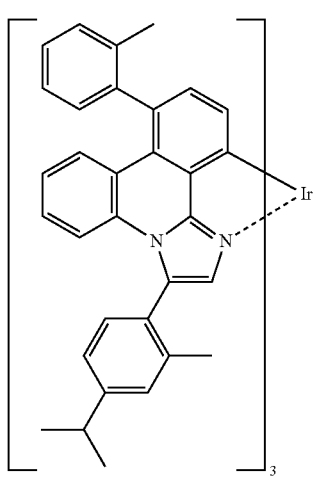

-continued

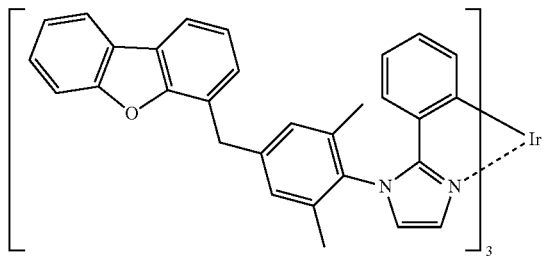

D-128

[Compound 99]

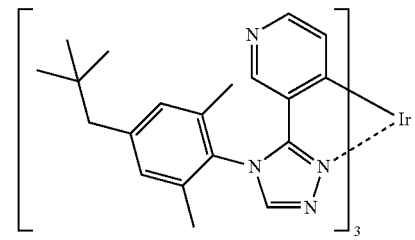

D-129

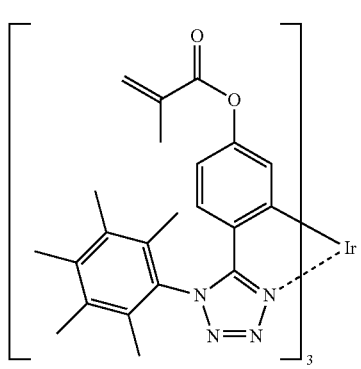

D-130

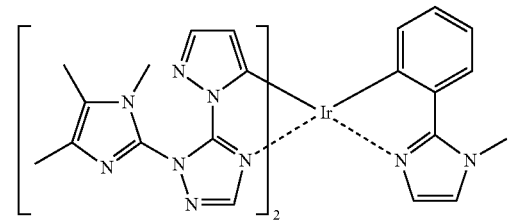

D-131

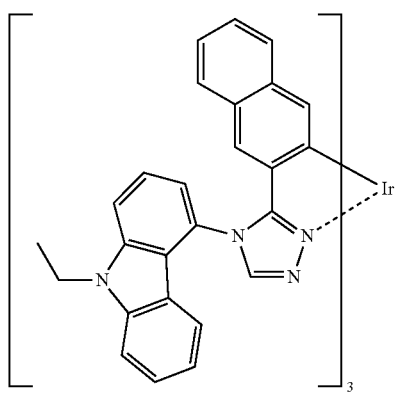

D-132

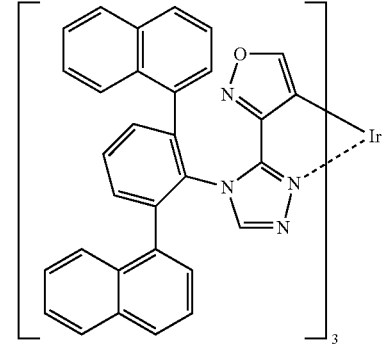

D-133

(5) Semiconductor Nanoparticle 11

Either or both of the electron transport layer and the light emitting layer include a semiconductor nanoparticle having an energy level of between −5.5 and −1.5 eV in its conductive band. It is preferable that the semiconductor nanoparticle is included in the electron transport layer.

Broadly classified, manufacturing methods of a semiconductor nanoparticle include a solid phase method for converting a solid state raw material into particles through nucleation by reaction, crashing, or the like, a liquid phase method to convert a raw material which has been turned into a liquid phase by a solvent or the like into particles by reaction, dispersion, and solidification, and a gas phase method to convert a raw material which has been turned into a vapor state by gasification or the like into particles by reaction, dispersion, and crystallization. As a manufacturing method of inorganic nanoparticles having a narrow particle size distribution, the liquid phase method being a build-up process and the gas phase method a being a build-up process are preferable. The liquid phase method includes a colloidal synthesis method, a sol-gel method, and an atomization method. The gas phase method includes a CVD method and a deposition and aggregation method. Particularly, for a nano-ordered laminated body such as an organic electroluminescent element, the gas phase method which enables to obtain an ultrafine particle is preferable.

These semiconductor nanoparticles may be subject to a surface modification such as refinement, filtering, surface modification by oxidization, coating by an anti-adhesive agent, or addition of a functional group.

It is preferable that the semiconductor nanoparticle includes a metal oxide, a metal nitride, a metal sulfide, or a metal halide, is more preferable that the nanoparticle includes a metal oxide or a metal halide, and most preferably, includes a metal oxide. As the metal atoms, metals in Groups 3-5 of the element periodic table (scandium, yttrium, titanium, zirconium, hafnium, vanadium, and niobium) and copper, cerium, indium, tin, gallium, aluminum, zinc, and molybdenum are preferable and zirconium, yttrium, and titanium are more preferable. A compound including two types of metal may also be used. Moreover, the semiconductor nanoparticle may be a surface-coating type metal oxide nanoparticle having a surface of an oxidized metal nanoparticle.

The material of the metal oxide nanoparticle includes oxidized scandium, oxidized titanium, oxidized zirconium, oxidized yttrium, oxidized vanadium, oxidized niobium, oxidized gallium, oxidized cerium, oxidized tin, and oxidized zinc, and among them oxidized titanium, oxidized zirconium, and oxidized yttrium can be preferably used. However, conductive band level of even same oxide may differ depending on the manufacturing method or condition of the material and therefore a metal oxide nanoparticle including other metal or the like may be appropriately used.

It is preferable that the diameter of the semiconductor nanoparticle (average particle size) is smaller enough than the wavelength of a visible light and within a size that does not cause light scattering in the wavelength region of a visible light. A preferable size of the semiconductor nanoparticle is between 1 nm and 100 nm, more preferable size is between 1 nm and 50 nm, and most preferable size is between 2 nm and 30 nm.

A heretofore known method may be used to measure the average particle size, including, for example, a method to obtain a number average particle size of particle size distribution after carrying out particle observation of the semiconductor nanoparticles by use of a transmission electron microscope (TEM), and a method to measure particle distribution of the semiconductor nanoparticles by a dynamic light scattering method to obtain a number average particle size.

It is preferable that the additive amount of the semiconductor nanoparticles is between 5 and 90 percent by mass against 100 parts by weight of all the constituent materials of the layer to which the particles are to be added, and is more preferable if the additive amount is between 10 and 70 percent by mass.

It is preferable that an energy level of the semiconductor nanoparticle is within a range of between −5.5 and −1.5 eV, is more preferable if the energy level is within a range of between −5.4 and −1.8 eV, is furthermore preferable if the energy level is within a range of between −3.0 and −1.8 eV, and is most preferable if the energy level is within a range of between −2.1 and −1.8 eV.

The energy level of the semiconductor nanoparticle of the conductive band is between the LUMO level of the electron transport material constituting the electron transport layer and LUMO level of the host compound of the light emitting layer. Moreover, the energy level of the semiconductor nanoparticle of the conductive band is between LUMO level of the electron transport material constituting the electron transport layer and LUMO level of the emitting dopant of the light emitting layer and preferably is lower than the LUMO level of the electron transport material of the electron transport layer, but higher than the LUMO level of at least one of the emitting dopants.

Methods for estimating the energy level of the semiconductor nanoparticle includes ultraviolet photoelectron spectroscopy, X-ray photoelectron spectroscopy, and a method to estimate from the energy level of valance and optical band gap energy acquired by Auger photoelectron spectroscopy.

<<Anode 2>>

As an anode of the organic EL element, those comprising metal, alloy, a conductive compound, which is provided with a large work function (not less than 4 eV), and a mixture thereof as an electrode substance are preferably used. Specific examples of such an electrode substance include a conductive transparent material such as metal like Au, CuI, indium tin oxide (ITO), $SnO_2$ and ZnO. Moreover, a material such as IDIXO ($In_2O_3$—ZnO) which can prepare an amorphous and transparent electrode, may also be used. As for an anode, these electrode substances may be made into a thin film by a method such as evaporation or sputtering and a pattern of a desired form may be formed by means of photolithography, or in the case of requirement of pattern precision is not so severe (not less than 100 μm), a pattern may be formed through a mask of a desired form at the time of evaporation or sputtering of the above-mentioned substance. Alternatively, when coatable materials such as organic electrically conductive compounds are used, it is possible to employ a wet system filming method such as a printing system or a coating system. When emission is taken out of this anode, the transmittance is preferably set to not less than 10% and the sheet resistance as an anode is preferably not more than a few hundreds Ω/□. Moreover, although the thickness of the film generally depends on a material, it is generally selected within a range of between 10 nm and 1,000 nm and preferably of between 10 nm and 200 nm.

<<Cathode 8>>

On the other hand, as a cathode, metal, alloy, a conductive compound and a mixture thereof, which have a small work function (not more than 4 eV), are used as an electrode substance. Specific examples of such an electrode substance includes such as sodium, sodium-potassium alloy, magnesium, lithium, a magnetium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal. Among them with respect to an electron injection property and durability against such as oxidization, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide ($Al_2O_3$) mixture and a lithium/aluminum mixture, and aluminum. These electrode substances may be made into a thin film by a method such as evaporation or sputtering to manufacture a cathode. Moreover, the sheet resistance as a cathode is preferably not more than a few hundreds Ω/□ and the film thickness is generally selected within a range of between 10 nm and 5 μm an preferably of between 50 nm and 200 nm. Note that to transmit emission, either one of an anode or a cathode of an organic EL element is preferably transparent or translucent to improve the luminance.

In addition, after forming, on the cathode, the above-mentioned metals at a film thickness of between 1 nm and 20 nm, it is possible to prepare a transparent or translucent cathode in such a manner that electrically conductive transparent materials are prepared thereon. By applying the above, it becomes possible to produce an organic EL element in which both anode and cathode are transparent.

<<Supporting Substrate 1>>

A supporting substrate (hereinafter also referred to as a base body, a substrate, a base material, a supporting body, or the like) usable for the organic EL element of the present invention is not specifically limited with respect to types of its material such as glass and plastics. They may be transparent or opaque.

However, a transparent substrate is preferable when en emitting light is taken from the side of the substrate. Substrates preferably used includes such as glass, quartz, and transparent resin film. A specifically preferable substrate is flexible resin film capable of providing an organic EL element with a flexible property because high-temperature preservation stability and the effect for suppressing chromaticity variation is greatly shown more in a flexible substrate than in a legit substrate.

Resin film includes such as: polyesters such as polyethylene terephthalate (PET), and polyethylene naphthalate (PEN); polyethylene, polypropylene; cellulose esters or their derivatives such as cellophane, cellulose diacetate, cellulose triacetate, cellulose acetate butylate, cellulose acetate propionate (CAP), cellulose acetate phthalate (TAC), and cellulose nitrate; polyvinylidene chloride, polyvinyl alcohol, polyethylene vinyl alcohol, syndiotactic polystyrene, polycarbonate, norbonene resin, polymethylpentene, polyether ketone, polyimide, polyether sulfone (PES), polyphenylane sulfide, polysulfones, polyetherimide, polyether ketone imide, polyamide, fluororesin, Nylon, polymethylmethacrylate, acrylic resin, polyacrilate; and cyclolefine resins such as ARTON (produced by JSR Co., Ltd.) and APEL (produced by Mitsui Chemicals, Inc.).

On the substrate of a resin film, a film incorporating inorganic and organic compounds, or a hybrid film of both, may be formed. It is preferable that the film is a barrier film having a water vapor permeability of (25±0.5° C., and relative humidity (90±2) % RH) at most 0.01 g/(m$^2$·24 h) determined based on JIS K 7129-1992. Moreover, it is preferable that the barrier film is a high barrier film having an oxygen permeability of $10^{-3}$ cm$^3$/(m$^2$·24 h·atm) or less and water vapor permeability of $10^{-3}$ g/m$^2$·24 h) or less and is more preferable if the water vapor permeability of the film is $10^{-5}$ g/(m$^2$·24 h) or less.

As materials forming a barrier film, those which retard penetration of moisture and oxygen, which deteriorate the element, may be used. For example, it is possible to use silicon oxide, silicon dioxide, and silicon nitride. Further, in order to improve the brittleness of the film, it is more preferable to achieve a laminated layer structure of inorganic layers and organic layers. The laminating order of the inorganic layers and organic layers is not particularly limited, but it is preferable that both are alternatively laminated a plurality of times.

Barrier film forming methods are not particularly limited and examples of usable methods include a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method. Of these, particularly preferable method is a method employing an atmospheric pressure plasma polymerization method described in the Japanese Unexamined Patent Application Publication No. 2004-68143.

Examples of opaque supporting substrates include metal plates such as aluminum or stainless steel, films, opaque resin substrates, and ceramic substrates.

As for the organic EL element of the present invention, it is preferable that an external quantum efficiency of the emission in the room temperature is 1% or more and more preferably 5% or more. Here, external quantum efficiency (%)=number of photons emitted outside of the organic EL element/number of electrons caused to be flown to the organic EL element× 100.

<<Sealing (Sealing Adhesive Agent 9 and Sealing Member 10)>>

As a sealing method used for the organic EL element of the present invention, a method in which, for example, sealing members, electrodes, and a supporting substrate are subject to adhesion via an adhesive agent can be listed.

The sealing member may be arranged to cover the display region of the organic EL element, and may be an engraved plate or a flat plate. Neither transparency nor electrical insulation is limited.

Specifically listed are a glass plate, a polymer plate or film, and a metal plate or a film. Specifically, it is possible to list, as the glass plate, soda-lime glass, barium-strontium containing glass, lead glass, aluminosilicate glass, borosilicate glass, bariumborosilicate glass, and quartz. Further, listed as the polymer plates may be polycarbonate, acryl, polyethylene terephthalate, polyether sulfide, and polysulfone. As the metal plate, listed are those composed of at least one metal selected from the group consisting of stainless steel, iron, copper, aluminum, magnesium, nickel, zinc, chromium, titanium, molybdenum, silicon, germanium, and tantalum, or alloys thereof.

In the present invention, since it is possible to make the organic EL element thin, a metal film can be preferably used. Moreover, the oxygen permeability of the polymer film is at most $1 \times 10^{-3}$ cm$^3$/(m$^2$·24 h·atm) determined based on JIS K 7126-1987 and a water vapor permeability (25±0.5° C., and relative humidity (90±2) % RH) is utmost $1 \times 10^{-3}$ g/(m$^2$·24 h) determined based on JIS K 7129-1992.

Conversion of the sealing member into concave is carried out using a sand blast process or a chemical etching process.

As an adhesive agent, a photo-curing and heat-curing type having a reactive vinyl group of acrylic acid based on oligomers and methacrylic acid, as well as a moisture curing type such as 2-cyanocrylic ester can be listed. Moreover, a thermal and chemical curing type (mixture of two liquids) such as epoxy based ones may also be listed. In addition, a hot-melt type polyamides, polyesters, and polyolefins may be listed. Furthermore, a cationically curable type ultraviolet radiation curable type epoxy resin adhesive agent may be listed.

Note that since an organic EL element is occasionally deteriorated via a thermal process, an adhesive agent which enables adhesion and curing between room temperature and 8° C. is preferred. Moreover, a desiccating agent may be dispersed into the above-mentioned adhesives. The adhesive agent may be applied onto sealing portions via a commercial dispenser or printed on the same in the same manner as screen printing.

In addition, it is appropriate that on the outside of the above-mentioned electrode which interposes the organic layer and faces the supporting substrate, the electrode and the organic layer are covered and in the form of contact with the supporting substrate, inorganic and organic layers are formed as a sealing film. In this case, materials forming the film may be those which exhibit functions to retard penetration of those such as moisture or oxygen which results in deterioration. For example, it is possible to use silicon oxide, silicon dioxide, and silicon nitride. Furthermore, it is preferable that a laminated layer structure is formed, which is composed of these inorganic layers and layers composed of organic materials, in order to improve brittleness of the film. Methods to form the films is not particularly limited and may include, for example, a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method.

It is preferable to inject an inert gas such as nitrogen or argon, or an inactive liquid such as fluorinated hydrocarbon or silicon oil between the sealing member and the display region of the organic EL element for the purpose of forming a gas or a liquid phases. Moreover, it is possible to form vacuum. In addition, it is also possible to enclose a hygroscopic compound inside.

Examples of the hygroscopic compound includes metal oxides (e.g., sodium oxide, potassium oxide, calcium oxide, barium oxide, magnesium oxide, and aluminum oxide); sulfates (e.g., sodium sulfate, calcium sulfate, magnesium sulfate, and cobalt sulfate); metal halides (e.g., calcium chloride, magnesium chloride, cesium fluoride, tantalum fluoride, cerium bromide, magnesium bromide, barium iodide, and magnesium iodide); and perchlorates; (e.g., barium perchlorate and magnesium perchlorate). In sulfates, metal halides, and perchlorates, anhydrous salt is preferably used.

There are two types of sealing: a casing type sealing method and a contact type sealing method. From a viewpoint of manufacturing a thin organic EL element, the contact type sealing is preferable. Moreover, since flexibility is required in a sealing member in a case where a flexible organic EL element is manufactured, the contact type sealing is preferable.

Hereinafter, a preferable aspect of the contact type sealing will be explained.

A heat-curing adhesive agent or an ultraviolet curable type adhesive agent may be used as the sealing adhesive agent according to the present invention. However, a heat-curing type adhesive agent such as an epoxy resin, an acrylic resin, and a silicon resin is preferable and epoxy-based heat-curing type adhesive resin having superior moisture resistance and water resistance and a low shrinking property when curing is more preferable.

It is preferable that the moisture content of the sealing adhesive agent according to the present invention is utmost 300 ppm, is more preferable if the moisture content is between 0.01 and 200 ppm, and most preferable if the moisture content is between 0.01 and 100 ppm.

The moisture content of the present invention may be measured by any method including, for example, a volumetric moisture meter (Karl Fischer type), an infrared moisture gauge, a microwave transmission type moisture titrator, a dry weight method, GC/MS, IR, a differential scanning calorimetry (DSC), and thermal desorption spectroscopy (TDS). Moreover, it is possible to measure moisture from increased pressure caused by evaporation of moisture by use of AVM-3000 moisture analyzer (product of Omnitek) or the like and to measure moisture content of a film a solid film, or the like.

In the present invention, moisture content of the adhesive agent for sealing can be adjusted by placing the agent under a nitrogen atmosphere with 0.8 ppm of oxygen level, where dew-point temperature is −80° C. or lower and changing the period of time during which the agent is left in such atmosphere. Moreover, the agent can be dried by being placed in a vacuum of 100 Pa or less and changing the time to be left in the vacuum. In addition, although a material for adhesive sealing can be dried by the adhesive agent alone, the material may be provided to the sealing member in advance to be dried.

In a case where the contact type sealing is carried out, for example, polyethylene terephthalate (PET) having a thickness of 50 μm on which an aluminum foil (having a thickness of 30 μm) is laminated is used as a sealing member. Using the above as the sealing member, the adhesive agent for sealing is uniformly applied on the aluminum surface of the above by use of a dispenser, the resin substrate 1 and the sealing member 5 are positioned and then pressure bonded (0.1-3 MPa), adhered by the temperature of between 80 and 180° C., and sealed (by contact type sealing).

Heating and bonding time may differ depending on the type and amount of the adhesive agent and also on the area of application, but temporary bonding may be carried out by the pressure of between 0.1 and 3 MPa and heat-curing time may be selected from a range of between five seconds and 10 minutes under the temperature of between 80 and 180° C.

It is preferable if a heated compression roller is used because compression (temporary bonding) and heating can be carried out simultaneously and an internal gap can be simultaneously removed.

Moreover, the forming methods of an adhesive layer may include a coating method and a printing method such as roll coating, spin coating method, screen printing method, and spray coating by use of, depending on the material, a dispenser.

The contact type sealing is an aspect where there is no gap between the sealing member and the organic EL element substrate as the gap is covered with cured resin. The sealing member may include metals such as stainless, aluminum, and magnesium alloy, plastics such as polyethylene terephthalate, polycarbonate, polystyrene, Nylon, and polyvinyl chloride, and compounds thereof, glass, and the like and depending on the necessity, particularly for a resin film, a laminated gas-barrier layer such as aluminum, aluminum oxide, silicon oxide, and silicon nitride may be used similarly to a resin substrate. The gas-barrier layer may be formed on both or one surface of the sealing member prior to the shape-forming of the sealing member by way of sputtering, evaporation method, or the like, or may be formed both or one surface of the sealing member after sealing by the similar method. Concerning the above, it is also preferable that the oxygen permeability of the polymer film is at most $1\times10^{-3}$ ml/(m$^2$·24 h·atm) and a water vapor permeability (25±0.5° C., and relative humidity (90±2) % RH) is utmost $1\times10^{-3}$ g/(m$^2$·24 h).

The sealing member may be a film or the like on which a metal foil such as aluminum is laminated. As a method for laminating a polymer film on one surface of the metal foil, a commercially used lamination machine may be used. A polyurethane-based, a polyester-based, an epoxy-based, an acrylic-based adhesive agent, and the like may be used as the adhesive agent. Depending on the necessity, a curing agent may be used together. Although a hot melt lamination method, an extrusion lamination method, and a coextrusion lamination method may be used, a dry lamination method is preferable.

Moreover, in a case where a metal foil is formed by sputtering, vapor deposition method, or the like and the sealing member is formed from a fluid electrode material such as a conductive paste, conversely, a polymer film may be used as a base material and the member may be formed by a method of forming a metal foil thereon may be employed.

<<Protection Film and Protection Plate>>

For the purpose of strengthening mechanical strength of the organic EL element, a protection film or a protection plate may be provided on a sealing film on the side facing the supporting substrate, interposing an organic function layer, or to the outside of the sealing film. Particularly, in a case where sealing is carried out by the sealing film, its mechanical strength is not necessarily high and therefore it is preferable to provide such a protection film or a protection plate. Materials to be used for the above include a glass plate, a polymer plate or film, and a metal plate or film, similarly to the ones used for the sealing. However, because it is light weighted and thin, it is preferable to use a polymer film.

In the present invention, it is preferable that an emission-taking member is provided between the flexible supporting substrate and the anode or between the flexible supporting member and any position on the light emitting side.

The emission-taking member includes a prism lens, a lens sheet, and a diffusion sheet. Moreover, a diffraction granting and a diffuse structure which are introduced in an interface which causes total reflection or in any of media may also be included.

Generally, in an organic electroluminescent element which emits light from its substrate, part of the light emitted from the light emitting layer causes total reflection in the interface between the substrate and air, causing a problem of loss of light. In order to solve this problem, a prism or a lens-shaped processing is carried out on the surface of the substrate, or a prism sheet, a lens sheet, or a diffusion sheet is attached onto the surface of the substrate so that the total reflection is suppressed and emission taking efficiency is improved.

Moreover, a method to introduce a diffraction granting in an interface, which causes total reflection or in any of media, or any of the media and a method to introduce or a diffuse structure have been known as a method to improve the light taking efficiency.

<<Manufacturing Method of Organic EL Element>>

As one example of methods for manufacturing the organic EL element, a manufacturing method of an organic EL element which includes an anode/a positive hole injection layer/a positive hole transport layer/a light emitting layer/an electron transport layer/a an electron injection layer/a cathode will be explained.

A thin film including an electrode substance, for example, anode substance, having a thickness of 1 µm or less, preferably between 10 and 200 nm, is formed on an appropriate base material by use of a method such as vapor deposition or sputtering to manufacture an anode first.

Subsequently, on the above, an organic function layer (organic compound thin layer) including a positive hole injection layer, a positive hole transport layer, a light emitting layer, an electron transport layer, and an electron injection layer, which are organic EL element materials, is formed.

Methods to form each of these layers include, as described above, the vapor deposition method and a wet process (e.g., a spin coating method, a cast method, a die coat method, a blade coat method, a roll coat method, an ink jet method, a printing method, a spray coating method, a curtain coating method, and a Lanbmuir Blodgett (LB) method). In terms of at least the positive hole injection layer, it is preferable that the layer be formed by the wet process. Concerning formation of layers of the organic function layer other than the positive hole injection layer, because it becomes possible to easily obtain uniform films and pin holes are not easily generated, the wet process is preferable in the present invention. Specifically, formation of a film by use application such as the spin coating method, the cast method, the die coat method, the blade coat method, the roll coat method, and the ink jet method is preferable.

A liquid medium for solving or dispersing the organic EL element materials according to the present invention includes an organic medium, for example, ketones such as methyl ethyl ketone and cyclohexanone, a fatty acid ester such as ethyl acetate, a halogenated hydrocarbon such as dichlorobenzene, an aromatic hydrocarbon such as toluene, xylene, mesitylene, and cyclohexyl benzene, a fatty hydrocarbon such as cyclohexane, decahydronaphthalene, and dodekane, dimethylformamido (DMF), and dimethylsulfoxide (DMSO). Moreover, as a dispersion method, methods such as an ultrasonic dispersion method, a high shearing force dispersion method, and a media dispersion can be used.

After forming the above layers, a thin film consisting of a cathode material is formed by, for example, a method such as vapor deposition or sputtering, to have a thickness of 1 µm or less, preferably within a range of between 50 and 200 nm, to provide a cathode, so that a desired organic EL element can be obtained.

In the present invention, it is preferable that the organic EL element is subject to heating processing within a range of 40 and 200° C. after the cathode is provided because such processing brings significant effects of high-temperature preservation stability and suppression of chromaticity variation. It is preferable that the heating temperature is set to be within a range of between 40 and 150° C. for a case where a resin film is used and is more preferable if the heating temperature is set to be within a range of between 40 and 120° C. Time for heating processing is preferably between 10 seconds and 30 minutes.

After the heating processing, the above-mentioned contact type sealing is carried out, or the sealing member, the electrode, and the supporting substrate are bonded by the adhesive agent to manufacture the organic EL element.

<<Usage>>

The organic EL element of the present invention can be used as a display device, a display, or various types of light source.

As the light source, a wide range of use applications include, for example, a household lighting equipment, lighting equipment used in a car, a back light for a clock or a liquid crystal display, a billboard, a traffic signal, a light source of an optical storage medium, a light source of an electrophotographic copy machine, a light source of an optical communication processor, a light source of an optical sensor, and further a general electric home appliance which requires a display unit. Particularly, the present invention can be effectively used as a back light of a liquid crystal display device combined with a color filter or as a light source for lighting.

In the organic EL element of the present invention, patterning may be carried out when a film is manufactured, depending on the necessity, by way of a metal masking, an ink jet printing method, or the like. When the patterning is carried out, only the electrode may be patterned, the electrode and the light emitting layer may be patterned, or the entire layers of the element may be patterned. For manufacturing of the element, a heretofore known method can be used.

EMBODIMENT

Hereinafter, the present invention will be explained with reference to embodiments. However, the present invention is not limited thereto. Note that "part" and "%" used in the embodiment respectively represents "parts by weight" and "percent by weight."

<<Manufacturing of Organic EL Element>>

(1) Manufacturing of Samples 100 to 108

(1.1) Manufacturing of Gas Barrier Flexible Film

On the entire surface a polyethylene naphthalete film (a film which is a product of Teijin Dupont Films Japan Limited, hereinafter abbreviated as PEN) where a first electrode was to be formed, inorganic gas-barrier films including SiOx were formed continuously by use of an atmospheric-pressure plasma discharge treatment device having a configuration described in the Japanese Unexamined Patent Application Publication No. 2004-68143 to have a thickness of 500 nm to manufacture a gas-barrier flexible film having the oxygen permeability equal to or less than 0.001 ml/m$^2$/day and the water vapor permeability of equal to or less than 0.001 g/m$^2$/day.

(1.2) Formation of First Electrode Layer

On the gas-barrier flexible film thus prepared, a 120 nm-thick isodium tin oxide (ITO) film was formed by sputtering and the film thus formed was patterned y a photolithography method to manufacture a first electrode layer (anode). Note that the patterning was carried out so that an emission area becomes 50 mm$^2$.

(1.3) Formation of Positive Hole Injection Layer

The ITO substrate after the patterning was subject to ultrasonic cleaning by use of isopropyl alcohol, dried by dry nitrogen gas, and subject to UV ozone cleaning for five minutes. On this substrate, a film was manufactured by way of the spin coating method for 30 seconds at 3,000 rpm using a solvent prepared by dissolving poly (3,4-ethylenedioxythiophene)-polystyrene sulfonate (Baytron P Al 4083, a product of Bayer AG, hereinafter abbreviated as PEDOT/PSS) to 70% by pure water, the film thus manufactured was dried for one hour in 200° C., and thus a positive hole injection layer having a thickness of 30 nm was provided.

(1.4) Formation of Positive Hole Transport Layer

The substrate thus prepared was moved to nitrogen atmosphere using a nitrogen gas (grade G1) and a film was manufactured by spin coating method for 30 seconds at 1,500 rpm using a solvent prepared by dissolving the exemplary compound (60) (Mw=80,000) being the positive hole transport material at 0.5%. Then the substrate was maintained in 160° C. for 30 minutes to manufacture a positive hole transport layer having a thickness of 30 nm.

(1.5) Formation of Light Emitting Layer

Subsequently, films were formed by spin coating method for seconds at 1,500 rpm using following light emitting layer composition and the composition dissolved by half by use of the medium and the films were maintained in 120° C. for 30 minutes to form films respectively having a thickness of 40 nm and 80 nm (specifically, the thickness was 40 nm for a sample 100 and the thickness was 80 nm for other samples 101 to 108).

| <Light emitting layer composition> | |
|---|---|
| Exemplary compound a-38 | 22.3 parts by weight |
| Exemplary compound D-66 | 4.9 parts by weight |
| Exemplary compound D-67 | 0.05 parts by weight |
| Exemplary compound D-80 | 0.05 parts by weight |
| Dispersed materials of semiconductor nanoparticles described in Table 1 | 6.00 parts by weight |
| Toluene | 2,000 parts by weight |

[Compound 100]

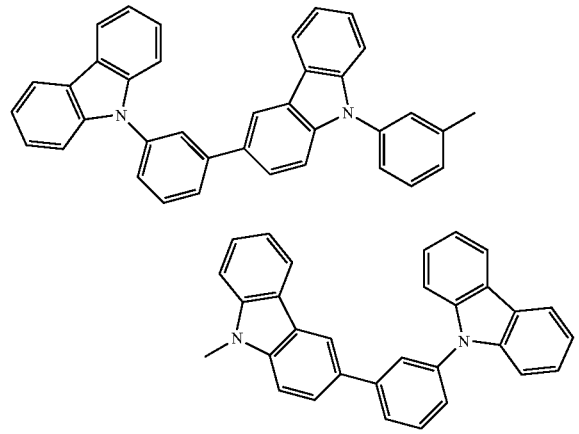

a-38

(1.6.) Formation of Electron Transport Layer

Subsequently, a film was formed by the spin coating method for 30 seconds at 1,500 rpm using a solution prepared by dissolving 20 mg of the exemplary compound of Table 1 being a compound represented by a general formula (A) by 4 ml of butanol, and the film was maintained in 120° C. for 30 minutes to form the electron transport layer having a thickness of 30 nm.

Note that in the sample 108, polystyrene was used instead of the compounds A and BC.

[Compound 101]

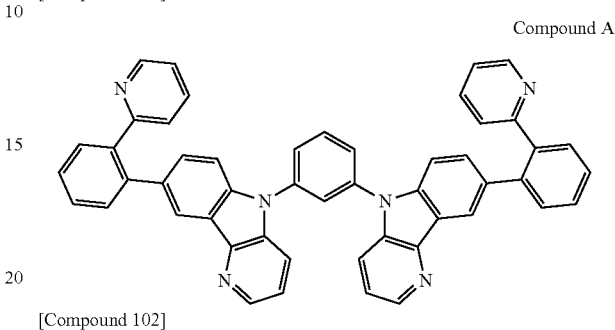

Compound A

[Compound 102]

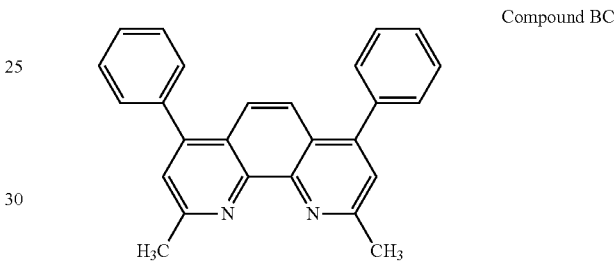

Compound BC (1.7) Formation of Electron Injection Layer and Cathode

Following the above, the substrate was attached to a vacuum deposition equipment without exposing the substrate to air. Moreover, a molybdenum resistance heating boat in which sodium fluoride and potassium fluoride were placed was attached to the vacuum deposition equipment, the equipment was depressurized to $4 \times 10^{-5}$ Pa, the boat was energized to heat the sodium fluoride at 0.02 nm/second so that a thin film having a thickness of 1 nm was formed on the electron transport layer and subsequently an electron transport layer having a thickness of 1.5 nm was formed on the sodium fluoride at 0.02 nm/second in a similar manner.

Then, a cathode was formed by evaporating 100 nm of aluminum.

(1.8) Sealing and Manufacturing of Organic EL Element

Following the above, the sealing member was bonded by use of a commercially available roll lamination device to manufacture organic EL elements (samples 100 to 108).

Note that a flexible aluminum foil having a thickness of 30 nm (a product of Toyo Aluminum K.K.) to which a polyethylene terephthalate (PET) film (having a thickness of 12 μm) had been laminated by use of an adhesive agent for dry lamination (two-liquid reaction type urethane-based adhesive agent) was used.

On the aluminum surface, a heat-curing adhesive agent was applied uniformly to have a thickness of 20 μm along the adherend of the aluminum foil (a glazed surface) by use of a dispenser. The foil was dried for 12 hours in a vacuum under 100 Pa or less. Then, the foil was moved to a nitrogen atmosphere where dew point temperature was −80° C. or lower and oxygen concentration was 0.8 ppm to be dried for 12 hours or more so that moisture content of the adhesive agent for sealing became 100 ppm or less.

As the heat-curing adhesive agent, an epoxy-based adhesive agent in which following (A) to (C) were mixed was used.

(A) Bisphenol A diglycidyl ether (DGEBA)
(B) Dicyandiamide (DICY)
(C) Epoxy adduct-based curing promoter Thus, a sealing substrate was taken out, closely bonded and provided so as to cover a joint part of the electrode and electrode lead, and rolled by a pressure roller with a temperature of 120° C., pressure of 0.5 MPa, and device speed of 0.3 m/min to carry out contact type sealing to have the aspect of FIG. 1 so that organic EL elements (samples 100 to 108) were manufactured.

(2) Manufacturing of Samples 201 to 207

The above-mentioned manufacturing methods of the light-emitting layer and the electron transport layer of the manufacturing method of the samples 100 to 108 were modified as follows. Other than the above, same procedures were taken to manufacture samples 201 to 207.

(2.1) Formation of Light Emitting Layer

Films were formed by spin coating method for 30 seconds at 1,500 rpm using following light emitting layer composition and the films were maintained in 120° C. for 30 minutes to form films having a thickness of 40 nm.

<Light emitting layer composition>

| | |
|---|---|
| Exemplary compound a-38 | 14.15 parts by weight |
| Exemplary compound D-66 | 2.45 parts by weight |
| Exemplary compound D-67 | 0.025 parts by weight |
| Exemplary compound D-80 | 0.025 parts by weight |
| Isopropyl acetate | 2,000 parts by weight |

[Chemical formula 103]

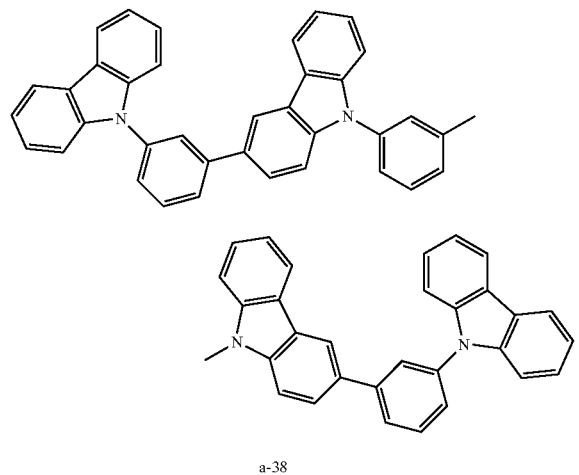

a-38

(2.2) Formation of Electron Transport Layer

Subsequently, a film was formed by the spin coating method for 30 seconds at 1,500 rpm using a solution prepared by dissolving 32 mg of the exemplary compound of Table 2 being a compound represented by the general formula (A) and 8 mg of semiconductor nanoparticles described in Table 2 by 4 ml of butanol, and the film was maintained in 120° C. for 30 minutes to form the electron transport layer having a thickness of 60 nm.

Note that in the sample 207, polystyrene was used instead of the compounds A and BC.

[Compound 104]

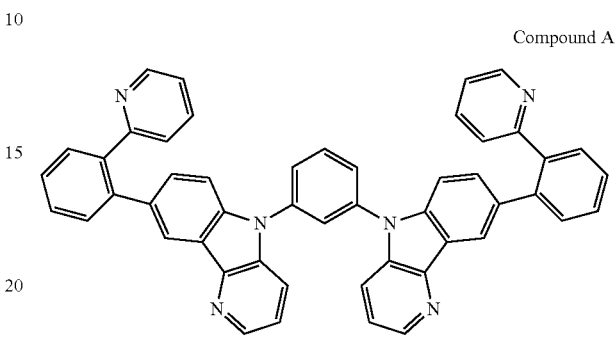

Compound A

[Compound 105]

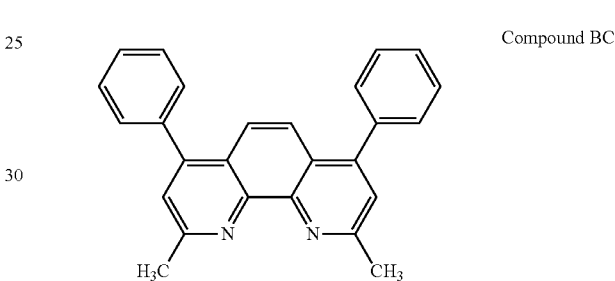

Compound BC

<<Evaluation of Organic EL Element>>

The samples 100 to 108 and samples 201 to 207 manufactured by use of the above-mentioned flexible film were evaluated as follows.

(1) Measurement of Power Efficiency and Drive Voltage

Each of the samples were lit under a constant luminance condition at 1,000 cd/m$^2$ in a room temperature (approximately 23 to 25° C.) and luminance of each sample was measured so that luminance under luminance at 1,000 cd/m$^2$ (with a constant current) and drive voltage of each sample were acquired.

Note that in Table 1 and Table 2, luminance and drive voltage of the sample 100 were set to be 100 and luminance and drive voltage of the samples 101 to 108 and samples 201 to 107 are expressed by relative values.

(2) Evaluation of Application Property

Each of the elements caused to emit light by the above-mentioned drive voltage was visually confirmed whether there is luminance unevenness.

In Table 1 and Table 2, G (Good) represents that there is no problem, F (Fair) represents that minor luminance unevenness could be confirmed but the sample has no problem as a product, and NG (No good) represents there is luminance unevenness.

TABLE 1

| | LUMINESCENT LAYER | | | | | ELECTRON TRANSPORT LAYER | |
|---|---|---|---|---|---|---|---|
| | HOST MATERIAL | DOPANT MATERIAL | SEMICONDUCTOR NANOPARTICLES | | | | |
| SAMPLE | LUMO LEVEL [eV] | LUMO LEVEL [eV] | MATERIAL | CONDUCTIVE BAND LEVEL [eV] | SURFACE OXIDATION | MATERIAL | LUMO LEVEL [eV] |
| 100/REFERENCE | −2.0 | −3.0 TO −1.7 | — | — | NONE | BC | −2.8 |
| 101/COMPARATIVE EXAMPLE | −2.0 | −3.0 TO −1.7 | — | — | NONE | BC | −2.8 |
| 102 | −2.0 | −3.0 TO −1.7 | Y$_2$O$_3$ | −1.8 | NONE | BC | −2.8 |
| 103 | | | | −1.8 | | A | −2.6 |
| 104 | | | | −1.8 | PRESENT | | |
| 105 | | | ZrO$_2$ | −2.1 | NONE | | |
| 106 | | | | −2.1 | PRESENT | | |
| 107 | | | CuO | −5.4 | | | |
| 108 | | | ZrO$_2$ | −2.0 | | POLYSTYRENE | −3.3 |

| SAMPLE | LUMINANCE/ CONSTANT CURRENT | DRIVE VOLTAGE | LUMINANCE UNEVENNESS |
|---|---|---|---|
| 100/REFERENCE | 100 | 100 | FAIR |
| 101/COMPARATIVE EXAMPLE | 70 | 150 | NOT GOOD |
| 102 | 115 | 130 | GOOD |
| 103 | 120 | 120 | GOOD |
| 104 | 130 | 115 | GOOD |
| 105 | 115 | 120 | GOOD |
| 106 | 120 | 115 | GOOD |
| 107 | 90 | 140 | GOOD |
| 108 | 85 | 140 | FAIR |

TABLE 2

| | LUMINESCENT LAYER | | ELECTRON TRANSPORT LAYER | | | | |
|---|---|---|---|---|---|---|---|
| | HOST MATERIAL | DOPANT MATERIAL | | | SEMICONDUCTOR NANOPARTICLES | | |
| SAMPLE | LUMO LEVEL [eV] | LUMO LEVEL [eV] | MATERIAL | LUMO LEVEL | MATERIAL | CONDUCTIVE BAND LEVEL [eV] | SURFACE OXIDATION |
| 100/REFERENCE | −2.0 | −3.0 TO −1.7 | BC | −2.8 | — | — | NONE |
| 101/COMPARATIVE EXAMPLE | −2.0 | −3.0 TO −1.7 | BC | −2.8 | — | — | NONE |
| 201 | −2.0 | −3.0 TO −1.7 | BC | −2.8 | Y$_2$O$_3$ | −1.8 | NONE |
| 202 | | | A | −2.6 | | −1.8 | |
| 203 | | | | | | −1.8 | PRESENT |
| 204 | | | | | ZrO$_2$ | −2.1 | NONE |
| 205 | | | | | | −2.1 | PRESENT |
| 206 | | | | | CuO | −5.4 | |
| 207 | | | POLYSTYRENE | −3.3 | ZrO$_2$ | −2.0 | |

| SAMPLE | LUMINANCE/ CONSTANT CURRENT | DRIVE VOLTAGE | LUMINANCE UNEVENNESS |
|---|---|---|---|
| 100/REFERENCE | 100 | 100 | FAIR |
| 101/COMPARATIVE EXAMPLE | 70 | 150 | NOT GOOD |
| 201 | 120 | 115 | GOOD |
| 202 | 125 | 110 | GOOD |
| 203 | 140 | 105 | GOOD |
| 204 | 120 | 115 | GOOD |
| 205 | 135 | 105 | GOOD |
| 206 | 95 | 130 | GOOD |
| 207 | 85 | 140 | FAIR |

(3) Summary

As shown in Table 1 and Table 2, compared to the results of the sample 100 and the sample 101, if the film thickness of the light emitting layer is thickened from 40 nm to 80 nm, luminance was lowered and at the same time drive voltage was increased, while luminance unevenness was also confirmed.

On the contrary, although the film thickness of the light emission layer was thickened for the samples 101 to 108 to 80 nm and for the samples 201 to 207 to 60 nm, luminance was high, increase in drive voltage was suppressed, and luminance unevenness was not found in each of them.

From the above, it was understood that including a semiconductor nanoparticle having a conductive band level of between −5.5 and −1.1 eV in the light emission layer or the electron transport layer is effective to suppress decrease in luminance and increase in drive voltage and also to suppress generation of luminance unevenness.

INDUSTRIAL APPLICABILITY

The present invention can be appropriately used to suppress decrease in luminance and increase in drive voltage and also to suppress generation of luminance unevenness.

DESCRIPTION OF THE REFERENCE NUMERALS

1 Flexible supporting substrate
2 Anode
3 Positive hole injection layer
4 Positive hole transport layer
5 Light emitting layer
6 Electron transport layer
7 Electron injection layer
8 Cathode
9 Sealing adhesive agent
10 Flexible sealing member
11 Semiconductor nanoparticle
100 Organic electroluminescent element

The invention claimed is:

1. An organic electroluminescent element comprising, on a substrate:
    a pair of electrodes; and
    an organic functional layer having at least an electron transport layer and a luminescent layer,
    wherein, in at least one layer among the electron transport layer and the luminescent layer, semiconductor nanoparticles of which an energy level of a conduction band is between −5.5 to −1.5 eV are contained.

2. The organic electroluminescent element according to claim 1, wherein:
    the luminescent layer contains a luminescent dopant; and
    the energy level of a conduction band of the semiconductor nanoparticles is between a LUMO level of an electron transport material configuring the electron transport layer and a LUMO level of the luminescent layer.

3. The organic electroluminescent element according to claim 1, wherein:
    the luminescent layer contains a host compound; and
    the energy level of a conduction band of the semiconductor nanoparticles is between a LUMO level of an electron transport material configuring the electron transport layer and a LUMO level of the host compound.

4. The organic electroluminescent element according to claim 1, wherein:
    the semiconductor nanoparticles are contained in the electron transport layer.

5. The organic electroluminescent element according to claim 1, wherein:
    the semiconductor nanoparticles are metal oxides.

6. The organic electroluminescent element according to claim 5, wherein:
    the semiconductor nanoparticles are the metal oxides that contain metal of groups III to V.

7. The organic electroluminescent element according to claim 6, wherein:
    the semiconductor nanoparticles are zirconium oxides, yttrium oxides or titanium oxides.

8. The organic electroluminescent element according to claim 1, wherein:
    the semiconductor nanoparticles are formed by oxidizing a surface of each of metallic nanoparticles.

9. The organic electroluminescent element according to claim 1, wherein:
    an electron transport material configuring the electron transport layer is expressed by a general formula (A) shown below,

[Chem. 1]

GENERAL FORMULA (A)

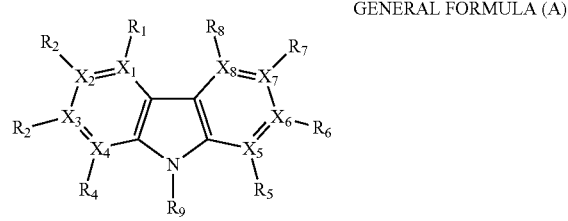

wherein, in Formula (A), each of X1 to X8 represents a carbon atom or nitrogen atom, and at least one of X1 to X8 is the nitrogen atom; if any of X1 to X8 is the carbon atom, each of R1 to R8 bonded to the carbon atom represents a hydrogen atom or substitution group, and when there is more than one substitution group, the substitution groups may be identical to or different from each other; if any of X1 to X8 is the nitrogen atom, each of R1 to R8 bonded to the nitrogen atom represents an unbounded electron pair; and R9 represents a hydrogen atom or substitution group.

10. The organic electroluminescent element according to claim 1, wherein:
    the luminescent layer contains a phosphorescence emission dopant; and
    the phosphorescence emission dopant is expressed by a general formula (B) shown below,

[Chem. 2]

GENERAL FORMULA (B)

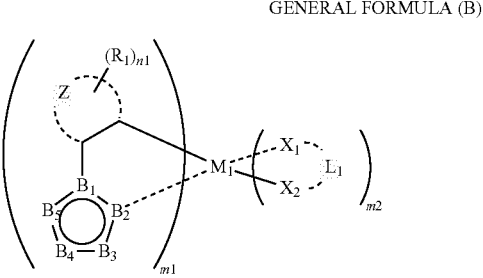

wherein, in Formula (B), R1 represents a substitution group; Z represents a non-metallic atomic group required for forming a five to seven-membered ring; n1 represents an integer between 0 and 5; each of B1 to B5 represents a carbon atom, nitrogen atom, oxygen atom or sulfur atom, and at least one of B1 to B5 is the nitrogen atom; M1 represents metal of groups VIII to X in an element periodic table; each of X1 and X2 represents a carbon atom, nitrogen atom or oxygen atom, and L1 represents an atomic group that forms a bidentate ligand with X1 and X2; m1 represents an integer 1, 2 or 3, and m2 represents an integer 0, 1 or 2, where m1+m2 is 2 or 3 is satisfied.

11. The organic electroluminescent element according to claim 1, wherein:
the electron transport layer is formed by a wet process using at least an electron transport material configuring the electron transport layer, and an application liquid containing the semiconductor nanoparticles and fluorinated alcohol solvent.

* * * * *